(12) United States Patent
Fukushima et al.

(10) Patent No.: US 11,229,893 B2
(45) Date of Patent: Jan. 25, 2022

(54) METHOD OF PRODUCING A SILICON COMPOUND MATERIAL AND APPARATUS FOR PRODUCING A SILICON COMPOUND MATERIAL

(71) Applicants: IHI Corporation, Koto-ku (JP); The University of Tokyo, Bunkyo-ku (JP)

(72) Inventors: Yasuyuki Fukushima, Tokyo (JP); Kozue Akazaki, Tokyo (JP); Yasutomo Tanaka, Tokyo (JP); Kazuma Akikubo, Tokyo (JP); Takeshi Nakamura, Tokyo (JP); Yukihiro Shimogaki, Tokyo (JP); Takeshi Momose, Tokyo (JP); Noboru Sato, Tokyo (JP); Kohei Shima, Tokyo (JP); Yuichi Funato, Tokyo (JP)

(73) Assignees: IHI Corporation, Koto-ku (JP); The University of Tokyo, Bunkyo-ku (JP)

( * ) Notice: Subject to any disclaimer, the term of this patent is extended or adjusted under 35 U.S.C. 154(b) by 0 days.

(21) Appl. No.: 16/239,845

(22) Filed: Jan. 4, 2019

(65) Prior Publication Data
US 2019/0135640 A1    May 9, 2019

Related U.S. Application Data

(63) Continuation of application No. PCT/JP2017/024511, filed on Jul. 4, 2017.

(30) Foreign Application Priority Data

Jul. 6, 2016  (JP) .............................. JP2016-134128

(51) Int. Cl.
B01J 12/00     (2006.01)
C04B 35/565    (2006.01)
(Continued)

(52) U.S. Cl.
CPC .......... *B01J 12/005* (2013.01); *C01B 32/963* (2017.08); *C01B 32/977* (2017.08);
(Continued)

(58) Field of Classification Search
None
See application file for complete search history.

(56) References Cited

U.S. PATENT DOCUMENTS 5,354,580 A   10/1994   Goela et al.
5,716,694 A    2/1998   Jacquemet
(Continued)

FOREIGN PATENT DOCUMENTS

CA       2120092        12/1994
CA    2 362 214 A1       8/2000
(Continued)

OTHER PUBLICATIONS

International Search Report dated Oct. 10, 2017 in PCT/JP2017/024511 filed Jul. 4, 2017 (with English Translation).
(Continued)

*Primary Examiner* — Guinever S Gregorio
(74) *Attorney, Agent, or Firm* — Oblon, McClelland, Maier & Neustadt, L.L.P.

(57) ABSTRACT

Provided is a method of producing a silicon compound material, including the steps of: storing a silicon carbide preform in a reaction furnace; supplying a raw material gas containing methyltrichlorosilane to the reaction furnace to infiltrate the preform with silicon carbide; and controlling and reducing a temperature of a gas discharged from the reaction furnace at a predetermined rate to subject the gas to continuous thermal history, to thereby decrease generation of a liquid or solid by-product derived from the gas.

29 Claims, 38 Drawing Sheets

(51) Int. Cl.
*C01B 33/107* (2006.01)
*C01B 32/977* (2017.01)
*C23C 16/42* (2006.01)
*C01B 32/963* (2017.01)
*C23C 16/32* (2006.01)

(52) U.S. Cl.
CPC .......... *C01B 33/107* (2013.01); *C04B 35/565* (2013.01); *C23C 16/325* (2013.01); *C23C 16/42* (2013.01); *C04B 2235/5244* (2013.01)

(56) References Cited

U.S. PATENT DOCUMENTS

| | | | |
|---|---|---|---|
| 6,596,340 | B1 | 7/2003 | Schneweis |
| 2009/0104100 | A1 | 4/2009 | Imamura et al. |
| 2010/0297360 | A1 | 11/2010 | Chang et al. |
| 2011/0200512 | A1 | 8/2011 | Saiki et al. |
| 2016/0305015 | A1* | 10/2016 | Nakamura ............ C04B 35/571 |

FOREIGN PATENT DOCUMENTS

| | | | |
|---|---|---|---|
| CN | 1346453 | A | 4/2002 |
| CN | 101528637 | A | 9/2009 |
| CN | 102196995 | A | 9/2011 |
| CN | 105917024 | A | 8/2016 |
| EP | 0 282 037 | A2 | 4/1988 |
| EP | 0 628 643 | A1 | 12/1994 |
| EP | 1 153 340 | | 11/2001 |
| EP | 2 000 195 | A2 | 12/2008 |
| EP | 3 109 342 | A1 | 12/2016 |
| JP | 63-222011 | | 9/1988 |
| JP | 7-70753 | | 3/1995 |
| JP | 9-2846 | A | 1/1997 |
| JP | 9-2876 | | 1/1997 |
| JP | 2003-507152 | | 2/2003 |
| JP | 2010-132536 | | 6/2010 |
| JP | 2015-151587 | | 8/2015 |
| KR | 10-2008-0108992 | | 12/2008 |
| RU | 2 130 509 | C1 | 5/1999 |
| TW | 200734032 | | 9/2007 |
| WO | WO 00/48051 | A1 | 8/2000 |
| WO | WO 2007/102288 | A1 | 9/2007 |
| WO | WO 2015/122533 | A1 | 8/2015 |

OTHER PUBLICATIONS

D. Togel, et al., "Formation of organosilicon compounds 115[1]: the applicability as precursors for β-SiC of carbosilanes resulting from the gas phase pyrolysis of methylsilanes[2]", Journal of Organometallic Chemistry, 521, 1996, 7 pages.

Investigative Report of the Explosion & Fire Accident occurred in the High-Purity Polycrystalline Silicon Manufacturing Facility at Yokkaichi Plant of Mitsubishi Materials Corporation (with its Partial English Translation), 88 pages, http://www.mmc.co/jp/corporate/ja/news/press/2014/14-0612.html.

M. Frisch, et al., Gaussian 09 citation, Wallingford, CT, 2009, 2 pages.

A. Miyoshi, "GPOP: Gaussian post processor", rev. 2013.07.15m5, http://akmys.com/gpop/, 1 page.

A. Miyoshi, "SSUMES; Steady-State Unimolecular Master-Equation Solver", rev. 2010.05.23m4, http://akrmys.com/ssumes/, 2 pages.

Chemkin-Pro 15131, Reaction Design: San Diego, 2013, http://www.reactiondesign.com/products/chemkin/, 1 page.

Yang-Soo Won, ., "Thermal Stability and Reaction Mechanism of Chloromethanes in Excess Hydrogen Atmosphere", J. Ind. Eng. Chem., vol. 13, No. 3, 2007, 6 pages.

E.A. Chernyshev, et al., "Gas Phase Reactions of Dichlorosilylene", Journal of Organometallic Chemistry 271, 1984, 15 pages.

Extended European Search Report dated Mar. 6, 2020 in European Patent Application No. 17824245.9, 9 pages.

Veltri, R.D., et al., "*Chemical-Vapor-Infiltrated Silicon Nitride, Boron Nitride, and Silicon Carbide Matrix Composites*". Journal of the American Ceramic Society, vol. 73 No. 7, Jul. 1, 1990, XP000169093, pp. 2137-2140.

Combined Russian Office Action and Search Report dated Aug. 20, 2019, in Patent Application No. 2019103089, 11 pages (with English translation).

Maizza, G. et al., "Modelling of SiC Chemical Vapour Infiltration Process (CVI) Assisted by Microwave Heating", Excerpt from the Proceedings of the COMSOL Conference 2009 Milan, 6 pages.

Manocha, L. M. et al., "SIC Fibers and Composites by Chemical Vapor Reaction (CVR) of Host Carbon Materials", Composites and Nanostructures, No. 1, 2010, pp. 21-29.

Veltri, R.D., et al., "Chemical-Vaper-Infiltrated Silicon Nitrate , Boron Nitrate, and Silicon Carbide Matrix Composites", Journal of the American Ceramic Society, vol. 73 No. 7, Jul. 1, 1990, XP000169093, pp. 2137-2140.

Chinese Office Action dated Sep. 17, 2021, in Chinese Patent Application No. 201780040374.8.

* cited by examiner

EXHAUST GAS IS RETAINED AT AROUND 600°C $SiCl_2$ IS REMOVED THROUGH INTRODUCTION OF ADDITIVE GAS AT AROUND OUTLET OF REACTION FURNACE

RETAINED AT 200°C
OR MORE AND LESS THAN 1,100°C

CH₃ REACTION AT 600°C

Absolute Rate of Production CH3

CH₃ REACTION AT 700°C

Absolute Rate of Production CH3

COMPARISON IN ZERO-POINT ENERGY

FIG.40A

| Reaction | A | n | Ea |
|---|---|---|---|
| | | | J/mol |
| SIHCL3=SICL2+HCL | 4.1E+14 | 0.0E+00 | 7.0E+04 |
| SIH2CL2=SICL2+H2 | 1.0E+14 | 0.0E+00 | 7.5E+04 |
| SIHCL2=SICL2+H | 2.6E+15 | 0.0E+00 | 4.9E+04 |
| SICL3=SICL2+CL | 2.9E+14 | 0.0E+00 | 6.1E+04 |
| SI2CL6=SICL2+SICL4 | 2.4E+13 | 0.0E+00 | 4.8E+04 |
| SI2CL5H=SICL2+SIHCL3 | 6.1E+11 | 4.8E-01 | 4.6E+04 |
| SI2CL5=SICL2+SICL3 | 6.6E+14 | 0.0E+00 | 2.7E+04 |
| SI2CL4=SICL2+SICL2 | 1.2E+14 | 0.0E+00 | 4.9E+03 |
| H2CLSISICL3=SICL2+SIH2CL2 | 1.2E+12 | 6.6E-01 | 4.3E+04 |
| SIHCL2+CL=SICL2+HCL | 6.7E+13 | 0.0E+00 | 8.6E+03 |
| SICL3+CH3=SICL2+CH3CL | 9.9E+12 | 0.0E+00 | 1.0E+04 |
| SICL2+H=SICL+HCL | 2.5E+14 | 0.0E+00 | 1.9E+04 |
| SICL2+H2=SIHCL+HCL | 6.0E+12 | 0.0E+00 | 3.8E+04 |
| SICL2+H2=SIHCL2+H | 2.6E+14 | 0.0E+00 | 5.7E+04 |
| SICL2+HCL=SICL3+H | 2.4E+13 | 0.0E+00 | 4.5E+04 |
| SICL2+SICL4=SICL3+SICL3 | 2.4E+13 | 0.0E+00 | 5.1E+04 |
| SICL2+CH4=SIHCL2+CH3 | 6.5E+13 | 0.0E+00 | 6.2E+04 |
| H3SISIHCL2=SIH4+SICL2 | 2.0E+13 | 0.0E+00 | 2.3E+05 |
| SIH2CL2+SICL2=>CLH2SISICL3 | 1.3E-14 | 0.0E+00 | 8.0E+04 |
| SIH2CL2+SICL2=>CL2HSISIHCL2 | 8.3E-15 | 0.0E+00 | 1.0E+05 |
| CLH2SISICL3=>SIH2CL2+SICL2 | 7.9E+12 | 0.0E+00 | 1.9E+05 |
| CL2HSISIHCL2=>SIH2CL2+SICL2 | 6.3E+12 | 0.0E+00 | 2.1E+05 |

FIG.40B

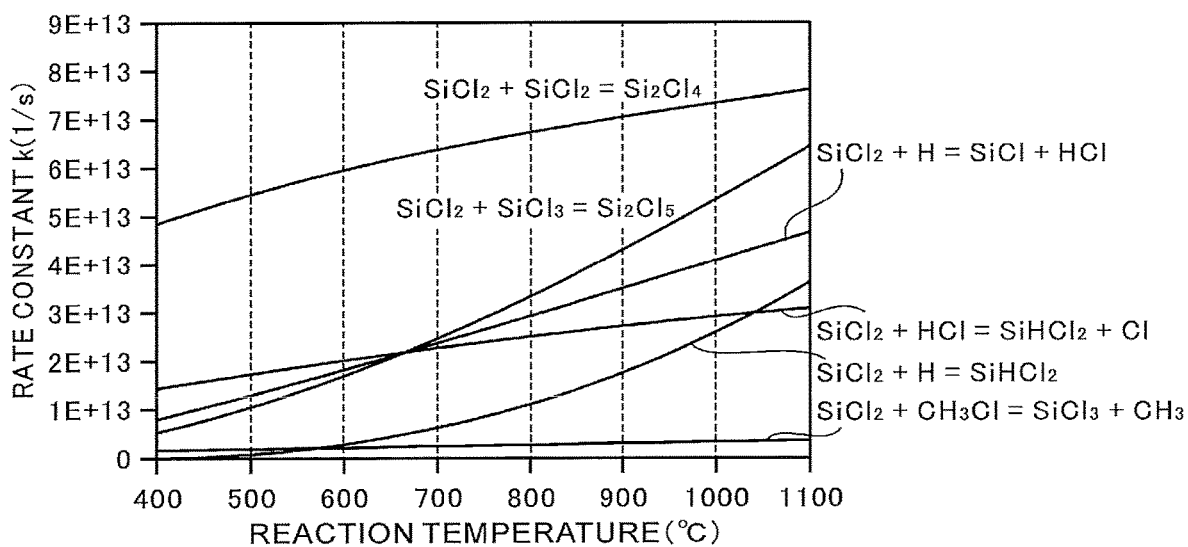

FIG.42A HCl
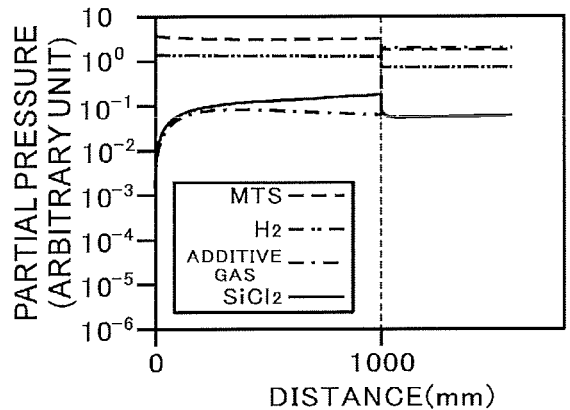
FIG.42B CH$_2$Cl$_2$
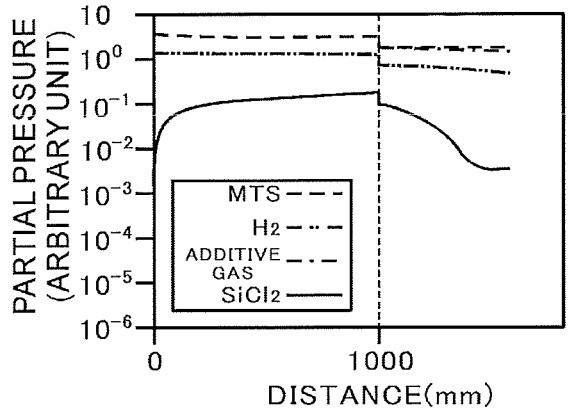
FIG.42C CH$_3$Cl
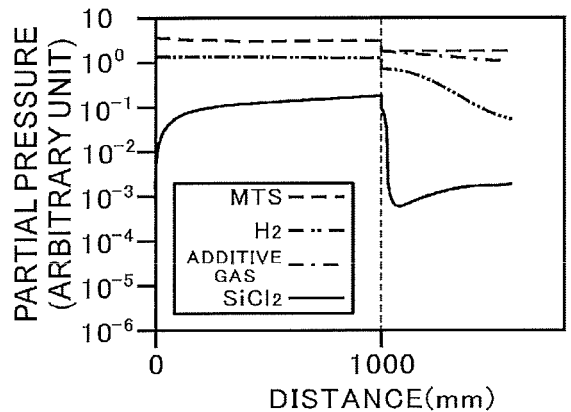
FIG.42D C$_2$HCl$_3$
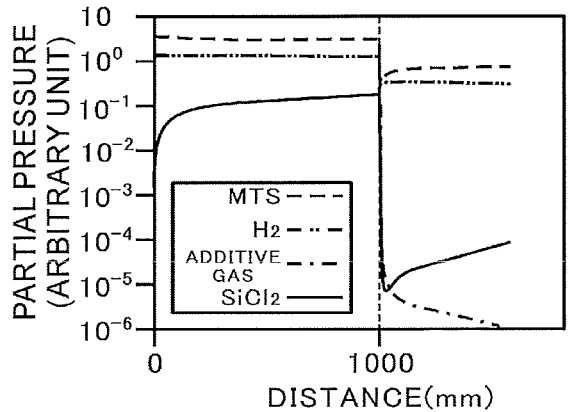
FIG.42E C$_2$H$_3$Cl$_3$
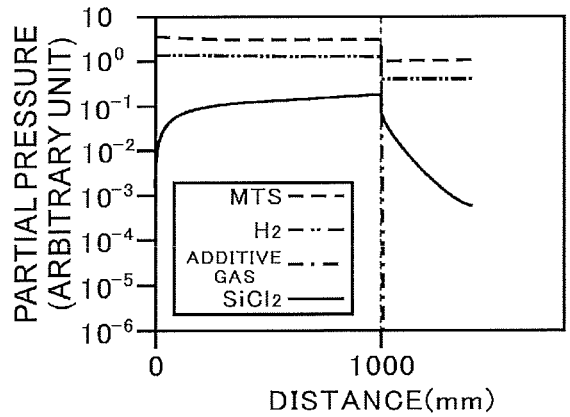
FIG.42F CCl$_4$
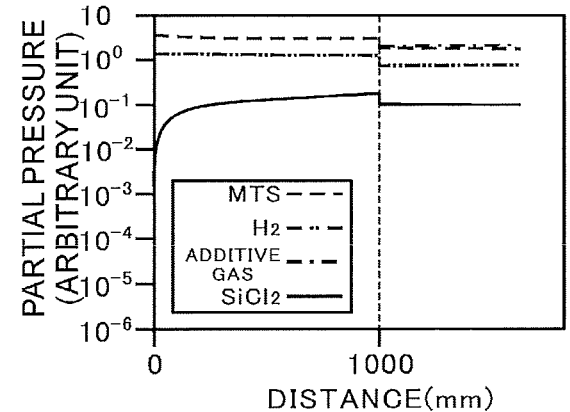

METHOD OF PRODUCING A SILICON COMPOUND MATERIAL AND APPARATUS FOR PRODUCING A SILICON COMPOUND MATERIAL

CROSS REFERENCE TO RELATED APPLICATIONS

This application is a continuation application of International Application No. PCT/JP2017/024511, filed on Jul. 4, 2017, which claims priority to Japanese Patent Application No. 2016-134128, filed on Jul. 6, 2016, the entire contents of which are incorporated by reference herein.

BACKGROUND ART

Technical Field

The present disclosure relates to a method of producing a silicon compound material and an apparatus for producing a silicon compound material, and more specifically, to a method and apparatus for producing a silicon compound material, such as a silicon carbide-based ceramic matrix composite.

Related Art

Silicon compound materials, particularly ceramic matrix composites (CMC) have attracted attention as materials which have light weight and are excellent in mechanical strength even at high temperature, and their mass production in the near future has been investigated. The ceramic matrix composites are composites each obtained by infiltrating a preform (fabric) formed of ceramic fibers (reinforcing material) with ceramic as a matrix. Of those, a silicon carbide-based ceramic matrix composite (SiC-based CMC) using silicon carbide (SiC) for both the fabric and the matrix is excellent in light weight and high heat resistance, and is regarded as a leading next-generation material.

Hitherto, the production of the silicon carbide-based ceramic matrix composite has involved a chemical vapor infiltration (CVI) step illustrated in FIG. 1. In the CVI step, methyltrichlorosilane ($CH_3SiCl_3$: MTS) and a hydrogen gas ($H_2$) serving as a raw material gas are supplied, and the raw material gas is infiltrated into a silicon carbide preform stored in a reaction furnace of a hot wall type in which an atmosphere is retained at a temperature of from about 800° C. to about 1,100° C. and a pressure of from about several Torr to about several tens of Torr. Thus, a silicon carbide matrix is deposited on the preform. In the reaction furnace, MTS forms the matrix by being precipitated in the preform as silicon carbide through various intermediates (molecules). However, part of MTS forms the matrix, and a residual part thereof is discharged from the reaction furnace. Some of the various molecules to be discharged become polymers of higher-chlorosilanes when cooled to room temperature, and are precipitated in an exhaust pipe or a pump.

Meanwhile, there is disclosed, in a method of producing trichlorosilane through conversion of tetrachlorosilane and hydrogen, a technology for suppressing generation of polymers of higher-chlorosilanes by processing a reaction gas from a conversion furnace in a first cooling step, an intermediate reaction step, and a second cooling step (see Patent Literature 1).

CITATION LIST

Patent Literature

Patent Literature 1: Japanese Patent Application Laid-Open No. JP 2010-132536

Non Patent Literature

Non Patent Literature 1: D. Togel, A. Antony, j. Bill, Petra Scheer, A. Eichhofer, G. Fritz, Journal of Organometallic Chemistry 521 (1996) 125.
Non Patent Literature 2: Investigative Report of the Explosion & Fire Accident occurred in the High-Purity Polycrystalline Silicon Manufacturing Facility at Yokkaichi Plant of Mitsubishi Materials Corporation http://www.mmc.co.jp/corporate/ja/news/press/2014/14-0612.html
Non Patent Literature 3: Frisch, M. J.; Trucks, G. W.; Schlegel, H. B.; Scuseria, G. E.; Robb, M. A.; Cheeseman, J. R.; Scalmani, G.; Barone, V.; Mennucci, B.; Petersson, G. A. et al. Gaussian 09, revision D.01; Gaussian, Inc.: Wallingford, Conn., 2009.
Non Patent Literature 4: A. Miyoshi, GPOP software, rev. 2013.07.15m5, http://www.frad.t.u-tokyo.ac.jp/~miyoshi/gpop/.
Non Patent Literature 5: A. Miyoshi, SSUMES software, rev. 2010.05.23m4, http://www.frad.t.u-tokyo.ac.jp/~miyoshi/ssumes/.
Non Patent Literature 6: CHEMKIN-PRO 15131, Reaction Design: San Diego, 2013.
Non Patent Literature 7: Yang-Soo Won, J. Ind. Eng. Chem., Vol. 13, No. 3, (2007) 400-405
Non Patent Literature 8: E. A. CHERNYSHEV, et. al., Journal of Organometallic Chemistry 271 (1984) 129.

SUMMARY

Technical Problem

In the CVI step in the production of the silicon carbide-based ceramic matrix composite, a gas discharged from the reaction furnace contains various molecules derived from MTS, and some of the various molecules are cooled to be deposited as a liquid by-product in the exhaust pipe. The by-product contains higher-chlorosilanes, and hence may combust when ignited or become an explosive substance in a solid form when oxidized in contact with the atmosphere. In addition, the by-product also generates gases, such as HCl and $H_2$, in contact with air.

Therefore, it is required to disassemble the pipe and immerse the pipe in water to hydrolyze the by-product into silicon dioxide (silica), followed by washing. When the amount of the by-product deposited is large and the by-product is not sufficiently oxidized inside thereof, the by-product has sometimes been ignited during the washing. In addition, the by-product having been collected is required to be put in a container and recovered by industrial waste disposal operators. As described above, the maintenance of an exhaust passage in the CVI step entails a large burden and also requires cost.

Meanwhile, the technology disclosed in Patent Literature 1, which is intended to suppress the generation of the polymers of the higher-chlorosilanes in the reaction gas from the conversion furnace, is based on the conversion of tetrachlorosilane and hydrogen. Therefore, the technology is not applicable to the gas discharged from the reaction furnace in the CVI step for the silicon carbide-based ceramic matrix composite.

The present disclosure is provided in view of the above-mentioned current circumstances, and an object of the present disclosure is to provide a method of producing a silicon compound material and an apparatus for producing a silicon compound material each capable of decreasing the generation of a liquid or solid by-product derived from a gas discharged from a reaction furnace in which a silicon compound material, such as a silicon carbide-based ceramic matrix composite, is produced by a CVI method.

Solution to Problem

In order to solve the above-mentioned problems, according to one embodiment of the present disclosure, there is provided a method of producing a silicon compound material, including the steps of: storing a silicon carbide (SiC) preform in a reaction furnace; supplying a raw material gas containing methyltrichlorosilane (MTS) to the reaction furnace to infiltrate the preform with silicon carbide; and controlling and changing a temperature of a gas discharged from the reaction furnace at a predetermined rate to subject the gas to continuous thermal history, to thereby decrease generation of a liquid or solid by-product derived from the gas.

The step of controlling and changing a temperature of a gas discharged from the reaction furnace may include a step of retaining the gas discharged from the reaction furnace at a predetermined temperature. The predetermined temperature may fall within a range of 500° C. or more and less than 950° C. or may be 1,500° C. or more. The predetermined temperature may fall within a range of 600° C. or more and less than 800° C. The step of decreasing generation of a liquid or solid by-product may include retaining the gas discharged from the reaction furnace at a predetermined temperature for a predetermined time period falling within a range of from 0 seconds to 8 seconds. The step of decreasing generation of a liquid or solid by-product may include changing the temperature of the gas to a plurality of temperatures in a stepwise manner.

The liquid or solid by-product may include a higher-chlorosilane. The step of decreasing generation of a liquid or solid by-product may include converting $SiCl_2$ serving as a precursor of the liquid or solid by-product into a stable substance, to thereby decrease the generation of the liquid or solid by-product. The stable substance may include at least one of methyltrichlorosilane, dimethyldichlorosilane $((CH_3)_2SiCl_2)$, disilane $(Si_2H_6)$, dichlorosilane $(SiH_2Cl_2)$, trichlorosilane $(SiHCl_3)$, or tetrachlorosilane $(SiCl_4)$.

The step of decreasing generation of a liquid or solid by-product may include adding a predetermined additive gas to the gas discharged from the reaction furnace. The step of decreasing generation of a liquid or solid by-product may include adding the additive gas so that an amount of substance of the additive gas is larger than an amount of substance of the liquid or solid by-product.

The step of decreasing generation of a liquid or solid by-product may include adding chlorine so that an amount of substance of chlorine is larger than an amount of substance of silicon contained in the liquid or solid by-product.

The step of decreasing generation of a liquid or solid by-product may include a step of retaining the gas discharged from the reaction furnace at a predetermined temperature, and the step of retaining the gas discharged from the reaction furnace at a predetermined temperature may include the adding a predetermined additive gas.

The step of retaining the gas discharged from the reaction furnace at a predetermined temperature may include using a reforming furnace, and a time period for which the gas discharged from the reaction furnace is retained at the predetermined temperature may be a residence time of the gas in the reforming furnace.

The predetermined temperature may fall within a range of 200° C. or more and less than 1,100° C.

The predetermined temperature may fall within a range of 750° C. or more and less than 850° C.

The additive gas may include a gas including a molecule containing chlorine. The additive gas may include at least one of a nitrogen gas $(N_2)$, a hydrogen gas $(H_2)$, hydrogen chloride (HCl), chloromethane $(CH_3Cl)$, tetrachloromethane $(CCl_4)$, trichloroethylene $(C_2HCl_3)$, trichloroethane $(C_2H_3Cl_3)$, ethylene $(C_2H_4)$, ethanol $(C_2H_6O)$, acetone $(C_3H_6O)$, methanol $(CH_4O)$, water vapor $(H_2O)$, dichloromethane $(CH_2Cl_2)$, or chloroform $(CHCl_3)$.

In addition, the additive gas may include chloromethane or dichloromethane, and, in the step of retaining the gas discharged from the reaction furnace at a predetermined temperature, a time period for which the gas discharged from the reaction furnace, to which the additive gas has been added, is retained at the predetermined temperature may be set to 0.08 second or more.

In addition, the additive gas may include chloromethane or dichloromethane, and, in the step of retaining the gas discharged from the reaction furnace at a predetermined temperature, a time period for which the gas discharged from the reaction furnace, to which the additive gas has been added, is retained at the predetermined temperature may be set to 1 second or more.

In addition, the additive gas may include chloromethane, and, in the step of retaining the gas discharged from the reaction furnace at a predetermined temperature, an amount of substance of chloromethane to be added may be 1.0 time or more as large as an amount of substance of methyltrichlorosilane in the raw material gas to be loaded.

In addition, the additive gas may include chloromethane, and, in the step of retaining the gas discharged from the reaction furnace at a predetermined temperature, the predetermined temperature may fall within a range of 750° C. or more and less than 850° C., an amount of substance of chloromethane to be added may fall within a range of 1.0 time or more and less than 1.5 times as large as a loading amount of methyltrichlorosilane in the raw material gas, and a time period for which the gas discharged from the reaction furnace, to which the additive gas has been added, is retained at the predetermined temperature may be set within a range of 1 second or more and less than 10 seconds.

In addition, the additive gas may include dichloromethane, and, in the step of retaining the gas discharged from the reaction furnace at a predetermined temperature, an amount of substance of dichloromethane to be added may be 0.25 time or more as large as a loading amount of methyltrichlorosilane in the raw material gas.

In addition, the additive gas may include dichloromethane, and, in the step of retaining the gas discharged from the reaction furnace at a predetermined temperature, the predetermined temperature may fall within a range of 750° C. or more and less than 850° C., an amount of substance of dichloromethane to be added may fall within a range of 0.25 time or more and less than 1.5 times as large as an amount of substance of methyltrichlorosilane in the raw material gas to be loaded, and a time period for which the gas discharged from the reaction furnace, to which the additive gas has been added, is retained at the predetermined temperature may be set within a range of 1 second or more and less than 10 seconds.

In addition, the additive gas may include any one of hydrogen chloride, tetrachloromethane, trichloroethylene, trichloroethane, and ethylene, the predetermined temperature may be 975° C., an amount of substance of the gas to be added may be 1.0 time as large as an amount of substance of methyltrichlorosilane in the raw material gas to be loaded, and a time period for which the gas discharged from the reaction furnace, to which the additive gas has been added, is retained at the predetermined temperature may be set to 1 second.

In order to solve the above-mentioned problems, according to one embodiment of the present disclosure, there is provided an apparatus for producing a silicon compound material, including: a reaction furnace configured to store a preform; a raw material gas supply portion configured to supply a raw material gas containing methyltrichlorosilane to the reaction furnace; a reforming furnace configured to retain a gas discharged from the reaction furnace at a predetermined temperature; and an additive gas supply portion configured to supply a predetermined additive gas to the reforming furnace.

In addition, the reforming furnace may be of a hot wall type.

In addition, the reforming furnace may have arranged therein a baffle plate.

In addition, the reforming furnace may be formed of a circular tube, and the circular tube may have a specific surface area falling within a range of from 5 mm to 15 mm, which is determined by dividing a volume of the circular tube by a surface area of the circular tube.

Effects of Disclosure

According to the present disclosure, the generation of the liquid or solid by-product which is derived from the gas discharged from the reaction furnace in which a silicon compound material, such as a silicon carbide-based ceramic matrix composite, is produced by a CVI method, and may become an explosive substance through a reaction with the atmosphere can be decreased.

BRIEF DESCRIPTION OF DRAWINGS

FIG. 40A is a table for showing examples of elementary reactions related to $SiCl_2$ and constants thereof.

FIG. 40B is a graph for comparison of the rate constants of elementary reactions listed as candidates.

FIG. 42A is a graph for showing the result of simulation in the case of adding HCl as an additive gas.

FIG. 42B is a graph for showing the result of simulation in the case of adding $CH_2Cl_2$ as an additive gas.

FIG. 42C is a graph for showing the result of simulation in the case of adding $CH_3Cl$ as an additive gas.

FIG. 42D is a graph for showing the result of simulation in the case of adding $C_2HCl_3$ as an additive gas.

FIG. 42E is a graph for showing the result of simulation in the case of adding $C_2H_3Cl_3$ as an additive gas.

FIG. 42F is a graph for showing the result of simulation in the case of adding $CCl_4$ as an additive gas.

DESCRIPTION OF EMBODIMENTS

Figure 1:
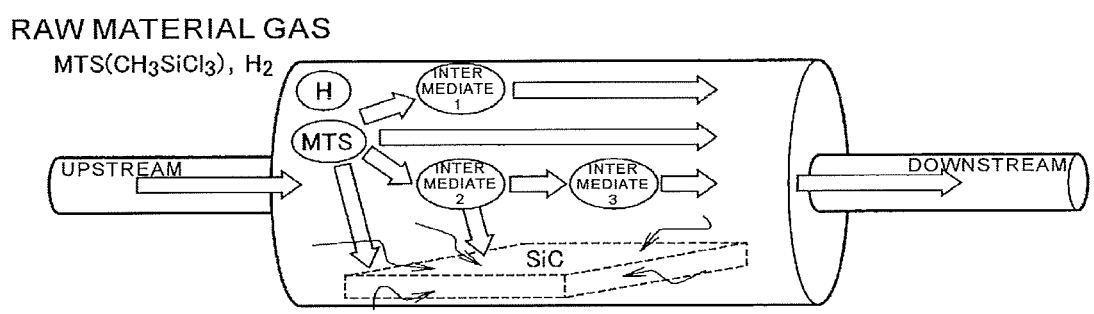
FIG. 1 is a conceptual view of a CVI method.

Now, with reference to the attached drawings, an embodiment of the present disclosure is described in detail. The dimensions, materials, and other specific numerical values in the embodiment are merely examples used for facilitating the understanding of the disclosure, and do not limit the present disclosure unless otherwise noted. Elements having substantially the same functions and configurations herein and in the drawings are denoted by the same reference symbols to omit redundant description thereof. Further, illustration of elements with no direct relationship to the present disclosure is omitted.

A method of producing a silicon compound material and an apparatus for producing a silicon compound material according to an embodiment of the present disclosure are hereinafter described in detail with reference to the drawings. In this embodiment, as the silicon compound material, the production of a silicon carbide-based ceramic matrix composite using silicon carbide for both a preform and a matrix is supposed.

(Design of By-Product Decreasing Reaction)

A by-product generation reaction mechanism is analyzed through use of a reaction mechanism based on quantum chemical calculation, and reaction conditions for decreasing the generation amount of a by-product and eradicating the by-product are considered.

Figure 2:
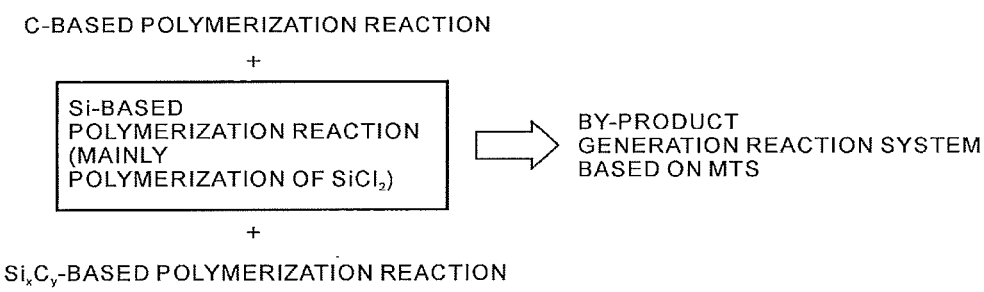
FIG. 2 is a view for illustrating a construction guideline for a by-product generation reaction mechanism.

It is considered that a precursor of a by-product generated from a mixed gas of methyltrichlorosilane and a hydrogen gas (hereinafter sometimes described as "MTS/$H_2$") is $SiCl_2$, and the by-product is generated through polymerization of $SiCl_2$ (see Non Patent Literature 1). There is no example of making a detailed investigation into the molecular weight, the structure, and the like of the by-product in a MTS/$H_2$ system, but a detailed investigation has been made into a system of a mixed gas of trichlorosilane and a hydrogen gas (hereinafter sometimes described as "$SiHCl_3/H_2$") (see Non Patent Literature 2). It has been reported that a by-product in the $SiHCl_3/H_2$ mixed gas system includes $Si_nCl_{2n+2}$ and $(SiCl_2)_n$ (n=3 to 6). It is anticipated that, in the by-product in the MTS/$H_2$ mixed gas system, in which $SiCl_2$ is generated as in the $SiHCl_3/H_2$ system, $Si_nCl_{2n+2}$ or $(SiCl_2)_n$ is generated in the same manner. In view of the foregoing, as illustrated in FIG. 2, a $(SiCl_2)_n$ system is considered in this embodiment.

Figure 3:
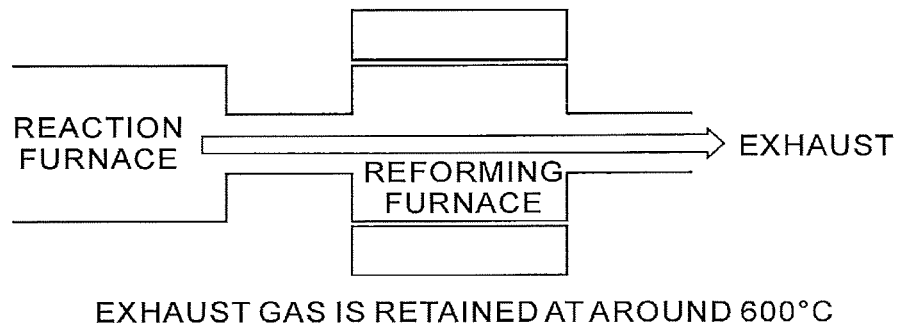
FIG. 3 is a view for illustrating a method of decreasing the generation of a by-product through use of a reforming furnace.
Figure 4:
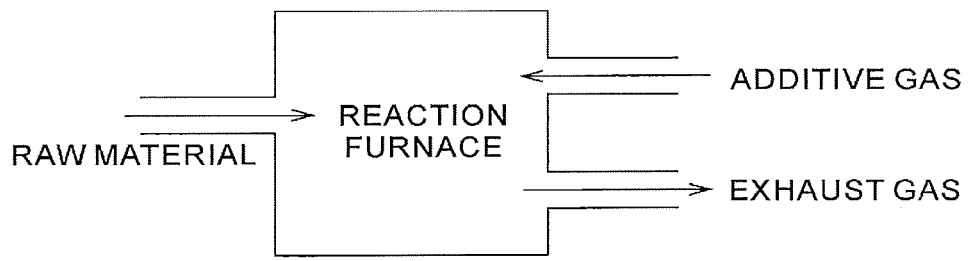
FIG. 4 is a view for illustrating a method of decreasing the generation of a by-product through introduction of an additive gas.
Figure 5:
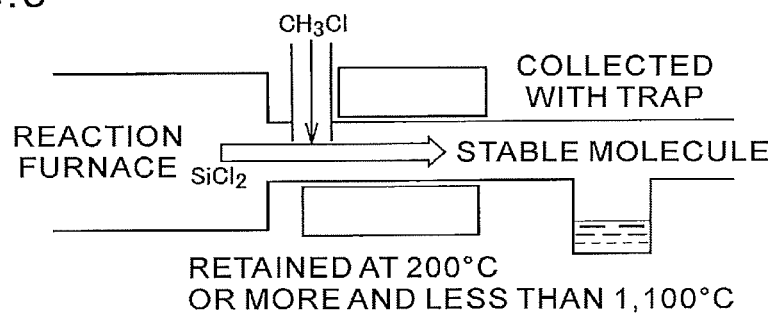
FIG. 5 is a view for illustrating a method of decreasing the generation of a by-product through use of a reforming furnace and an additive gas.

The following three methods of decreasing the generation of a by-product as illustrated FIG. 3 to FIG. 5 are obtained in this embodiment. The details thereof are described further below.

1) As illustrated in FIG. 3, an exhaust gas is retained at about 600° C. (500° C. or more and less than 950° C.) in a reforming furnace.

2) As illustrated in FIG. 4, at least any one of $N_2$, $H_2$, HCl, $CH_3Cl$, $CCl_4$, $C_2HCl_3$, $C_2H_3Cl_3$, $C_2H_4$, $C_2H_6O$, $C_3H_6O$, $CH_4O$, $H_2O$, $CH_2Cl_2$, or $CHCl_3$ is added to an outlet of a reaction furnace.

3) As illustrated in FIG. 5, at least any one of $N_2$, $H_2$, HCl, $CH_3Cl$, $CCl_4$, $C_2HCl_3$, $C_2H_3Cl_3$, $C_2H_4$, $C_2H_6O$, $C_3H_6O$, $CH_4O$, $H_2O$, $CH_2Cl_2$, or $CHCl_3$ is added, and an exhaust gas is retained at 200° C. or more and less than 1,100° C. in a reforming furnace.

(Construction of By-Product Generation Reaction Mechanism)

Although $Si_nCl_{2n+2}$ and $(SiCl_2)_n$ have been considered problematic for years, there are no thermodynamic data of the by-product and no data on the generation reaction rate etc. of the by-product. The thermodynamic data of $Si_nCl_{2n+2}$ and $(SiCl_2)_n$ (n≥13) and their generation reaction rate constants were calculated through quantum chemical calculation. A molecular structure, an energy, and a frequency were calculated through use of Gaussian 09D (see Non Patent Literature 3) at the CBS-QB3//B3LYP/CBSB7 level. The reaction rate constants were calculated through use of GPOP (see Non Patent Literature 4) and SSUMSE (see Non Patent Literature 5).

Figure 6A:
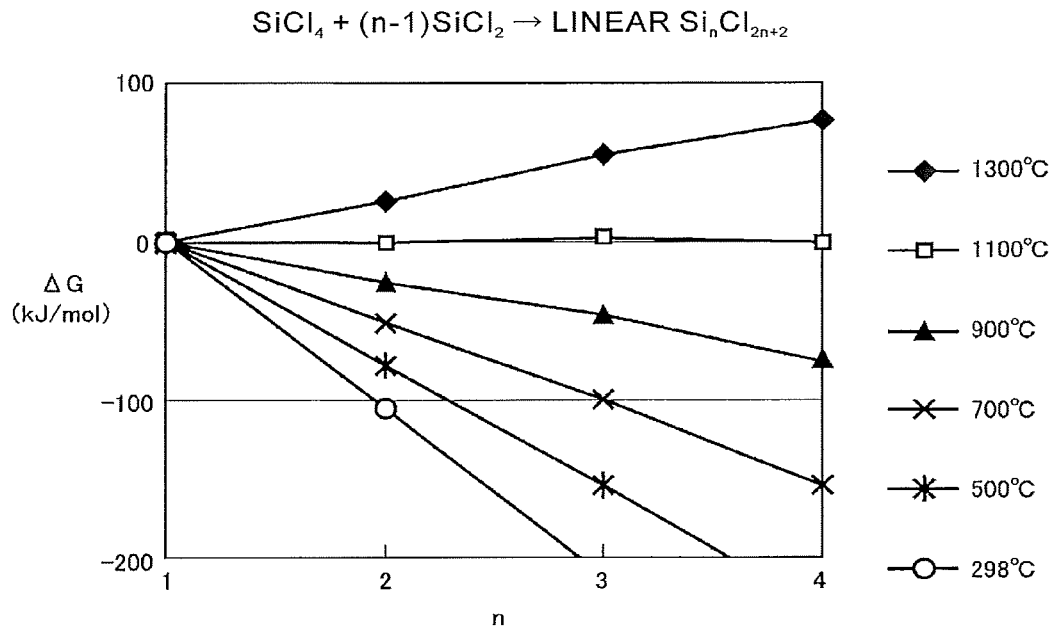
FIG. 6A is a first graph for showing a change in free energy of higher-chlorosilanes.
Figure 6B:
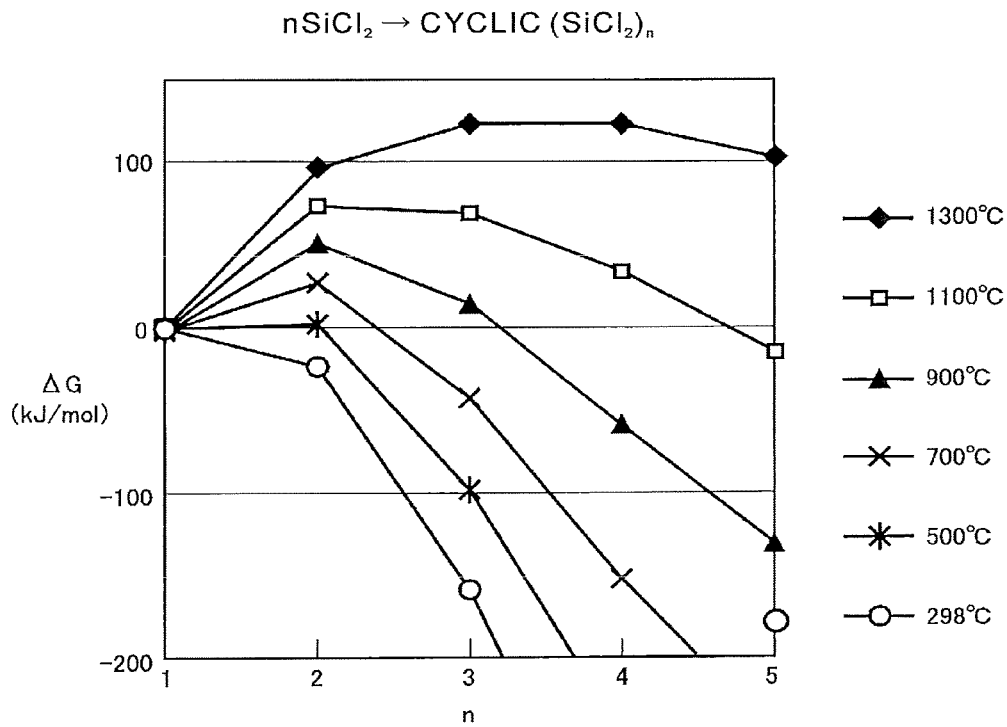
FIG. 6B is a second graph for showing a change in free energy of the higher-chlorosilanes.

A change in free energy through polymerization of $SiCl_2$ is shown in each of FIG. 6A and FIG. 6B. In linear polymerization cases shown in FIG. 6A, $SiCl_2$ in an unbound state has a lower free energy and is more stable at 1,100 K or more, and $SiCl_2$ in a polymerized state has a lower free energy and becomes gradually stable at 1,100 K or less. Meanwhile, in cyclic polymerization cases shown in FIG. 6B, $SiCl_2$ has the highest free energy and is most unstable at a certain polymerization degree, and has a lower free energy and becomes more stable with an increase in polymerization degree. The polymerization degree and free energy at which $SiCl_2$ is most unstable vary with temperature.

Figure 7:
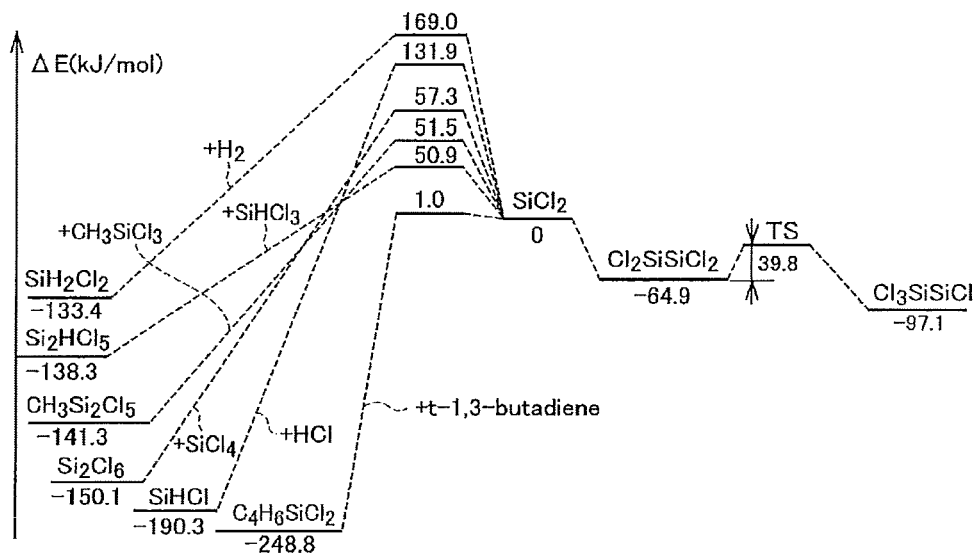
FIG. 7 is a view for illustrating a reaction path between $SiCl_2$ and another gas species.

A reaction energy and a reaction barrier of a reaction between $SiCl_2$ and another molecule at 0 K are illustrated in FIG. 7 (see Non Patent Literatures 1 and 2). When the case in which $SiCl_2$ follows a right side path of FIG. 7 in which $SiCl_2$ reacts with another $SiCl_2$ to become $Si_2Cl_4$ ($Cl_2SiSiCl_2$, $Cl_3SiSiCl$) and the cases in which $SiCl_2$ follows left side paths of FIG. 7 in which $SiCl_2$ reacts with $H_2$, HCl, and the like are compared to one another, a product of the reaction between $SiCl_2$ with another $SiCl_2$ has a higher energy and is more unstable than any of products of the reactions on the left side. However, when reaction barriers between $SiCl_2$ and those products are compared to one another, whereas all the products on the left side excluding the product in the case of butadiene have a barrier of 50 kJ/mol or more, a barrier to $Si_2Cl_4$ is low with respect to original $SiCl_2$ and is lower than the barriers to the products on the left side.

From the above-mentioned results, when the temperature of $SiCl_2$, which is stable at high temperature, is reduced from 1,000° C. or more and retained at a certain temperature, $SiCl_2$ primarily becomes $Si_2Cl_4$, which has a low reaction barrier. However, $Si_2Cl_4$ in itself is unstable as compared to $SiHCl_3$ or $SiH_2Cl_2$, and hence a reaction in which $Si_2Cl_4$ becomes $SiHCl_3$ or $SiH_2Cl_2$ over time is anticipated.

Figure 8:
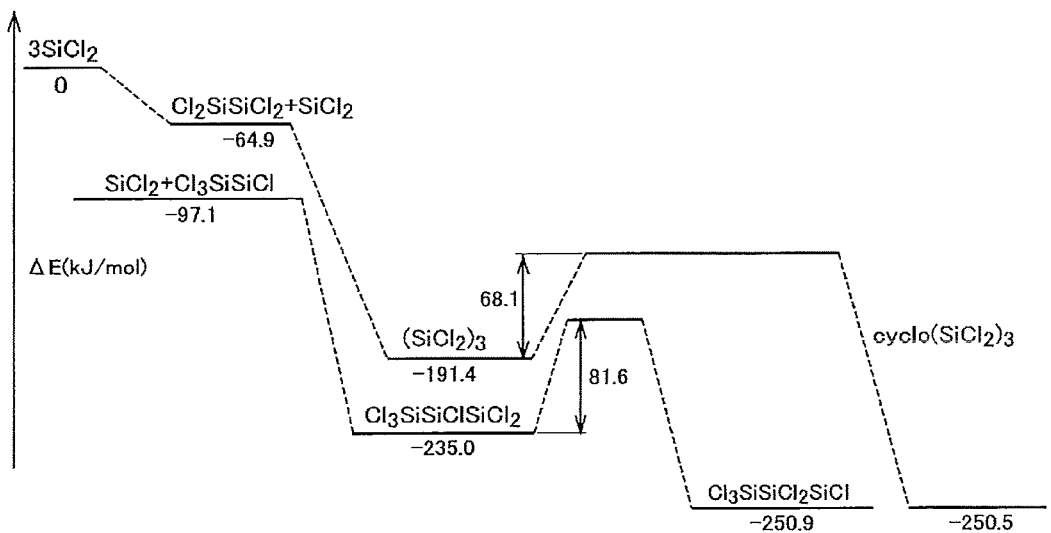
FIG. 8 is a view for illustrating a reaction path from $3SiCl_2$ to $(SiCl_2)_3$.

A reaction path from $SiCl_2$ to $(SiCl_2)_3$ at 0 K is illustrated in FIG. 8. Each product in the path from $SiCl_2$ to $(SiCl_2)_3$ has a low energy and a low reaction barrier with respect to $SiCl_2$, and hence it is anticipated that $SiCl_2$ becomes $(SiCl_2)_3$ significantly easily at 0 K. Based on those energy paths, the reaction rate constant of a $SiCl_2$ polymerization reaction was calculated.

(Feature Prediction of By-Product Generation Reaction)

The above-mentioned reaction mechanism was introduced into a MTS/$H_2$ reaction mechanism. Reaction calculation was performed through use of the reaction mechanism and CHEMKIN (see Non Patent Literature 6). In order to grasp the feature of $SiCl_2$, first, a $SiHCl_3/H_2$ mixed gas was considered. As a temperature distribution, a temperature distribution as shown in the upper part of FIG. 9 was used. The temperature distribution is made with reference to a gold furnace actually used as a reaction furnace, and a temperature is drastically reduced on an outlet side. Reaction calculation was performed under the conditions in which the $SiHCl_3/H_2$ mixed gas flows as a plug flow in a cylindrical tube having an inner diameter of 16 mm under gas conditions of a partial pressure ratio between $SiHCl_3$ and $H_2$ of 1:37 (under reduced pressure) and a flow rate of 1.08 slm.

Figure 9:
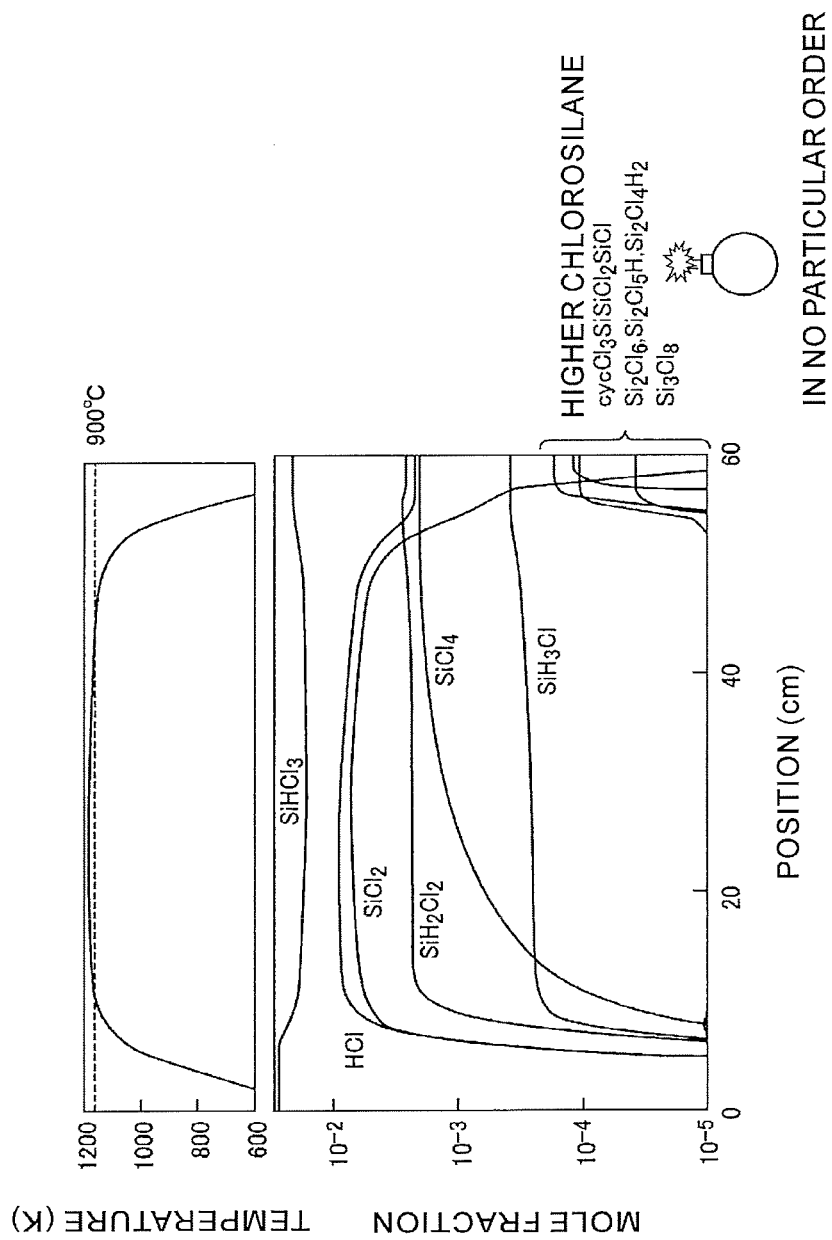
FIG. 9 includes graphs for consideration of a polymerization temperature of $SiCl_2$.

A change in gas mole fraction is shown in the lower part of FIG. 9. As shown in FIG. 9, it was anticipated that a higher-chlorosilane $(SiCl_2)_n$, which was considered as one by-product, was generated in the course of temperature reduction, not in a soaking region of about 900° C. in a CVI reaction furnace. With this, it is anticipated that the generation temperature of a by-product is lower than 600° C. An illustration of a bomb of FIG. 9 indicates that the higher-chlorosilane may become an explosive substance when oxidized in contact with the atmosphere. The same applies hereinafter.

Figure 10A:
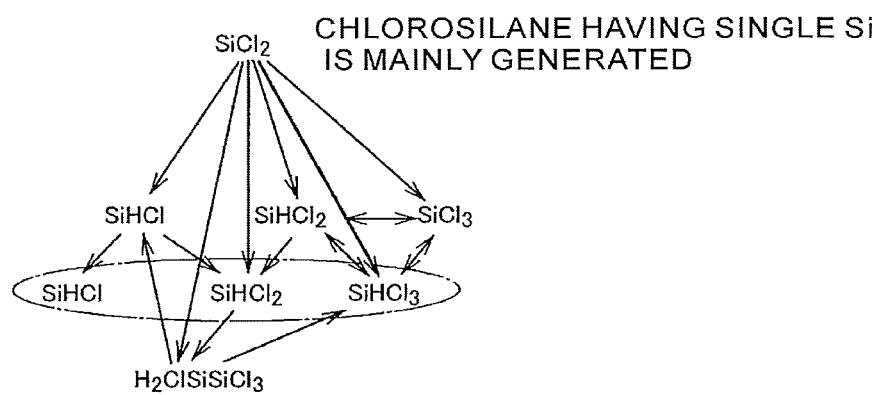
FIG. 10A is a first view for illustrating a main reaction of $SiCl_2$ at the time of temperature reduction.
Figure 10B:
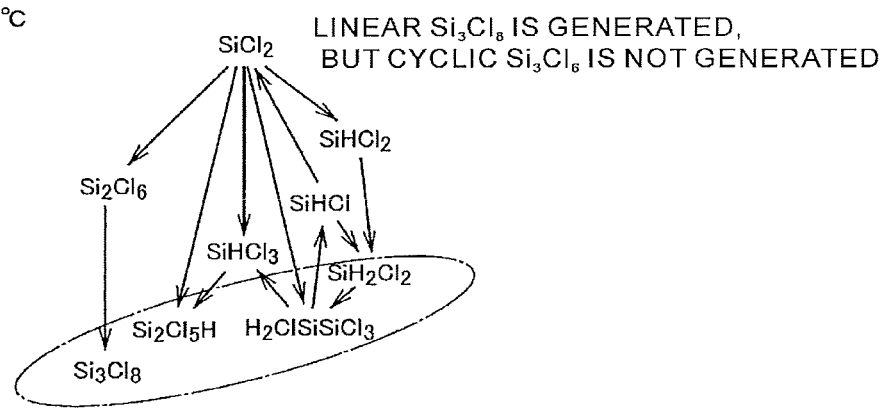
FIG. 10B is a second view for illustrating the main reaction of $SiCl_2$ at the time of temperature reduction.
Figure 10C:
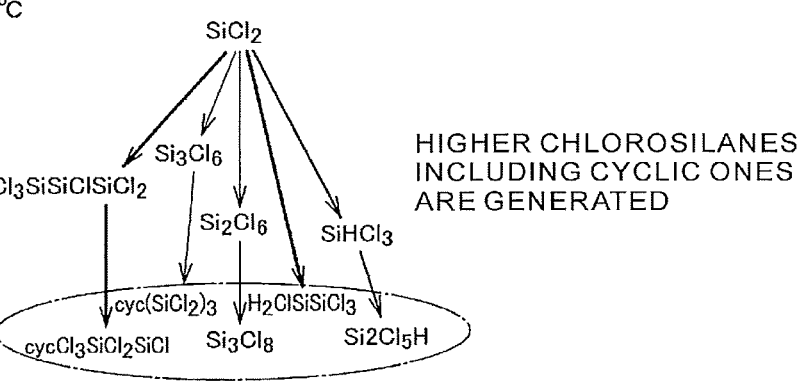
FIG. 10C is a third view for illustrating the main reaction of $SiCl_2$ at the time of temperature reduction.

A main reaction of $SiCl_2$ occurring at from 400° C. to 800° C. in the course of temperature reduction in FIG. 9 is illustrated in each of FIG. 10A, FIG. 10B, and FIG. 10C. At the temperatures, the following reaction proceeds (see Non Patent Literature 1).

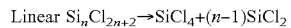

Linear $Si_nCl_{2n+2} \rightarrow SiCl_4 + (n-1)SiCl_2$

At 800° C. illustrated in FIG. 10A, polymerization does not occur and a monomolecule having single Si is generated. When a temperature reaches down to 600° C. illustrated in FIG. 10B, a linear SiCl compound is generated. When the temperature reaches down to 400° C. illustrated in FIG. 10C, a cyclic compound is generated.

Figure 11A:
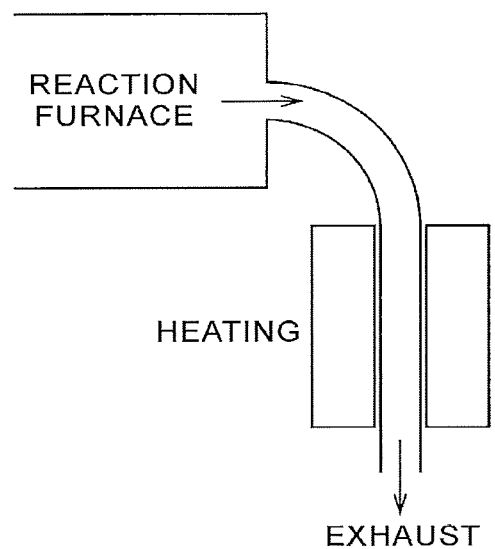
FIG. 11A is a first view for consideration of heat treatment conditions on an exhaust side.
Figure 11B:
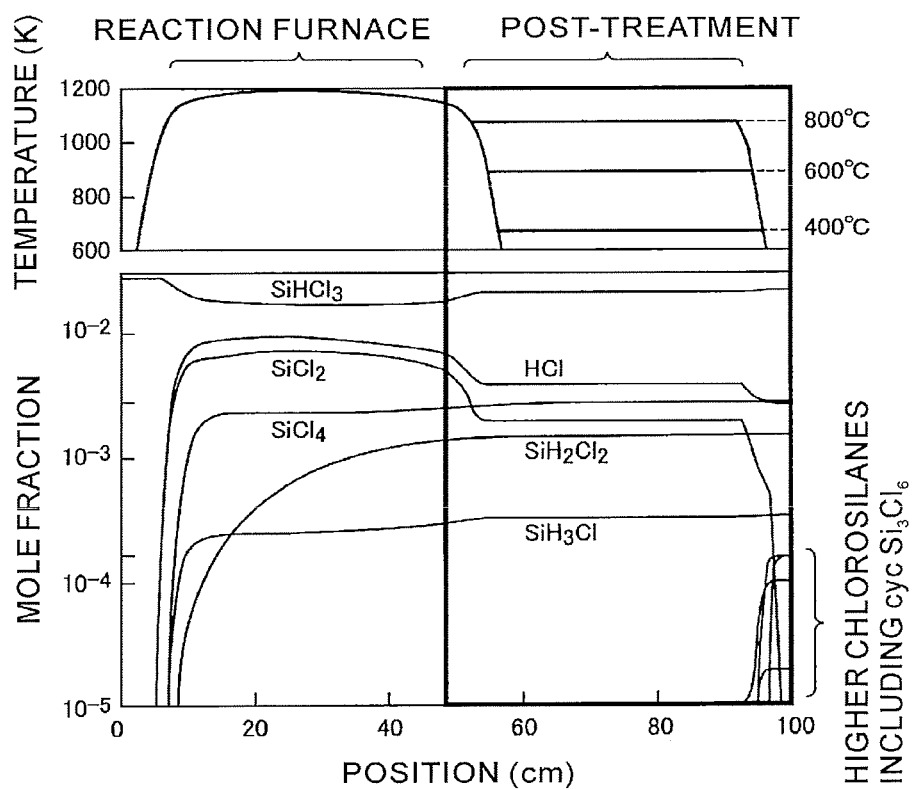
FIG. 11B is a second view including graphs for consideration of the heat treatment conditions on the exhaust side.

It is said as an experimental rule that, in CVD using $SiHCl_3/H_2$, the amount of the by-product is decreased by warming an exhaust pipe. Therefore, calculation in which the temperature of a thermally decomposed $SiHCl_3/H_2$ gas was retained on a downstream side was performed. FIG. 11A and FIG. 11B correspond to an example in which the temperature is retained at 800° C. A configuration on the downstream side is illustrated in FIG. 11A, in which a reforming furnace for post-treatment is arranged in a stage subsequent to a reaction furnace. A temperature distribution and the contents of higher-chlorosilanes are shown in FIG. 11B.

Figure 12C:
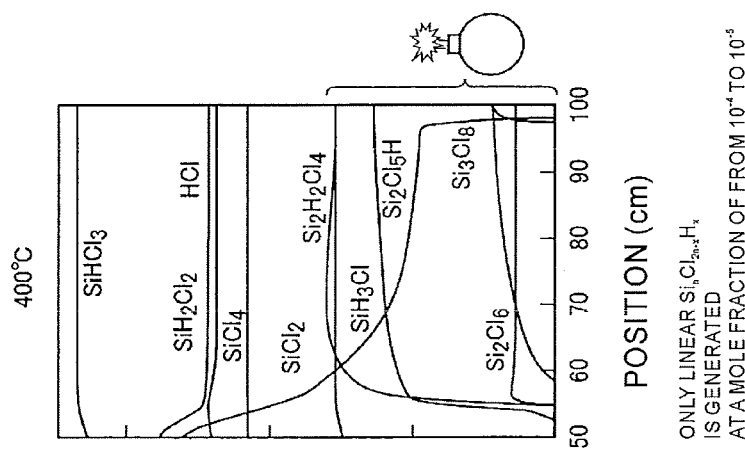
FIG. 12C is a third graph for comparison of the generation amounts of the higher-chlorosilanes relative to the retention temperature.
Figure 12B:
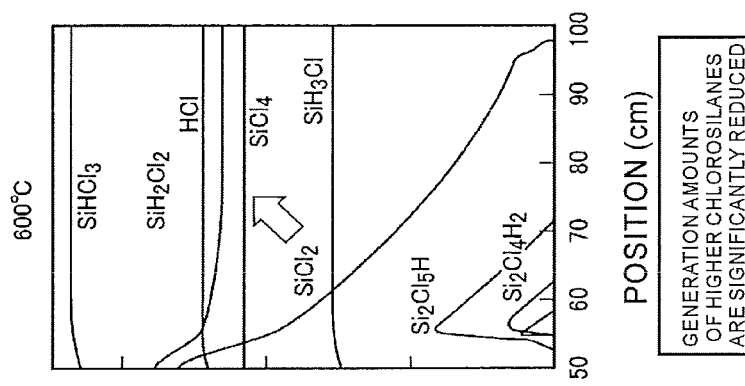
FIG. 12B is a second graph for comparison of the generation amounts of the higher-chlorosilanes relative to the retention temperature.
Figure 12A:
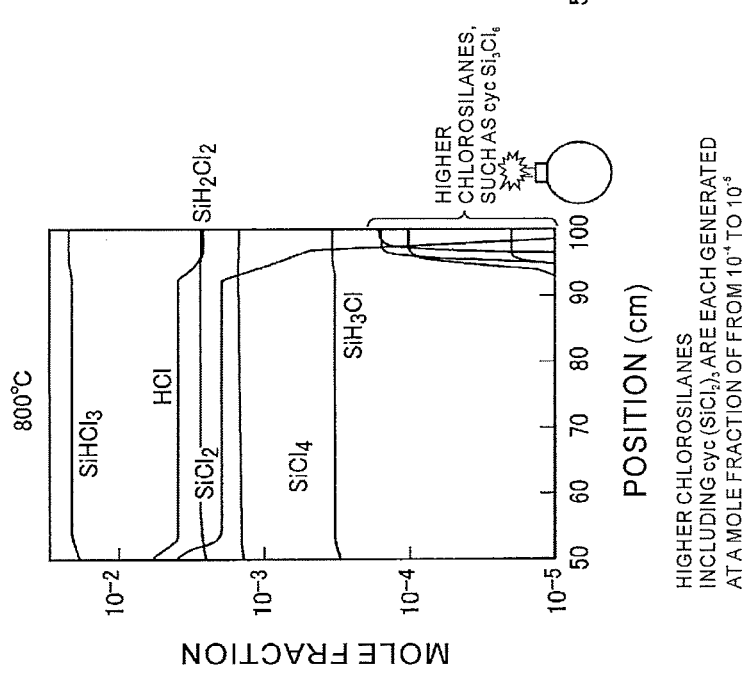
FIG. 12A is a first graph for comparison of generation amounts of higher-chlorosilanes relative to a retention temperature.

The results of reaction calculation in the case of changing the retention temperature to 800° C., 600° C., and 400° C. are shown in FIG. 12A, FIG. 12B, and FIG. 12C, respectively. FIG. 12A, FIG. 12B, and FIG. 12C each correspond to a post-treatment part of FIG. 11A and FIG. 11B. At 800° C. shown in FIG. 12A, $SiCl_2$ is stable because of the high temperature, and hence $SiCl_2$ does not react but finally becomes the by-product when cooled. In contrast, at 400° C. shown in FIG. 12C, the by-product is stable because of the low temperature, and hence $SiCl_2$ becomes the by-product. At 600° C. shown in FIG. 12B, $SiHCl_3$ is generated through the following reaction presumably because both $SiCl_2$ and the by-product are unstable and $SiHCl_3$ is stable.

$SiCl_2 + HCl \rightarrow SiHCl_3$

From the above-mentioned results, it is anticipated that a temperature around 600° C. is suitable for converting $SiCl_2$ into $SiHCl_3$, which is energetically stable.

(Design of By-Product Decreasing Reaction Without Addition of Gas)

Figure 13:
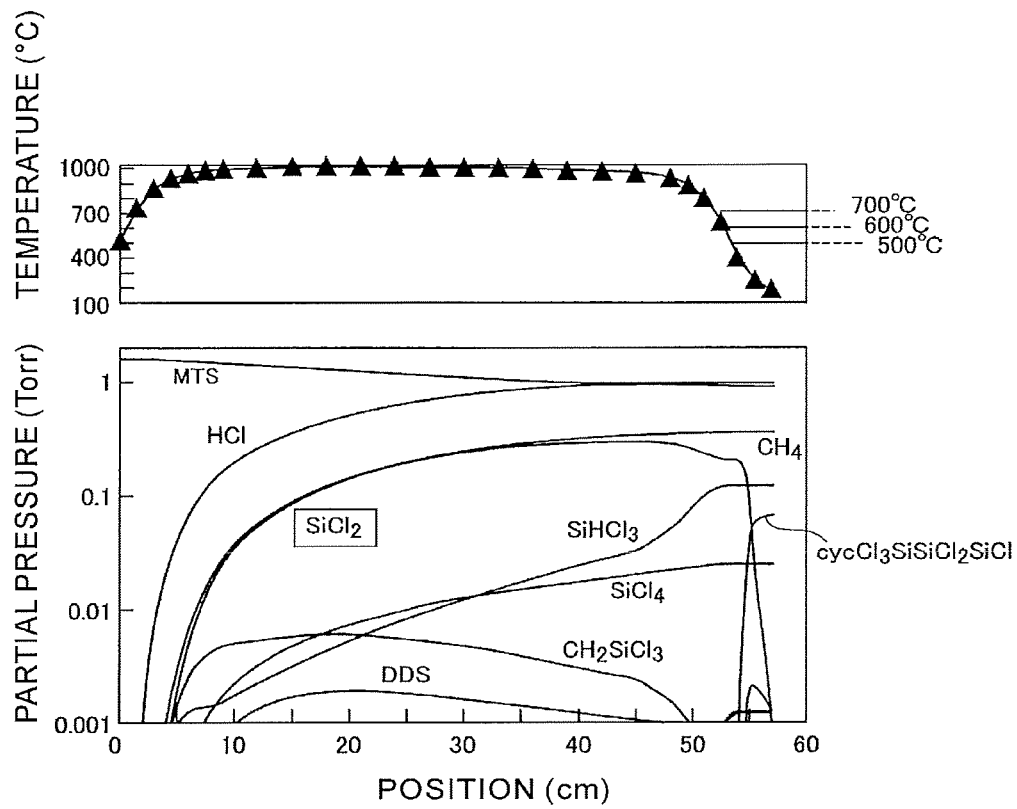
FIG. 13 includes graphs for showing prediction of polymerization of $SiCl_2$ in a $MTS/H_2$ system.

In order to consider $SiCl_2$ decreasing conditions for a $MTS/H_2$ gas, reaction calculation was performed in the same manner. The conditions of the calculation were as follows: a partial pressure ratio among MTS, $H_2$, and He of 2:5:18 (under reduced pressure); an inner diameter of 16 mm; and a total flow rate of 100 sccm. The result at the time of directly reducing a temperature is shown in FIG. 13. It is considered that the higher-chlorosilanes are generated as in the $SiHCl_3/H_2$ system.

Figure 14:
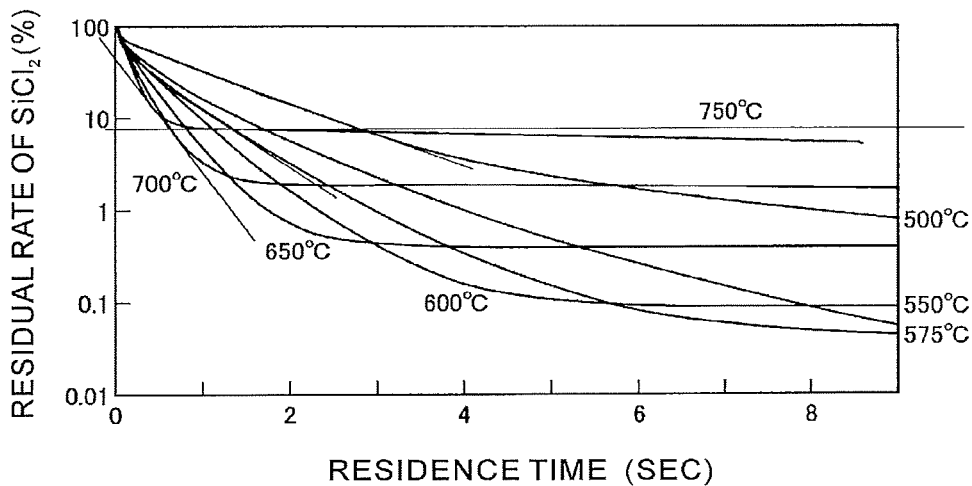
FIG. 14 is a graph for showing a diminution speed of $SiCl_2$ at the time of retaining an exhaust gas at various temperatures.

It is supposed that the residual amount of $SiCl_2$ is directly linked to the generation amounts of the higher-chlorosilanes, and hence only the residual rate of $SiCl_2$ is considered. A change in residual rate of $SiCl_2$ at the time of changing a retention temperature of an exhaust gas in a range of from 500° C. to 750° C. is shown in FIG. 14. When the exhaust gas is retained at a temperature of from 700° C. to 750° C., a diminution speed of $SiCl_2$ is high, but $SiCl_2$ remains in a larger amount. Meanwhile, when the exhaust gas is retained at a temperature of less than 600° C. and subjected to a reaction for a sufficient time period, the residual rate is considerably decreased, but the diminution speed becomes lower. For example, whereas $SiCl_2$ is decreased fastest through treatment at 700° C. at a residual rate of $SiCl_2$ of about 10%, $SiCl_2$ is decreased fastest through treatment at 650° C. at a residual rate of $SiCl_2$ of about 1%. Therefore, it is considered that, when the treatment temperature of $SiCl_2$ is gradually reduced from 700° C. or more, a treatment time period is shortened and the volume of a reforming furnace required for the treatment is decreased, as compared to the case of keeping the temperature constant.

In FIG. 14, the diminution speed of $SiCl_2$ at each temperature is defined by the following equation.

$$dC/dt = -k_{SiCl2} \times C \quad (1)$$

Figure 15:
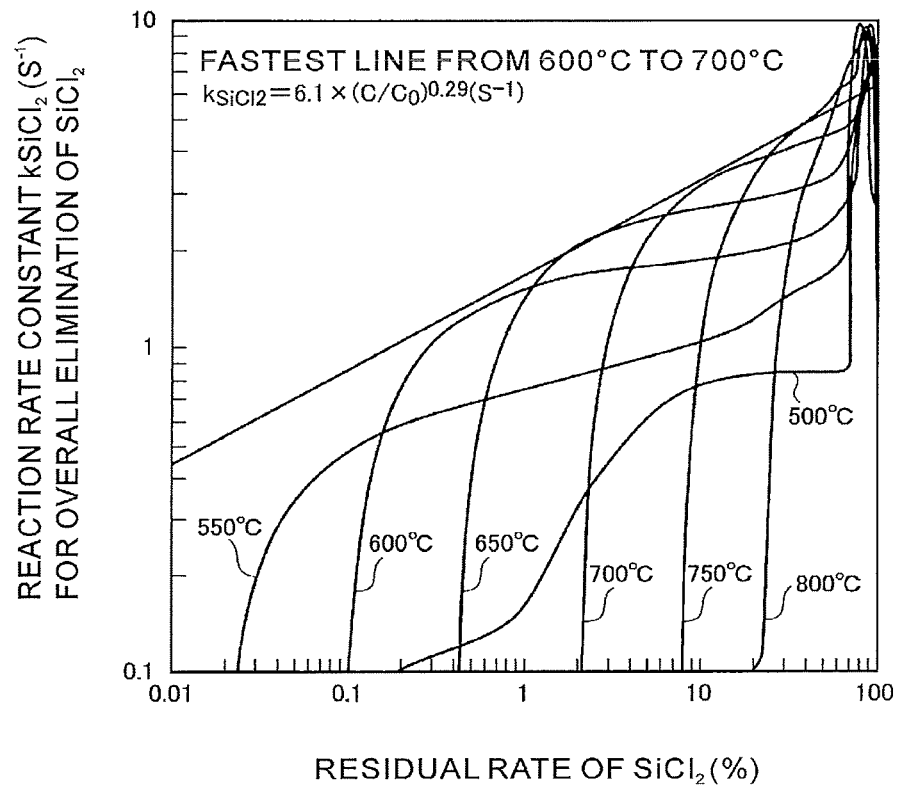
FIG. 15 is a graph for showing a reaction rate constant $k_{SiCl2}$ for overall elimination at which a by-product can be eliminated fastest by combining optimal conditions at each retention temperature.

In the equation, C represents the concentration of $SiCl_2$, and t represents a residence time (sec). FIG. 15 is a graph for showing a curve obtained by plotting a residual rate (%) of $SiCl_2$, $C/C_0$, on the abscissa and $kSiCl_2$ on the ordinate at various temperatures. As seen from FIG. 15, for example, when the residual rate of $SiCl_2$ is 15% or more, the maximum $kSiCl_2$ is obtained through retention at 750° C., but when the residual rate of $SiCl_2$ is between 9% and 15%, the maximum $kSiCl_2$ is obtained through retention at 700° C. In this way, it is anticipated that a temperature at which the maximum $kSiCl_2$ is obtained is reduced with a decrease in residual rate of $SiCl_2$.

Accordingly, when the temperature of the exhaust gas is controlled so that the maximum rate constant $kSiCl_2$ is obtained in accordance with the residual rate of $SiCl_2$, the residual rate of $SiCl_2$ can be decreased fastest, and by extension, also the generation of a liquid by-product can be decreased. In other words, when the temperature of the exhaust gas is controlled and reduced at a predetermined rate to subject the exhaust gas to continuous thermal history, the diminution speed of the residual rate of $SiCl_2$ can be increased. For this, the temperature of the exhaust gas is controlled as follows: the temperature of the exhaust gas is gradually and continuously reduced from 700° C. so that a continuous temperature reduction curve is obtained. It is also appropriate to adopt a temperature reduction curve on which the temperature of the exhaust gas is appropriately reduced to a plurality of discrete temperatures in a stepwise manner. In addition, the liquid by-product sometimes becomes a solid when the by-product is brought into contact with another substance (e.g., oxygen) in an environment. The liquid or solid by-product is hereinafter sometimes referred to simply as "by-product".

A line of FIG. 15 is obtained by following the maximum $kSiCl_2$'s at the respective residual rates of $SiCl_2$. At this time, the following relational equation is established between $kSiCl_2$ and $C/C_0$.

$$k_{SiCl2} = 6.1 \times (C/C_0)^{0.29} \, s^{-1} \quad (2)$$

Figure 16:
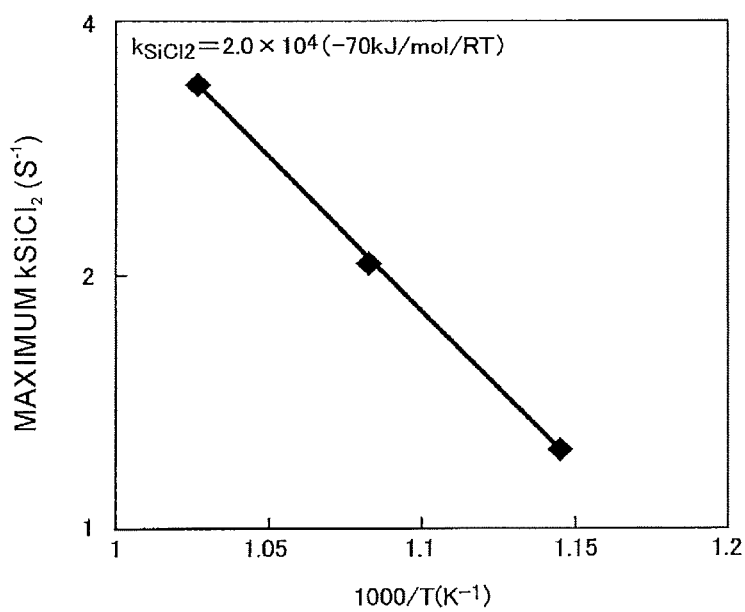
FIG. 16 is a graph for showing temperature dependence of the maximum reaction rate constant $k_{SiCl2}$ for overall elimination shown in FIG. 15.

As is apparent from FIG. 15, the temperature at which the maximum $kSiCl_2$ is obtained varies depending on the residual rate. A plot of the maximum $kSiCl_2$ vs. the reciprocal (1000/T) of the temperature T on the abscissa is shown in FIG. 16. From FIG. 16, the following relational equation can be established between the maximum $kSiCl_2$ and T.

$$k_{SiCl2} = 2.0 \times 10^4 \times \exp(-70 \text{ kJ/mol}/RT) \quad (3)$$

R represents a gas constant of 8.314 J/mol/K.

When the equation (2) is plugged in the equation (1), the following equation is obtained.

$$\frac{dC}{dt} = -6.1 \times \frac{C^{1.29}}{C_0^{0.29}}$$

$$\therefore \frac{dC}{C^{1.29}} = -6.1 \times C_0^{0.29} dt$$

When the both sides are integrated, the following equation is obtained.

$$\left(\frac{C}{C_0}\right)^{-0.29} = 0.29 \times 6.1 \times t + A \quad (A \text{ is a constant.})$$

A represents 1 because $C/C_0$ becomes closer to 1 when t becomes closer to 0, and hence the following equation (4) is obtained.

$$\frac{C}{C_0} = (1.8t+1)^{-\frac{1}{0.29}} \quad (4)$$

When the equation (4) is plugged in the equation (2), and the resultant is compared to the equation (3), the following equation is obtained.

$$k_{SiCl2} = \frac{6.1}{1.8t+1} = 2.0 \times 10^4 \times \exp\left(-\frac{70 \text{ kJ/mol}}{RT}\right) \quad (5)$$

$$\therefore -\frac{70 \text{ kJ/mol}}{RT} = \ln\left(\frac{6.1}{(1.8t+1) \times 2.0 \times 10^4}\right)$$

$$\therefore T = \frac{8.4 \times 10^4}{\ln(1.8t+1) + 8.1} \text{ (K)}$$

The equation (5) represents a temporal change in temperature of the exhaust gas for achieving the maximum $k_{SiCl2}$. When the temperature of the exhaust gas is changed so as to follow the equation (5), it is considered that the residual rate $C/C_0$ of $SiCl_2$ is decreased in accordance with the equation (4). While it is considered that the numerals in the equations (4) and (5) change depending on the conditions of the exhaust gas, when each parameter in the equation (5) is determined by the procedure performed in this section, it is considered that a temperature reduction method optimal to the conditions is found.

(First Design of By-Product Decreasing Reaction with Addition of Gas)

Figure 17:
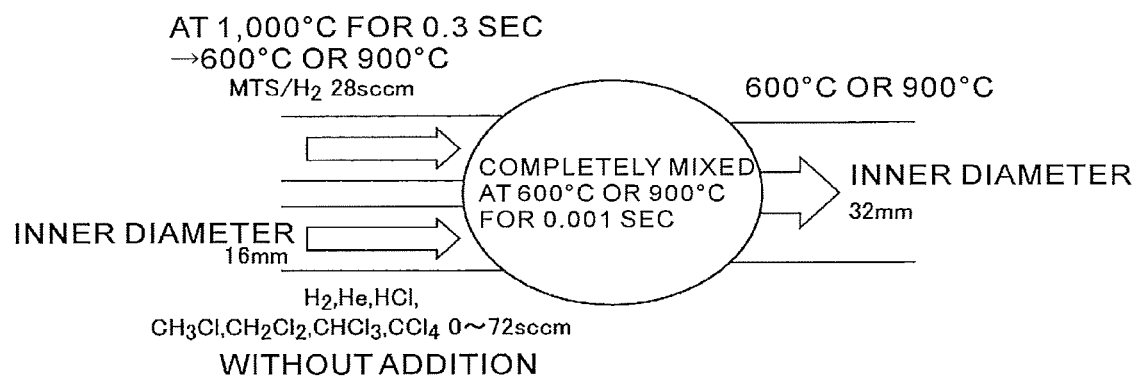
FIG. 17 is a view for illustrating a summary of conditions of reaction calculation at the time of adding a gas.

It was considered whether $SiCl_2$ was decreased by adding another gas to an exhaust gas. He, $H_2$, HCl, and $CH_3Cl$ were considered. In addition, $CH_2Cl_2$, and $CHCl_3$ and $CCl_4$, which were expected to have similar effects, were considered. The conditions of calculation are as illustrated in FIG. 17.

Figure 18:
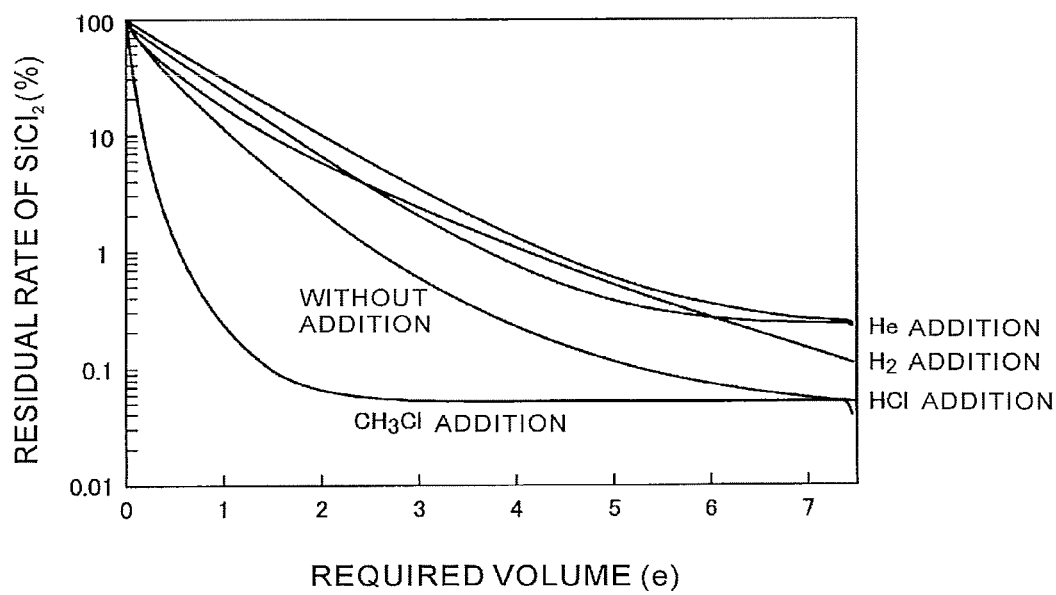
FIG. 18 is a graph for showing a first gas addition effect at 600° C.
Figure 19:
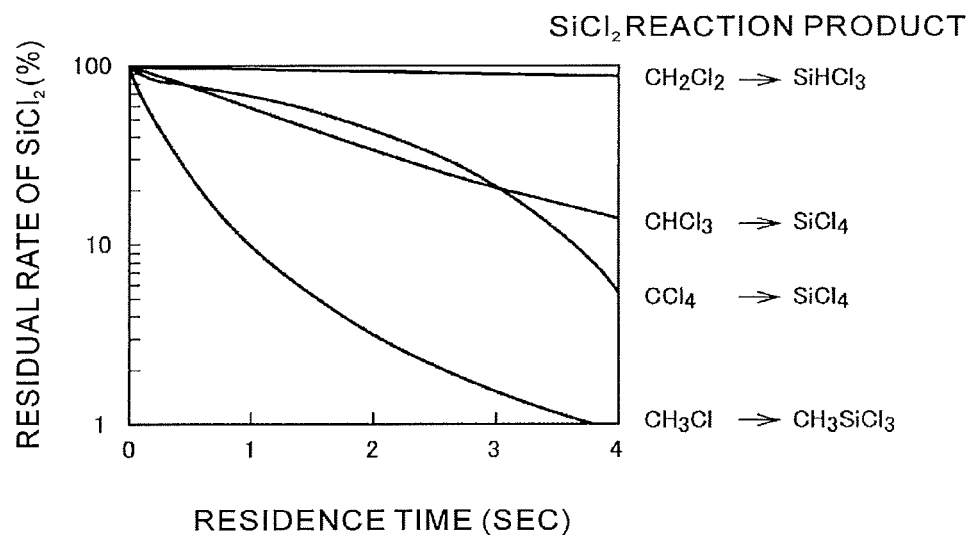
FIG. 19 is a graph for showing the second gas addition effect at 600° C.

The result of comparison of the residual rates of $SiCl_2$ in a 600° C. region described above is shown in each of FIG. 18 and FIG. 19. The comparison between the case of not adding a gas and the cases of adding $H_2$, He, HCl, and $CH_3Cl$ in addition amounts of 72 sccm is shown in FIG. 18. In FIG. 18, the comparison is evaluated with a residence timexan actual flow rate on the abscissa. The comparison among the cases of adding $CH_3Cl$, $CH_2Cl_2$, $CHCl_3$, and $CCl_4$ in addition amounts of 22 sccm is shown in FIG. 19. In FIG. 19, the comparison is performed with a residence time on the abscissa because all the cases have the same flow rate. In each of FIG. 18 and FIG. 19, the result is that the highest diminution speed of $SiCl_2$ is obtained in the case of adding $CH_3Cl$. He, $H_2$, and HCl less contribute to a reaction, and contrarily increase a total flow rate, resulting in the necessity for an additional volume. The same applies to $CH_2Cl_2$, but it is anticipated that $CHCl_3$, $CCl_4$, and the like contribute to the reaction.

A main reaction of $SiCl_2$ at the time of adding $CH_3Cl$ was analyzed, and the result of calculation was that $SiCl_2$ was decreased through the following radical chain reactions.

$$SiCl_2 + CH_3SiCl_2 \quad (R1)$$

$$CH_3SiCl_2 + CH_3Cl \rightarrow CH_3SiCl_3 + CH_3 \quad (R2)$$

It is considered that $SiCl_2$ can be converted into $CH_3SiCl_3$ in the case of adding $CH_3Cl$ in the 600° C. region. While a CVI process using $MTS/H_2$ is said to have a low raw material yield, there is a possibility that a process having a somewhat higher yield can be obtained by allowing $CH_3Cl$ and $SiCl_2$ to react with each other to return $SiCl_2$ to $CH_3SiCl_3$ and collecting $CH_3SiCl_3$. The same applies to the case of adding $CH_2Cl_2$.

Figure 20:
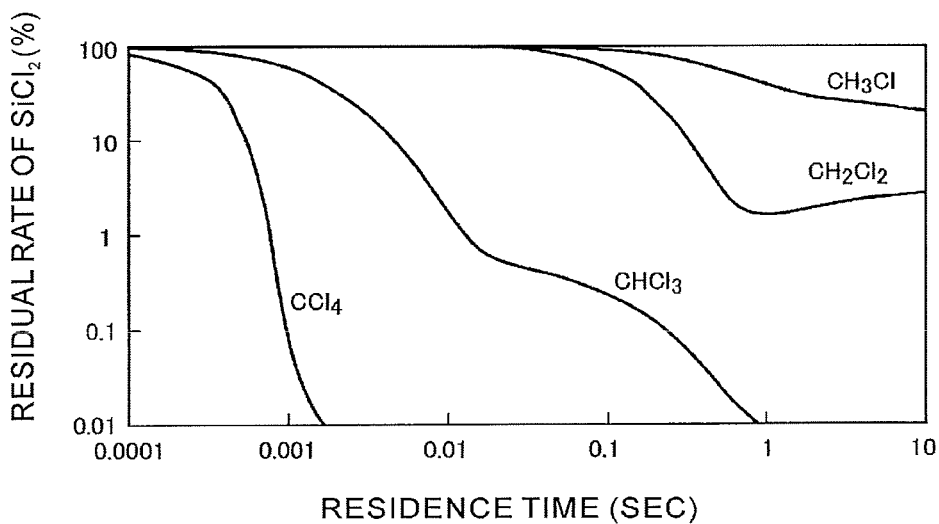
FIG. 20 is a graph for showing a gas addition effect at 900° C.

Next, the result of calculation in the case of adding a $CH_{4-n}Cl_n$ gas at 900° C. is shown in FIG. 20. At this time, when n is increased by one, a reaction rate is increased by from 10 times or more to 100 times or more. At this time, $SiCl_2$ is decreased mainly by the following reaction.

$$CH_{4-n}Cl_n \rightarrow CH_{4-n}Cl_{n-1} + Cl \quad (R3)$$

$$SiCl_2 + 2Cl \rightarrow SiCl_3 + Cl \rightarrow SiCl_4 \quad (R4)$$

It is considered that a rate at which $CH_{4-n}Cl_n$ releases a Cl radical bears a proportional relationship to a rate at which $SiCl_2$ is decreased.

Figure 21:
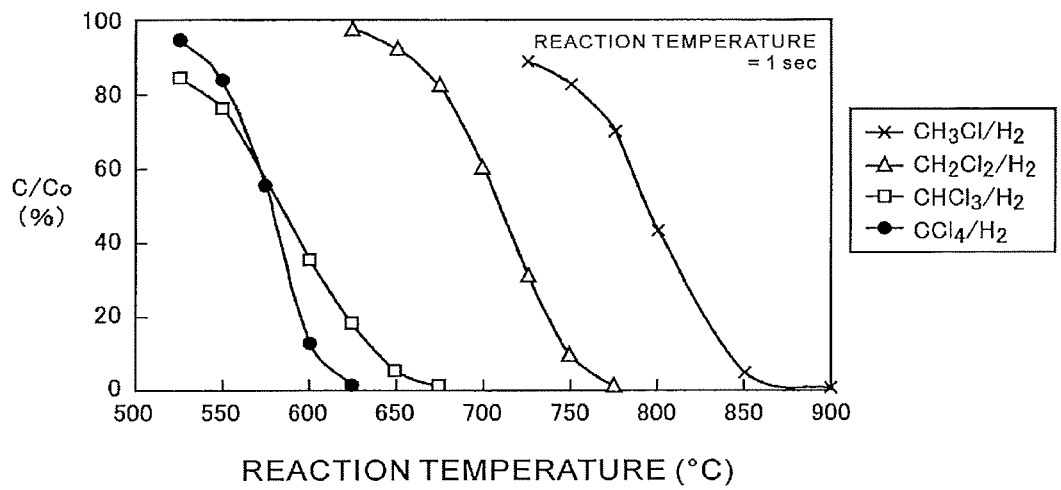
FIG. 21 is a graph for showing a residual rate of $CH_{4-n}Cl_n$ after a $CH_{4-n}Cl_n/H_2$ reaction for 1 second at various temperatures.

As shown in FIG. 21, according to Yang Soo Won (see Non Patent Literature 7), the order of stability of those chloromethanes is as described below.

$$CH_3Cl > CH_2Cl_2 > CHCl_3 > = CCl_4$$

It is considered that the above-mentioned result of calculation is obtained because $CCl_4$, which is the most unstable, releases a radial fastest.

Figure 22:
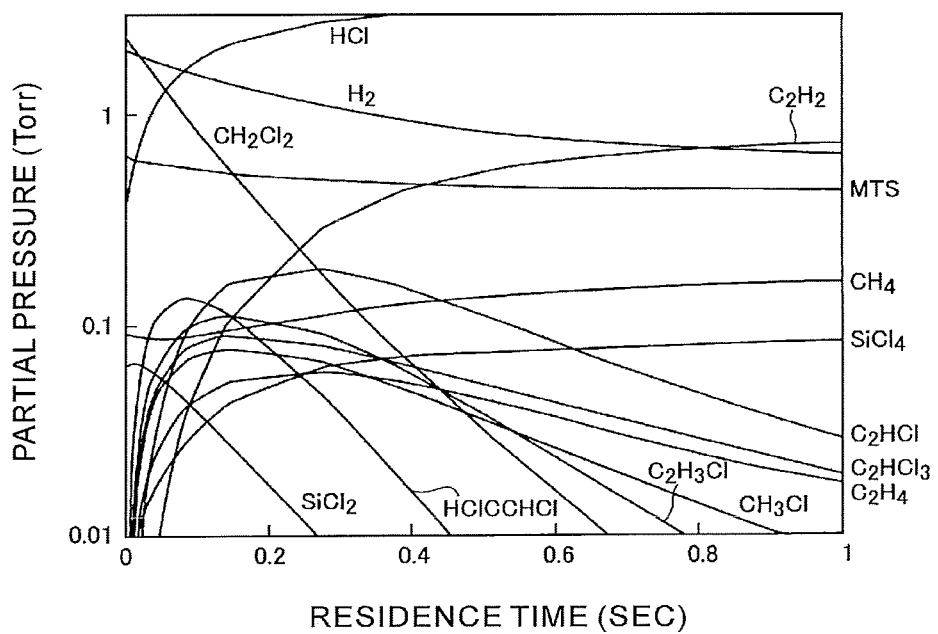
FIG. 22 is a graph for showing a change in partial pressure of gas species at the time of adding $CH_2Cl_2$ and retaining at 900° C.

At the time of adding $CH_2Cl_2$, a change in partial pressure of gas species including other gases is shown in FIG. 22. The partial pressure of $CH_2Cl_2$ is reduced to 1% or less of the original partial pressure in about 0.6 second, and the partial pressure of $C_2H_2$ is increased accordingly. It is anticipated that redundant Cl to be generated at this time reacts with $SiCl_2$ or $H_2$ to generate $SiCl_4$ or HCl.

Consideration was made on refinement of optimal conditions in the case of $CH_3Cl$, which has a possibility of enabling recycling of MTS through a reaction at 600° C. First, with regard to a $CH_3Cl$ loading temperature, it is considered that $CH_3Cl$ is desirably added when the temperature of the exhaust gas is about 600° C. because $CH_3Cl$ is thermally decomposed at 750° C. or more, though $CH_3Cl$ is stable as compared to other $CH_{4-n}Cl_n$'s as shown in FIG. 21.

Figure 23:
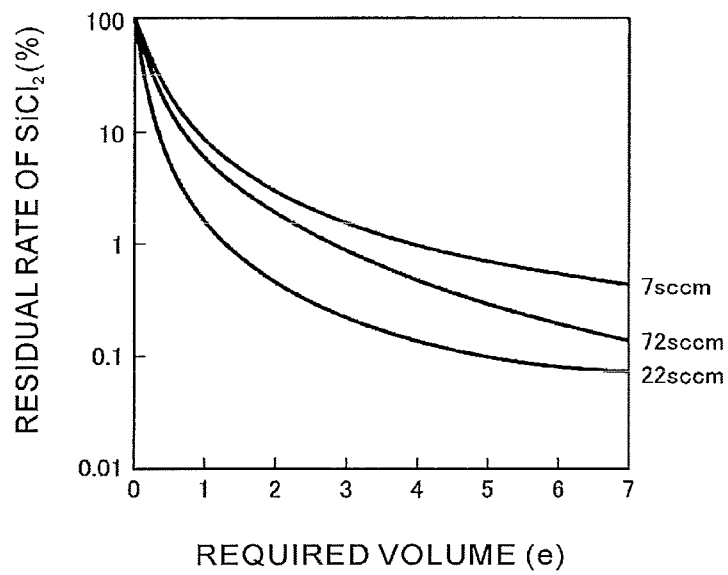
FIG. 23 is a graph for consideration of an optimal addition amount of $CH_3Cl$.

The result of calculation at the time of changing the flow rate of $CH_3Cl$ is shown in FIG. 23. When the flow rate is increased from 7 sccm to 22 sccm, a diminution speed is increased according to an increase in partial pressure of $CH_3Cl$, and a gas volume required for a reaction is decreased. However, when the flow rate is increased from 22 sccm to 72 sccm, the gas volume required for the reaction is increased contrarily owing to the increase in the flow rate. This indicates the existence of a flow rate optimal to the original exhaust gas, and it is anticipated that the optimal flow rate is probably comparable to the flow rate of the exhaust gas.

Figure 24:
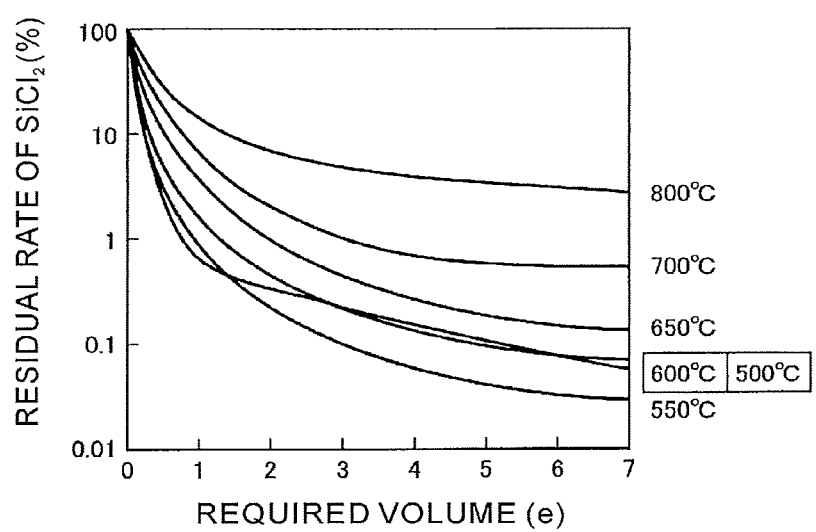
FIG. 24 is a graph for consideration of an optimal temperature at the time of adding $CH_3Cl$.

The result at the time of changing a temperature while fixing the flow rate of $CH_3Cl$ to 22 sccm is shown in FIG. 24. A reaction rate is generally increased with an increase in temperature, and hence it is anticipated that the diminution speed of $SiCl_2$ is increased with an increase in temperature. However, in the result of calculation, a decomposition speed is decreased with an increase in temperature.

A possible cause for this is that, as shown by the reactions (R1) and (R2), reactions between $CH_3Cl$ and $SiCl_2$ are chain reactions through a $CH_3$ radical. Main reactions through a $CH_3$ radical at 600° C. and 700° C. are illustrated in FIG.

Figure 25A:
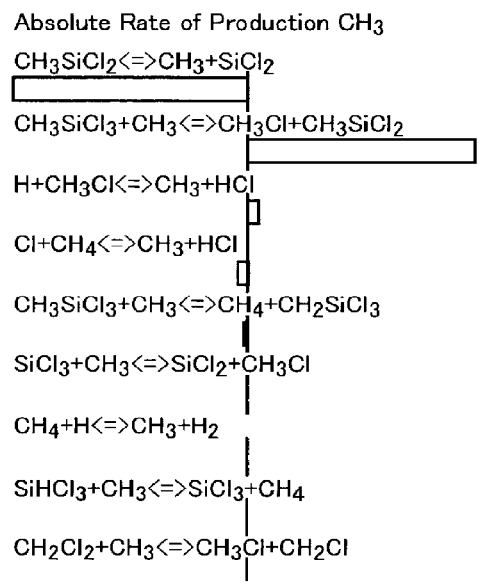
FIG. 25A is a first view for illustrating a main reaction of a $CH_3$ radical at various temperatures.
Figure 25B:
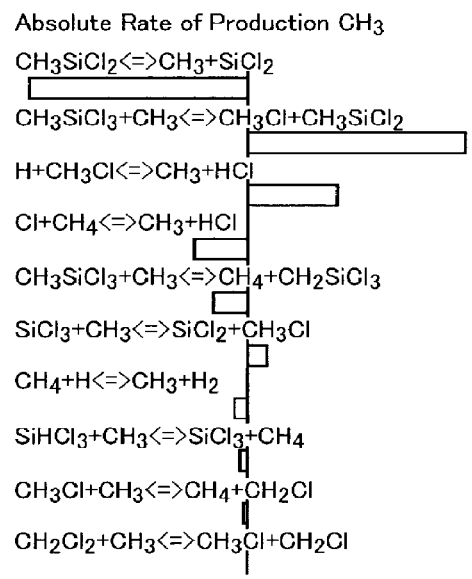
FIG. 25B is a second view for illustrating the main reaction of the $CH_3$ radical at various temperatures.

25A and FIG. 25B, respectively. A leftward bar graph represents consumption of $CH_3$ through the reaction, and a rightward bar graph represents generation of $CH_3$ through the reaction. As seen from FIG. 25A, a $CH_3$ radical reacts almost exclusively with $SiCl_2$ at 600° C. However, the $CH_3$ radical reacts with HCl, $H_2$, $CH_3SiCl_3$, and the like at 700° C. A larger amount of $CH_3$ is consumed by reactions with other molecules at a higher temperature, and $CH_3$ cannot contribute to the reaction with $SiCl_2$. Accordingly, it is considered that a mixed gas of the exhaust gas and $CH_3Cl$ is desirably retained at about 500° C. or more and about 600° C. or less.

(Summary)

Possible methods of decreasing the generation of the by-product based on the above-mentioned results, and expected advantages and disadvantages thereof are as described below.

1) In the case of not adding a gas, a temperature is retained at about 600° C. or reduced gradually from about 700° C. This method has the following advantage as compared to other methods: the method is free of cost of an additive gas because there is no need to consider the addition of the gas. However, a reaction rate is lower than those in other cases of adding the gas, and hence a reforming furnace configured to perform treatment at from 600° C. to 700° C. is arranged (see FIG. 3).

2) In the case of adding $CH_2Cl_2$, $CHCl_3$, or $CCl_4$, a reaction is completed in from 1/1000 second to 0.1 second, and hence it may be considered that the reaction is desirably performed with residual heat of a reaction furnace by arranging an additive gas introduction port at an outlet of the reaction furnace. It is considered that $SiCl_2$ can be sufficiently depleted with the residual heat for a time period in the course from the additive gas introduction port to an exhaust port, and hence it is anticipated that lower apparatus cost and lower power consumption are obtained as compared to the case of further arranging a reforming furnace configured to retain a temperature at an outside of the reaction furnace. However, this method involves cost of an additive gas, unlike the case of not adding a gas. In addition, as shown in FIG. 20, soot resulting from $C_2H_2$ and a carbon chloride compound, such as $C_xH_yCl_z$, e.g., a vinyl chloride monomer ($C_2H_3Cl$) are generated in accordance with the loading amount of $CH_{4-n}Cl_n$, and occurrence of a significantly chaotic reaction is anticipated. It is anticipated that a load on an exhaust gas treatment device is increased accordingly.

3) In the case of adding $CH_3Cl$ and retaining a temperature at from 500° C. to 600° C. in a reforming furnace, treatment can be completed in a short time period as compared to the case of not adding a gas. Besides, $SiCl_2$ is converted into MTS. In addition, from FIG. 22, it is considered that $CH_3Cl$ is not decomposed at 600° C. or less and nearly 99% thereof remains unlike the situation of the item 2), and hence it is considered that little soot is accumulated.

In this embodiment, the method of decreasing the generation of the by-product has been considered with a focus on $SiCl_2$. The thermodynamic constant and reaction rate constant of $SiCl_2$ were calculated based on quantum chemical calculation. As a result, it was presumed that the by-product was generated mainly at 500° C. or less, and the three examples of the method of decreasing the generation of $SiCl_2$ at from 500° C. to 600° C. or more were given.

In this embodiment, calculation was performed on a $(SiCl_2)_n$ generation reaction mechanism in which n is up to 3, and hence actual $(SiCl_2)_n$ generation behavior may differ from the result of the calculation. Therefore, precision may be further increased so that a method of decreasing the generation of the by-product using conditions at a boundary at which the by-product is barely generated is predicted. For example, a reaction mechanism in which n is 4 or more may be constructed.

Figure 26:
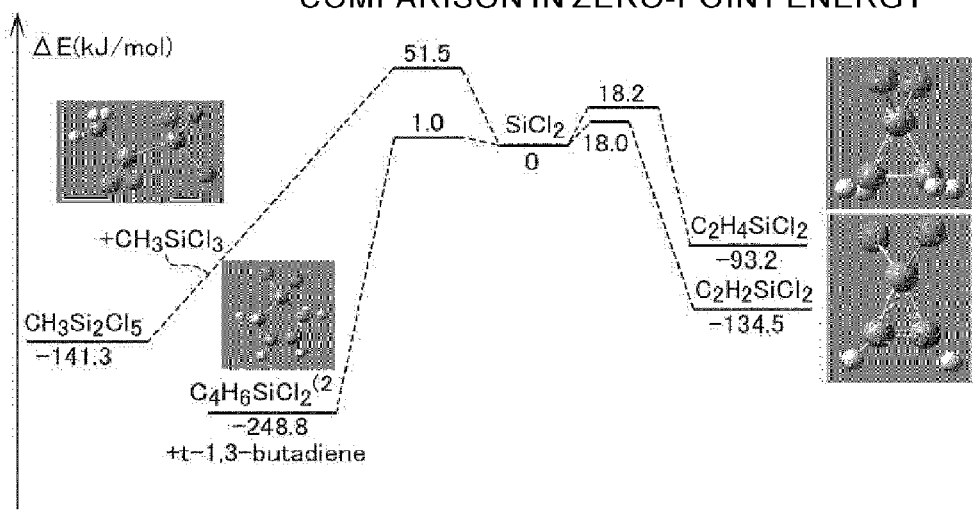
FIG. 26 is a view for illustrating a reaction energy between $SiCl_2$ and a C-based molecule.
Figure 27A:
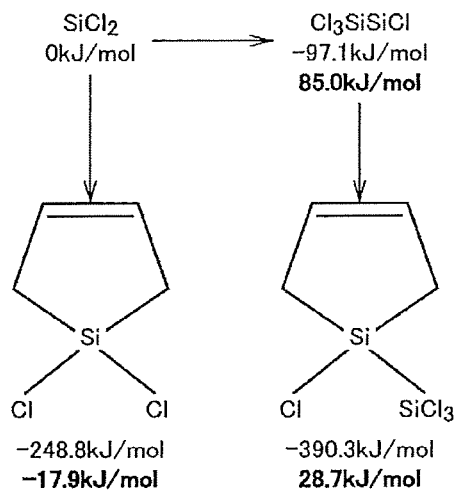
FIG. 27A is a first view for illustrating a reaction energy between $SiCl_2$ and a diene.
Figure 27B:
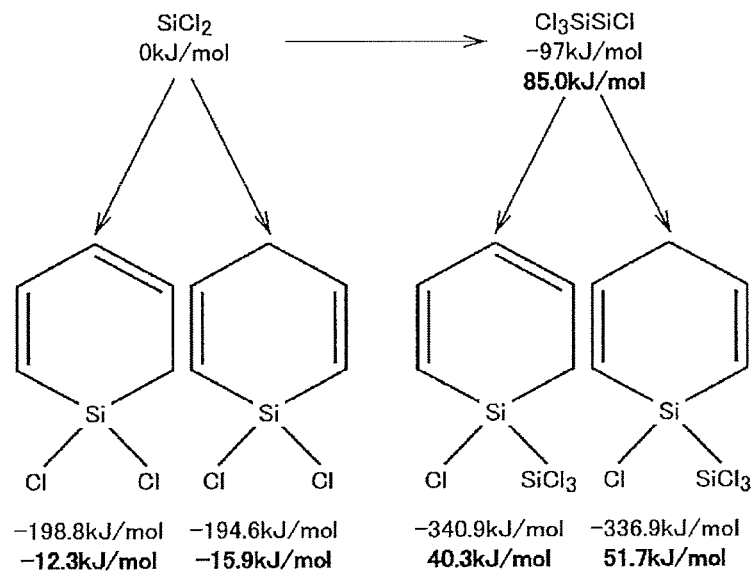
FIG. 27B is a second view for illustrating the reaction energy between $SiCl_2$ and the diene.

In addition, a by-product in which Si—C is mixed is also considered. The reaction energies between $SiCl_2$ and C-based molecules are calculated, and the results thereof are shown in FIG. 26, FIG. 27A, and FIG. 27B. In each of FIG. 27A and FIG. 27B, a zero-point energy (bold characters) and a free energy (KJ/mol) at 1,300 K are compared. $SiCl_2$ is decreased in energy and stabilized through any reaction with a C-based chemical species (MTS, $C_2H_4$, $C_2H_2$, or t-1,3-$C_4H_6$), and hence has a possibility of reacting with these molecules. Of those, reactions between dienes and $SiCl_2$ have been reported also in a previous literature (see Non Patent Literature 8), and it is anticipated that $SiCl_2$ reacts with dienes significantly easily because of low reaction barriers.

Figure 28A:
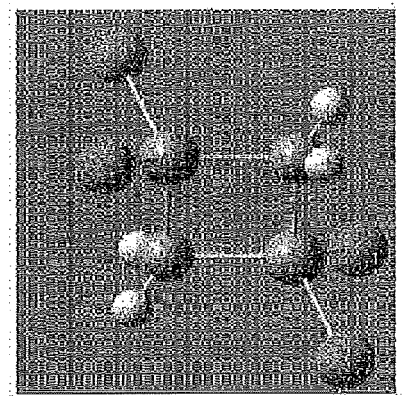
FIG. 28A is a first view for illustrating a cyclic $(CH_2SiCl_2)_n$ structure.
Figure 28B:
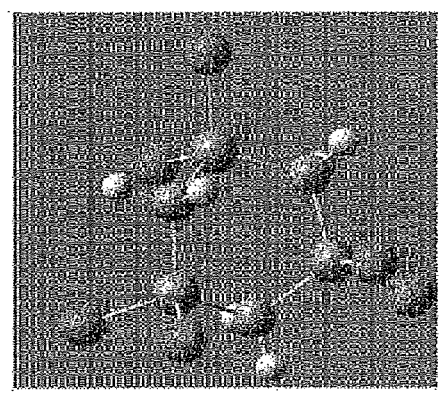
FIG. 28B is a second view for illustrating the cyclic $(CH_2SiCl_2)_n$ structure.
Figure 28C:
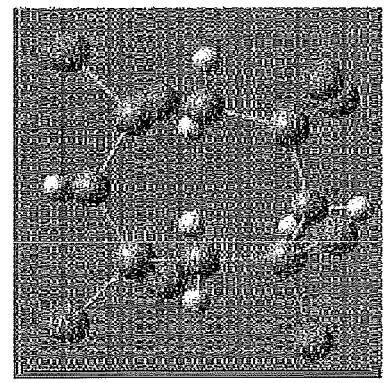
FIG. 28C is a third view for illustrating the cyclic $(CH_2SiCl_2)_n$ structure.
Figure 29A:
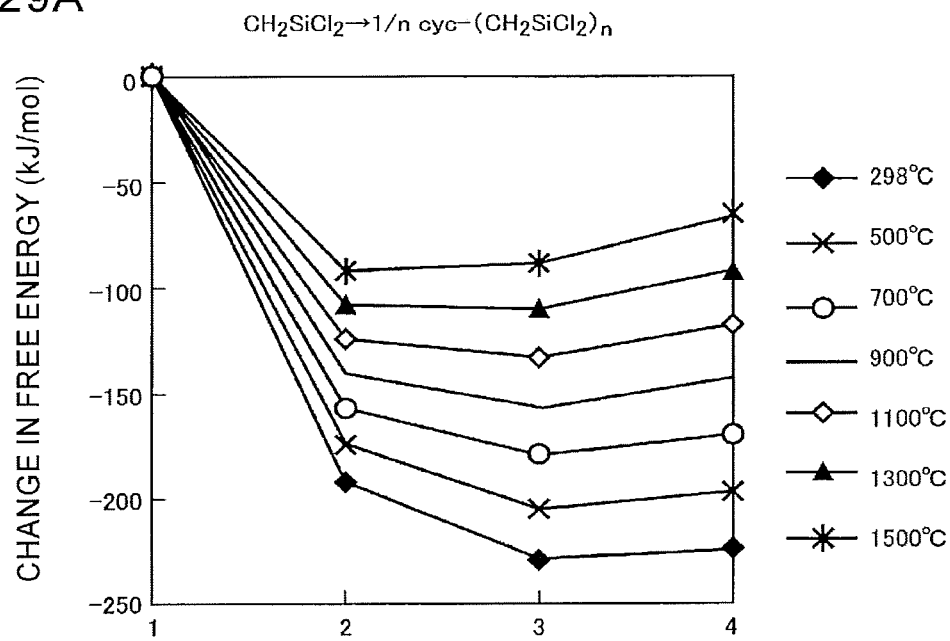
FIG. 29A is a first graph for showing a change in free energy of cyclic $(CH_2SiCl_2)_n$ at various temperatures (K).
Figure 29B:
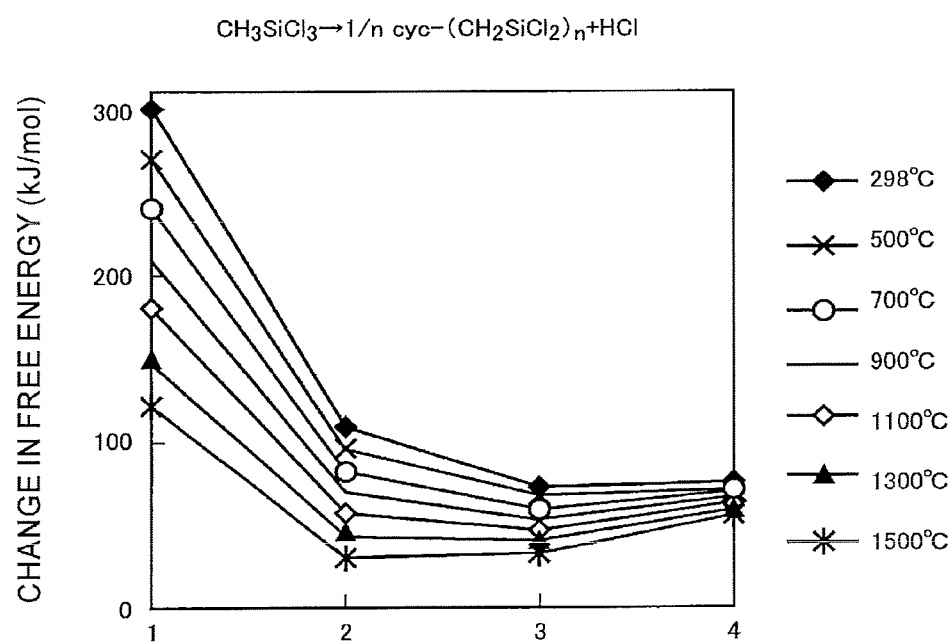
FIG. 29B is a second graph for showing a change in free energy of cyclic $(CH_2SiCl_2)_n$ at various temperatures (K).

It has been reported that a large number of Si—C bonds are present in the by-product, and hence a cyclic $(CH_2SiCl_2)_n$ structure and a change in energy are considered. Structures in which n is 2, 3, and 4 are illustrated in FIG. 28A, FIG. 28B, and FIG. 28C, respectively. With reference to a change in energy shown in each of FIG. 29A and FIG. 29B, the energy of cyclic $(CH_2SiCl_2)_n$ is decreased with an increase in polymerization degree, and it is anticipated that cyclic $(CH_2SiCl_2)_n$ is most stable when n is 3. A reaction mechanism in which such molecule is generated in the by-product in which Si—C is mixed may be constructed.

Example 1

As Example 1 to which this embodiment is applied, an experiment in the case of arranging a reforming furnace configured to retain a gas discharged from a reaction furnace at a predetermined temperature was performed.

Figure 30:
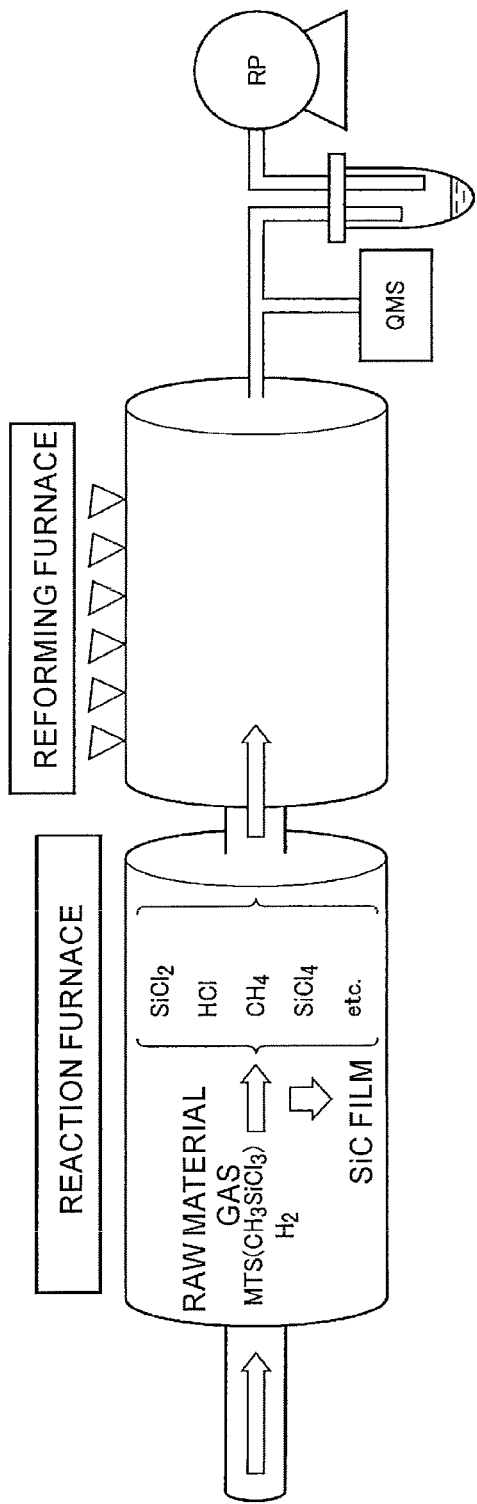
FIG. 30 is a schematic view of an exhaust gas reforming experimental apparatus.

The configuration of the experiment is illustrated in FIG. 30. In a stage subsequent to the reaction furnace, the reforming furnace having the same volume is arranged. The reforming furnace was of a hot wall type. In a stage subsequent to the reforming furnace, a quadrupole mass spectrometer (QMS) for gas analysis, a cold trap configured to collect a by-product at room temperature, and a vacuum pump by means of a rotary pump (RP) were arranged. With such configuration, the experiment was performed by changing the temperature of the reforming furnace from 300° C. to 950° C., and a temperature of the reforming furnace at which the by-product showed the largest decrease was considered.

A raw material gas to be used in a test had a flow rate ratio of MTS:$H_2$:He=1:1:0.05. A reaction furnace formed of a quartz tube was used. The reaction furnace had dimensions measuring 60 mm in inner diameter and 2,100 mm in length, and its heating region is separated into six zones (350 mm per zone). Three zones on an upstream side were used as the reaction furnace, and three zones on a downstream side were used as the reforming furnace.

Figure 31:
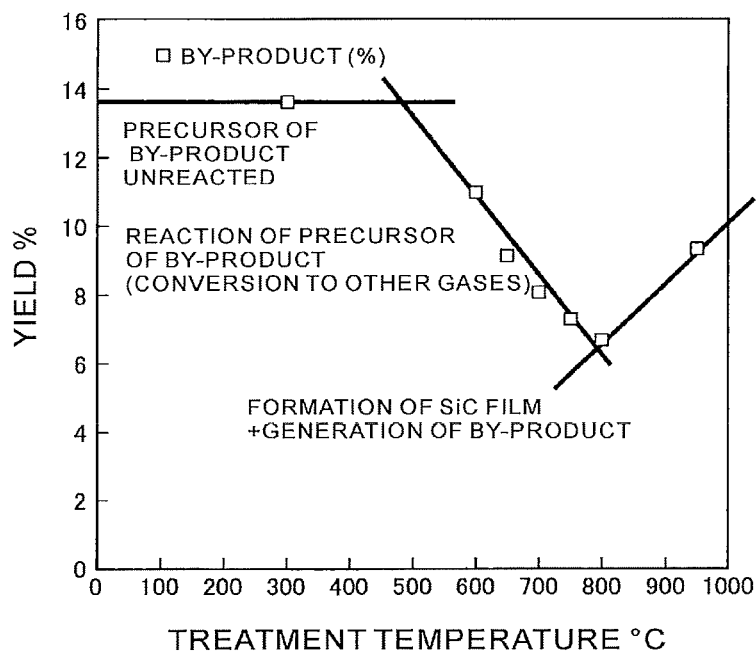
FIG. 31 is a graph for showing a relationship between an amount of a by-product to be collected and a treatment temperature.

A relationship between the by-product collected and a treatment temperature in the reforming furnace is shown in FIG. 31. The yield of the by-product when the amount of substance (mole number) of MTS to be supplied is defined as 100% is shown. The case of a treatment temperature in the reforming furnace of 300° C., in which the raw material gas was not decomposed and no by-product was generated, was regarded as "without treatment". In addition, a value compared to the amount of the by-product at this time was used as a decrease amount of the by-product at a treatment temperature of from 600° C. to 800° C.

As seen from FIG. 31, when the treatment temperature in the reforming furnace was from 600° C. to 800° C., the result was that the by-product was decreased with an increase in treatment temperature. At 950° C., SiC is generated, and hence the amount of substance to be used for formation of a SiC film is large as compared to the cases at other temperatures. Therefore, the amount of the by-product is smaller than that in the case of 300° C. regarded as "without treatment". For example, also in a range of from 500° C. to 950° C., the by-product is observed to be decreased.

In each of the case of not arranging a reforming furnace and the case of arranging a reforming furnace configured to retain a temperature at 600° C., a liquid obtained by collecting an exhaust gas other than the by-product at low temperature was subjected to gas chromatography mass spectroscopy (GC/MS) in a stage subsequent to the reforming furnace, and the result thereof is shown in Table 1. A detected gas was represented by the symbol "o". The number of kinds of gases was increased in the case of arranging the reforming furnace at 600° C., and hence it was confirmed that $SiCl_2$ serving as a precursor of the by-product was converted into other gases.

TABLE 1

| Component name | Without reforming furnace | With reforming furnace 600° C. |
|---|---|---|
| HCl | o | o |
| $SiCl_4$ | o | o |
| $CH_3SiCl_3$ (raw material) | o | o |
| $SiHCl_3$ | o | o |
| $C_2H_3SiCl_3$ | o | o |
| $C_2H_5SiCl_3$ | o | o |
| $C_2H_5Cl$ |  | o |
| $CH_3SiHCl_2$ |  | o |
| $C_2H_3SiHCl_2$ |  | o |
| $Si_2Cl_6$ | o |  |

Figure 32:
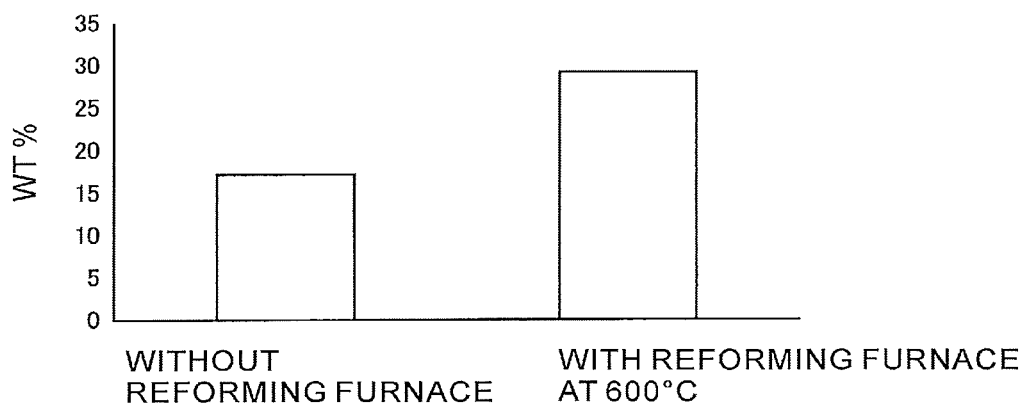
FIG. 32 is a graph for showing a relationship between the presence or absence of a reforming furnace and a content of MTS.

In addition, a content concentration of MTS in the collected liquid was shown in FIG. 32. The concentration of MTS was increased by 1.7 times in the case of arranging the reforming furnace at 600° C., and hence it was confirmed that $SiCl_2$ was converted into MTS.

The residence time of a MTS gas in the reforming furnace is about 1.5 seconds. When the reforming furnace is set so as to have a temperature gradient in temperature regions of the three zones from the upstream side (800° C., 700° C., and 600° C. from the upstream side), the residence time of the MTS gas in each zone is about 0.5 second. The yield of the by-product with respect to the loading amount of MTS in the case of the temperature gradient was 7.2%.

Consideration has been made on decrease of the generation of the by-product by arranging the reforming furnace in a stage subsequent to the reaction furnace. The generation of the by-product was decreased when the temperature of the reforming furnace fell within a predetermined range. In addition, it was confirmed that the precursor of the by-product was converted into MTS.

Example 2

As Example 2 to which this embodiment is applied, an experiment was performed on a by-product difference in the case in which a reforming furnace has high temperature.

Figure 33:
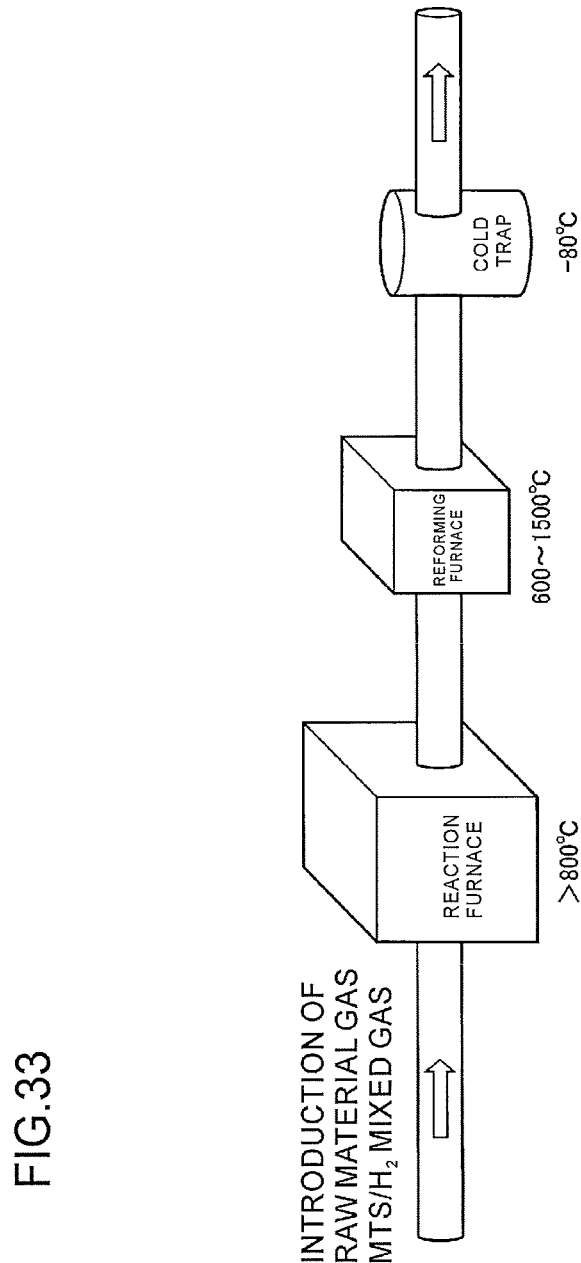
FIG. 33 is a view for illustrating a configuration of an experiment for a by-product difference depending on a temperature of a reforming furnace.

The configuration of the experiment is illustrated in FIG. 33. The reforming furnace is arranged in a stage subsequent to a reaction furnace. A $MTS/H_2$ mixed gas is supplied to the reaction furnace. The reforming furnace is retained at from 600° C. to 1,500° C. An effect was analyzed by arranging a cold trap retained at −80° C. in a stage subsequent to the reforming furnace.

In the cold trap, an exhaust gas component discharged from the reforming furnace was condensed and was then returned to room temperature, and a gasified component (raw material gas or the like) was evaporated. A residue thus obtained after the evaporation of the gasified component was evaluated as a liquid by-product having the possibility of adhering to a pipe at room temperature.

Figure 34:
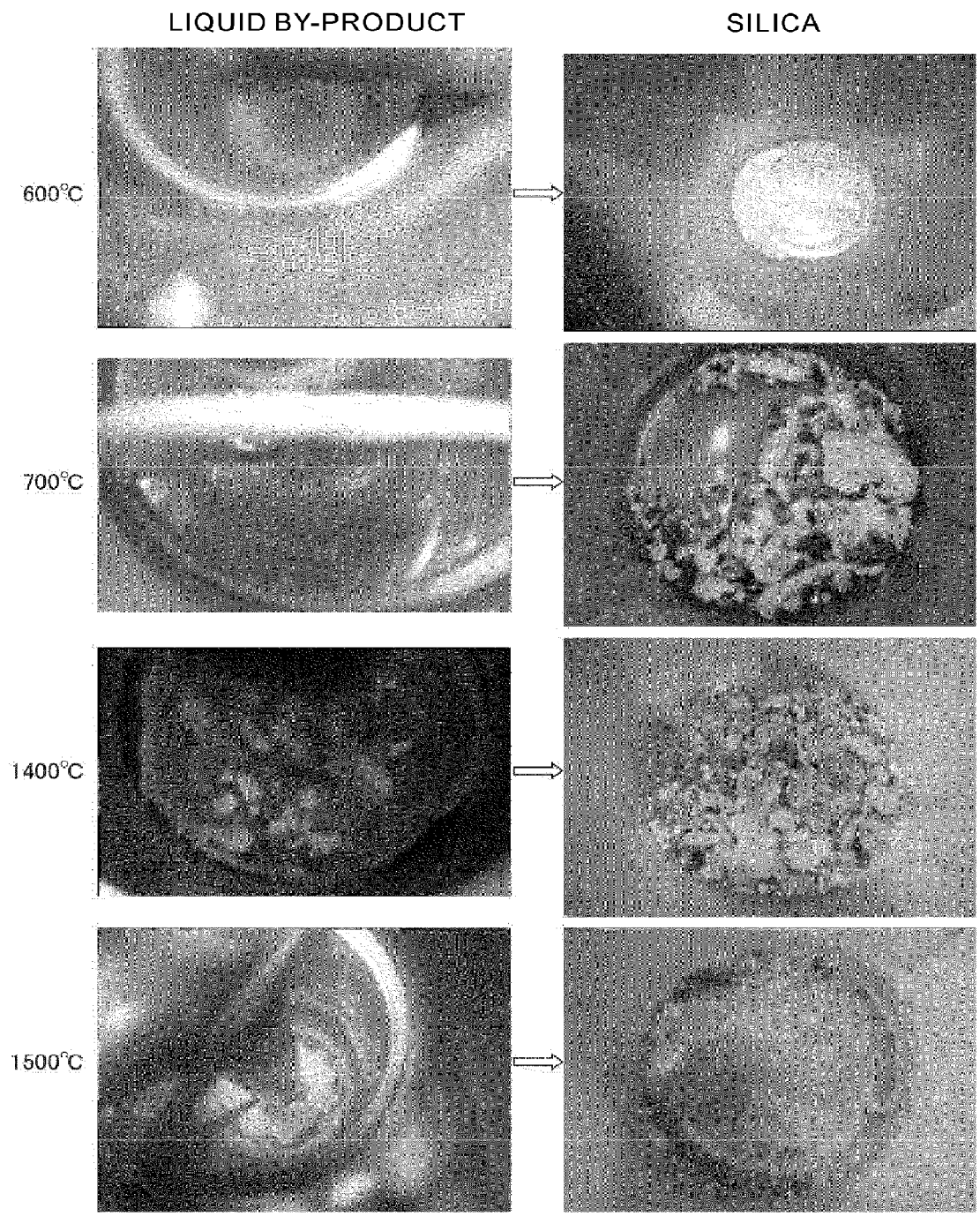
FIG. 34 includes appearance photographs of a liquid by-product and silica.

An appearance photograph of the liquid by-product obtained under the temperature conditions of the reforming furnace and an appearance photograph of the by-product stabilized into silica through hydrolysis are shown in FIG. 34. The measurement result of the weight of silica after the stabilization, and a raw material loading ratio obtained by dividing a mole number of silica by a total mole number of MTS loaded in a CVI step are shown in Table 2.

TABLE 2

| Temperature of reforming furnace (° C.) | Weight of silica (g) | Raw material loading ratio (%) |
|---|---|---|
| None | (15) | (5) |
| 600 | (3) | (1) |
| 750 | 30 | 10 |
| 1,400 | 26 | 9 |
| 1,500 | 8 | 3 |

According to Table 2, under the conditions in which the temperature of the reforming furnace was 1,500° C., the amount of the liquid by-product was able to be decreased to half as compared to the case of not arranging the reforming furnace. Meanwhile, under the conditions in which the temperature of the reforming furnace was 750° C. or 1,400° C., the amount of the liquid by-product was doubled, and an adverse effect was obtained.

Figure 35:
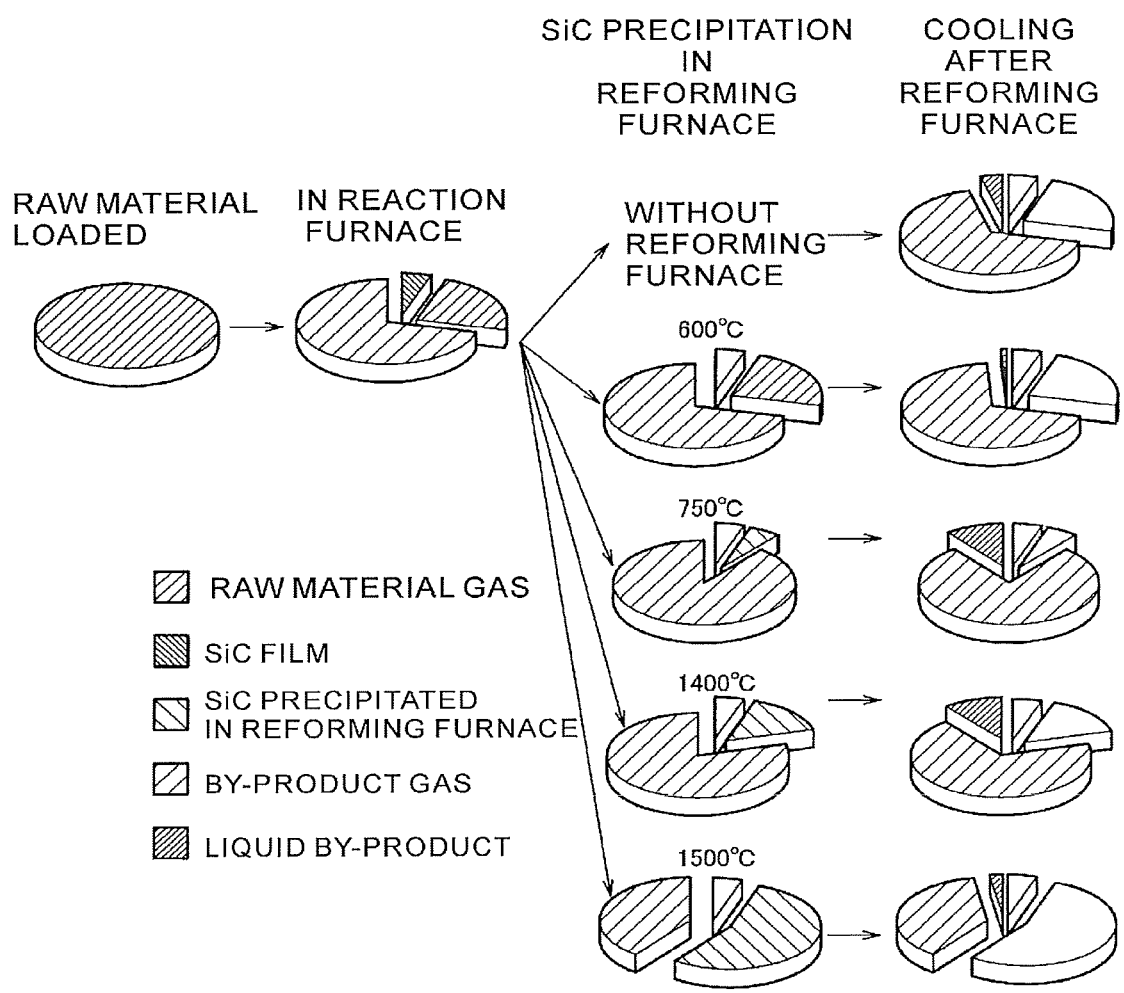
FIG. 35 includes graphs for showing a by-product difference depending on the temperature of the reforming furnace.

A possible cause for this is as described below. Unreacted MTS discharged from the reaction furnace is decomposed in the reforming furnace, and is precipitated as SiC. However, there is a temperature region in which a ratio of the unreacted MTS decomposed as $SiCl_2$ serving as a precursor of the by-product exceeds a ratio of the unreacted MTS precipitated as SiC. It is considered that the temperatures of 750° C. and 1,400° C. are included in the region, and the temperature of 1,500° C. having a high reaction rate for SiC formation is beyond the region. A by-product difference depending on the temperature of the reforming furnace based on a model assuming such a mechanism is illustrated in FIG. 35. Therefore, as a method of consuming $SiCl_2$ serving as a precursor of the by-product, also a method involving precipitating $SiCl_2$ as a SiC-form solid substance at 1,500° C. or more is one effective method.

It is considered that, when the reforming furnace has a temperature falling within a predetermined range including 750° C. and 1,400° C., the ratio of the unreacted MTS decomposed as $SiCl_2$ serving as a precursor of the by-product exceeds the ratio of the unreacted MTS decomposed and precipitated as SiC in the reforming furnace, which contributes to an increase in amount of the liquid by-product.

Example 3

As Example 3 to which this embodiment is applied, an experiment in the case of adding $N_2$, HCl, or $CH_2Cl_2$ and performing treatment in a reforming furnace was performed.

Figure 36:
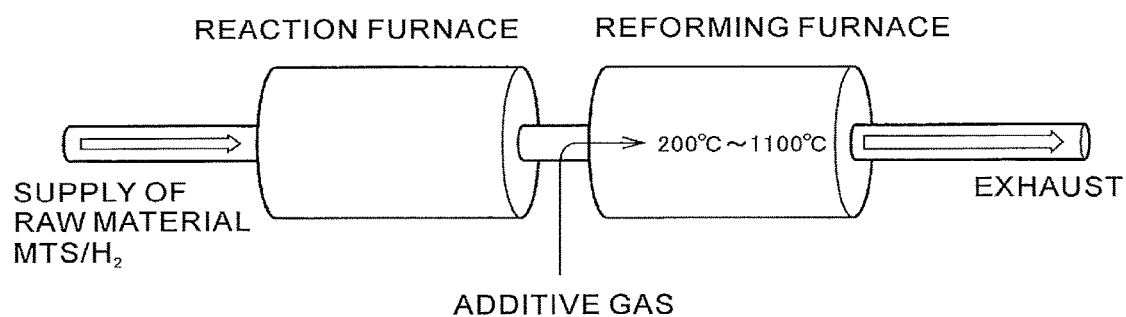
FIG. 36 is a conceptual view of exhaust gas treatment with an additive gas.

FIG. 36 is a conceptual view of exhaust gas treatment with an additive gas. The reforming furnace was arranged in a stage subsequent to a reaction furnace, and the additive gas was supplied from an inlet of the reforming furnace. The additive gas is preferably a chlorine-based gas containing chlorine. In the reforming furnace, a mixed gas of a gas discharged from the reaction furnace and the additive gas is subjected to treatment at a predetermined temperature of from 200° C. to 1,100° C. The additive gas is not limited to $CH_2Cl_2$, $CHCl_3$, $CCl_4$, and $CH_3Cl$ described above, and may include $N_2$, $H_2$, HCl, an alcohol (ethanol, acetone, or methanol), and water vapor. The alcohol or water vapor is known to vigorously react with a by-product at room temperature, and hence may be added at room temperature. In addition, the additive gas may be added so that the amount of substance of the additive gas is larger than the amount of substance of a liquid or solid by-product.

Figure 37:
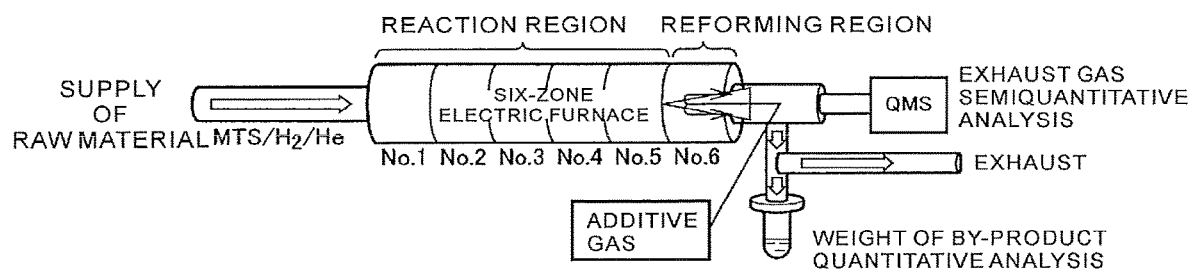
FIG. 37 is a view for illustrating a configuration of an experiment.

The configuration of the experiment is illustrated in FIG. 37. An electric furnace used in this experiment is a six-zone electric furnace in which six electric furnaces are continuously connected to one another. A temperature can be set in each zone. Each electric furnace has a length of 350 mm and an inner diameter of φ60 mm. Of those zones, the first five zones served as a reaction region corresponding to the reaction furnace, and the last one zone served as a reforming region corresponding to the reforming furnace.

The electric furnace has a reaction tube which is formed of a quartz circular tube and is of a hot wall type in which the entirety of the tube is heated. A $MTS/H_2/He$ mixed gas was used as a raw material. He is a standard gas for standardization of gas analysis based on a quadrupole mass spectrometer (QMS). QMS was mounted to an exhaust pipe in the vicinity of the reaction tube. The gas analysis based on QMS was performed for determination of the residual rate of a MTS gas and for qualitative analysis of gases to be generated through thermal decomposition of the $MTS/H_2$ mixed gas.

The by-product is collected with a trap pipe mounted to the exhaust pipe, and based on the weight thereof, the generation rate of the by-product is discussed. The additive gas was added from the middle of a No. 6 electric furnace (near the center of the circular tube of the reaction furnace, and at a distance of 175 mm from an edge of the No. 6 electric furnace), which is on the most downstream side of the six zones of FIG. 37. The introduction direction of the additive gas is an upstream direction. In Example 3, an increase or decrease of the by-product depending on the additive gas was to be evaluated, and hence a mass balance was determined for gases and a film to be generated from MTS serving as a raw material through a reaction. The mass balance was determined on the following assumption when the amount of substance (mole number) of MTS ($CH_3SiCl_3$) to be supplied was defined as 100%.

1) The amount of a SiC film to be formed was experimentally determined.

The amount of a SiC film to be formed was a total value of the amounts of substance of SiC films to be formed on the quartz tube, a Si substrate, and felt, but for simplicity, the yield of the SiC film in each case was assumed to be the same as a single experimental value (12%).

2) The residual rate of MTS was experimentally determined.

In the QMS gas analysis, a QMS signal intensity at room temperature was assumed to be 100%, and the residual rate of MTS was calculated based on a ratio between the QMS signal intensity at room temperature and a signal intensity at the time of thermal decomposition at high temperature.

3) The amount of the by-product was experimentally determined.

A by-product collecting pipe mounted to the exhaust pipe was used to quantitatively analyze the amount of substance of the by-product based on the weight of collected matter.

At the time of calculation, the amount of substance of the by-product was determined on the assumption that the by-product was $SiCl_2$ (molecular weight: 98.5 g/mol).

4) The amounts of substance of other gasses were calculated as a residue obtained by subtracting the above-mentioned items 1), 2), and 3) from 100.

The gas species generated were also evaluated through qualitative evaluation based on QMS.

In Example 3, four experimental conditions of "without an additive gas", "$N_2$ addition", "HCl addition", and "$CH_2Cl_2$ addition" are compared, and the conditions are shown in Table 3. The mixed gas used in Example 3 had a flow rate ratio of $MTS:H_2:He=1:1:0.05$, and the additive gases were added in the same amount.

TABLE 3

| Item | | Without additive gas | With additive gas |
|---|---|---|---|
| Flow rate of additive gas | (Arbitrary unit) | 0.00 | 1.00 |
| Flow rate of MTS | (Arbitrary unit) | 1.00 | |
| Flow rate of $H_2$ | (Arbitrary unit) | 1.00 | |
| Flow rate of He (QMS standardization gas) | (Arbitrary unit) | 0.05 | |
| Total flow rate | (Arbitrary unit) | 2.05 | 3.05 |
| Temperature | ° C. | (Six zones have the same temperature setting) | |
| Total pressure | Pa | Reduced pressure | |
| Film formation time period | Hour(s) | 6 | |

Figure 38:
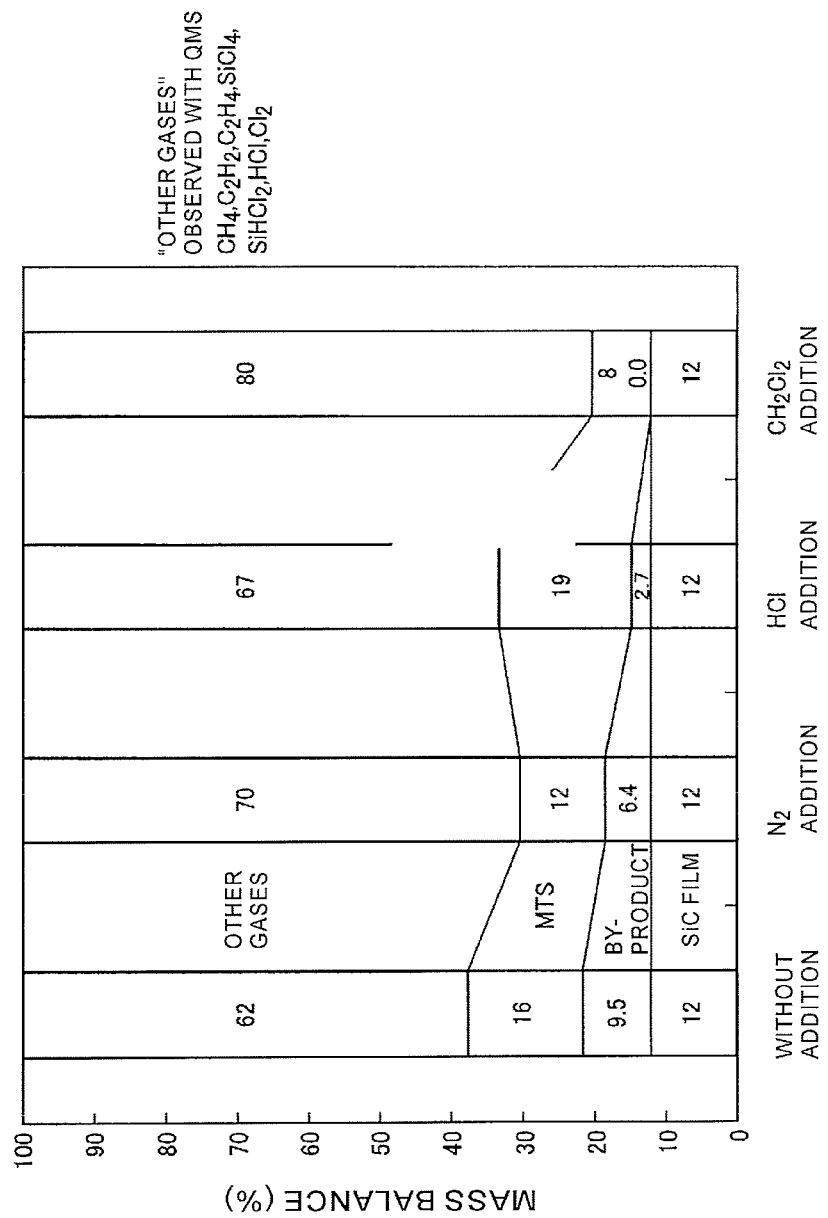
FIG. 38 is a graph for showing a mass balance.

The results of the mass balance in CVI are summarized in FIG. 38. From the qualitative analysis based on QMS, it was revealed that at least "$CH_4$, $C_2H_2$, $C_2H_4$, $SiCl_4$, $SiHCl_2$, HCl, and $Cl_2$" gases were generated as "other gases" to be generated through thermal decomposition of MTS.

In the case of no additive gas, the by-product is generated at a generation rate of 9.5% in terms of mass balance. In contrast, in the case of $N_2$ addition, the generation rate was decreased to 6.4%. This is presumably because a gas flow velocity is increased through addition of the additive gas and the by-product is pushed to a downstream side of the exhaust pipe, rather than because the by-product is decreased through a reaction and the like. Therefore, in an additive gas test of Example 3, the presence or absence of an effect was compared using the result in the case of $N_2$ addition as a reference. However, it is not denied that a change in reaction mechanism through $N_2$ addition may essentially have a decreasing effect on the generation of the by-product.

Figure 39A:
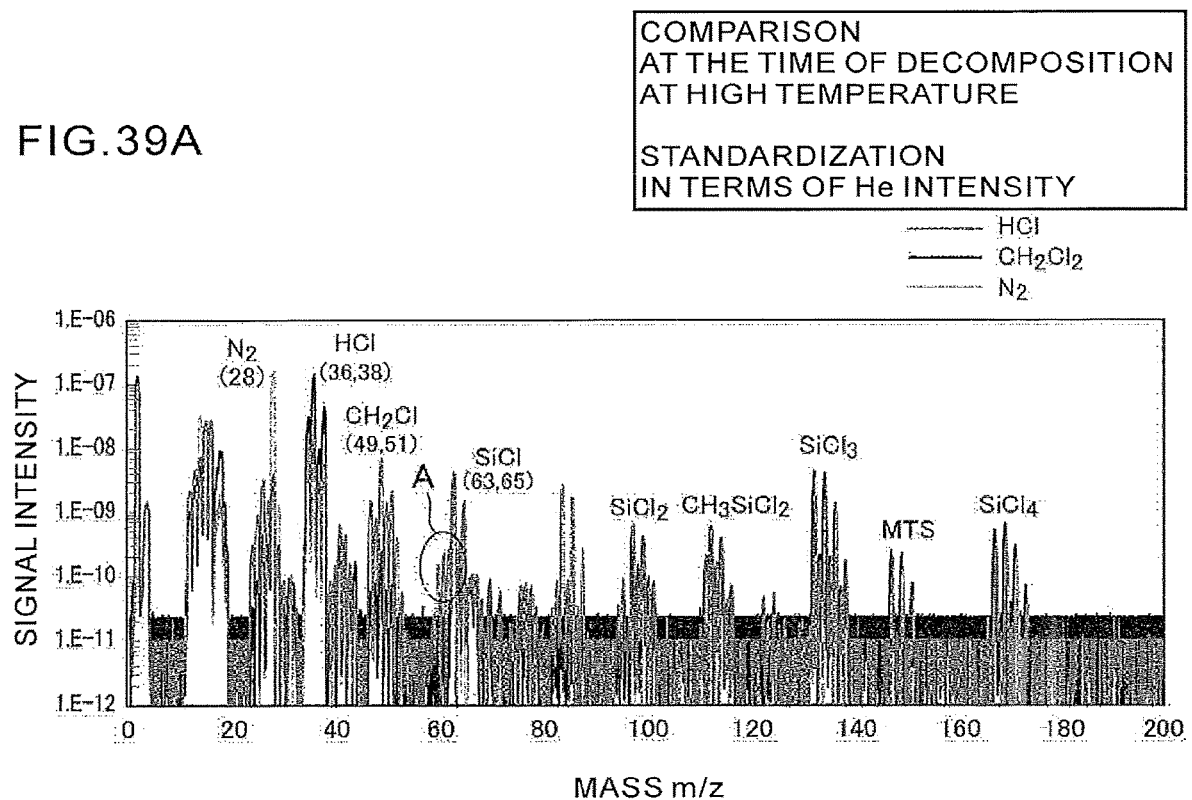
FIG. 39A is a first graph for showing comparison of exhaust gas compositions at the time of decomposition at high temperature in the cases of using HCl, $CH_2Cl_2$, and $N_2$ as an additive gas.
Figure 39B:
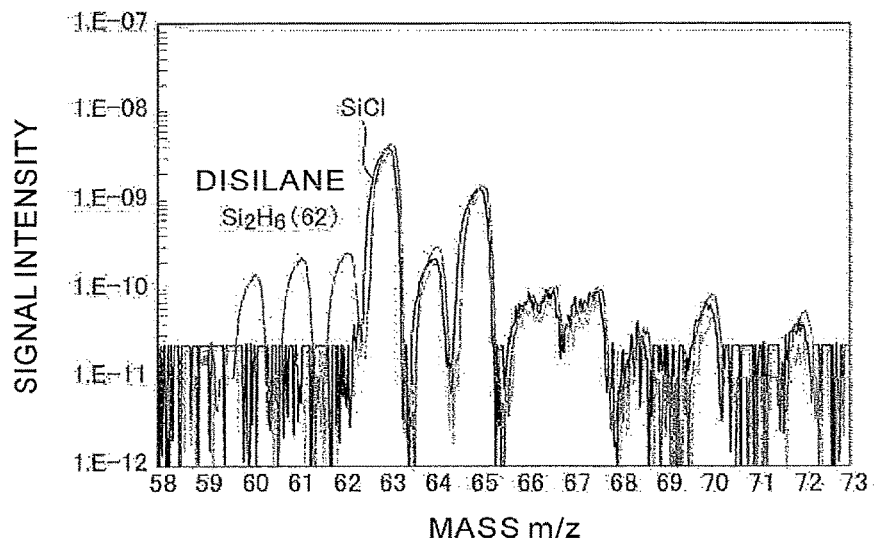
FIG. 39B is a second graph for showing comparison of the exhaust gas compositions at the time of decomposition at high temperature in the cases of using HCl, $CH_2Cl_2$, and $N_2$ as an additive gas.

In the case of $CH_2Cl_2$ addition, the generation of the by-product was not observed, and also other residues and the like were not generated. Comparison of the results of the gas analysis based on QMS in the cases of $N_2$ addition, HCl addition, and $CH_2Cl_2$ addition is shown in FIG. 39A and FIG. 39B. Overall data is shown in FIG. 39A, and data near the region A of FIG. 39A is shown in FIG. 39B in an enlarged manner.

In the case of $CH_2Cl_2$ addition, a gas molecule having a mass number of 62 m/z, which was not observed in the cases of $N_2$ addition and HCl addition, was observed. If the gas molecule having a mass number of 62 m/z is a molecule containing Cl, a spectrum has a feature in accordance with the presence ratios of isotopes of Cl (35 g/mol and 37 g/mol). As a result, it can be determined that the molecule having a mass number of 62 m/z is a molecule not containing Cl. Therefore, in consideration of a molecular weight, the molecule having a mass number of 62 m/z is presumed to be disilane ($Si_2H_6$). It is reasonable to consider molecules having a mass number of 59 m/z, 60 m/z, and 61 m/z to be disilane ($Si_2H_6$) fragments, that is, molecules in each of which H is removed from disilane.

In the case of HCl addition, the generation rate of the by-product in terms of mass balance was decreased to 2.7%. The by-product was decreased to half or less as compared to the case of $N_2$ addition (6.4%). Meanwhile, the residual rate of MTS is increased from 12% to 19%. The result indicates that a reaction in which a precursor of the by-product returns to MTS is promoted through HCl addition. In addition, as shown in FIG. 39A and FIG. 39B, the generation of a particular gas molecule was not able to be confirmed in exhaust gas analysis based on QMS in the case of HCl addition. Based on the facts that the by-product is decreased to half, the residual rate of MTS is increased, and a gas composition has no particular change, it can be presumed that, through HCl addition, a reaction in which $SiCl_2$ serving as a precursor of the by-product returns to MTS ($CH_3SiCl_3$) prevails over a reaction in which $SiCl_2$ is polymerized to generate the by-product. In this case, it is considered that complicated reaction pathways are involved.

Disilane is a combustible gas easily burned at room temperature in air and has dangerousness, but is also a gas which has low toxicity (generally said to have no toxicity) and is generally used in the semiconductor industry and the like, and is easily detoxified. Disilane is highly likely to be able to be treated at least more safely than the liquid by-product precipitated in the pipe. It was revealed that a method of decreasing the generation of the by-product through use of the additive gas was significantly effective.

In Example 3, consideration has been made on decrease of the generation of the by-product by adding the additive gas to the gas discharged from the reaction furnace. It was revealed that the by-product was able to be almost entirely vanished in the case of $CH_2Cl_2$ addition. In the case of HCl addition, the by-product was decreased to half or less, and the residual rate of MTS was increased. However, HCl entailed an increase in treatment amount of a detoxifying device owing to an increase in HCl concentration in an exhaust gas, is a gas species having a higher price, and has a low decreasing effect on the generation of the by-product as compared to the other gases (comparable to the effect through treatment at 600° C.)

(Second Design of By-Product Decreasing Reaction with Addition of Gas)

A rate constant calculation equation (6) for an elementary reaction using $SiCl_2$ as a starting substance was constructed. An elementary reaction having a higher rate constant k was presumed through theoretical calculation using the rate constant calculation equation (6).

$$k = AT^n \exp\left(\frac{-Ea}{RT}\right) \qquad (6)$$

In the rate constant calculation equation (6), A, n, and Ea (J/mol) are constants in each elementary reaction.

FIG. 40A is a table for showing examples of elementary reactions related to $SiCl_2$ and constants thereof. FIG. 40B is a graph for comparison of the rate constants of elementary reactions listed as candidates. As shown in FIG. 40A and FIG. 40B, as a result of the theoretical calculation, it was predicted that $SiCl_2$ was able to be decreased when a reaction in which any one or more of SiCl, H, HCl, and $CH_3Cl$ were generated from $SiCl_2$ was able to be promoted through addition of an additive gas. With this, it was presumed that, when three kinds of gases, a HCl gas, a $C_xH_y$-based gas, and a $C_xH_yCl_z$-based gas, were each used as the additive gas, a decreasing effect on $SiCl_2$ was exhibited.

(Selection of Candidate Additive Gas)

Based on the results of the "Second Design of By-product Decreasing Reaction" section, out of the three kinds of gases, the HCl gas, the $C_xH_y$-based gas, and the $C_xH_yCl_z$-based gas, which were each presumed to have a decreasing effect on $SiCl_2$, substances each having high safety (low toxicity, low environmental load, simple detoxifying device), easy handleability (high vapor pressure), and low cost (widely used product, low molecular weight (g/mol)) were selected.

Specifically, six substances, HCl (hydrogen chloride), $CH_3Cl$ (chloromethane), $CH_2Cl_2$ (dichloromethane), $CCl_4$ (tetrachloromethane, carbon tetrachloride), $C_2H_3Cl_3$ (trichloroethane), and $C_2HCl_3$ (trichloroethylene), were selected as candidate additive gases.

(Simulation of By-Product in the Case of Adding Additive Gas)

Figure 41:
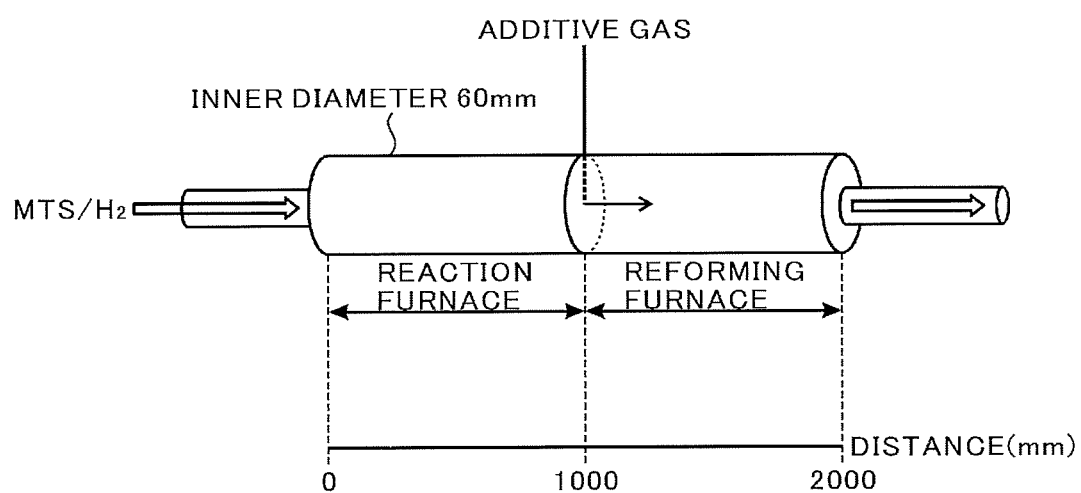
FIG. 41 is a view for illustrating simulation conditions.

In the same manner as in the "Feature Prediction of By-product Generation Reaction" section, reaction calculation was performed through use of a $MTS/H_2$ reaction mechanism and CHEMKIN (see Non Patent Literature 6). FIG. 41 is a view for illustrating simulation conditions. As illustrated in FIG. 41, the reaction calculation was performed under the conditions in which a $MTS/H_2$ mixed gas (raw material gas) flows as a plug flow in a cylindrical tube having an inner diameter of 60 mm and a total length of 2,000 mm at a flow rate ratio of $MTS:H_2=1.0:0.4$ under reduced pressure. In the cylindrical tube, a region ranging from an end portion (0 mm) on an upstream side in a flow direction of the raw material gas to a position distant from the end portion by 1,000 mm served as a reaction furnace, and a region ranging from the position distant from the end portion by 1,000 mm to a position distant therefrom by 2,000 mm served as a reforming furnace. In addition, the reaction calculation was performed given that the temperature of the reforming furnace was set to 975° C. and an additive gas was added to the reforming furnace (corresponding to a position at a distance of 1,000 mm and a residence time t of 1.36 seconds) at a flow rate ratio of MTS:additive gas=1.0:1.0. The reaction calculation was performed in each of the cases of the six substances, HCl, CH$_3$Cl, CH$_2$Cl$_2$, CCl$_4$, C$_2$H$_3$Cl$_3$, and C$_2$HCl$_3$, as an additive gas.

FIG. 42A is a graph for showing the result of simulation in the case of adding HCl as an additive gas. FIG. 42B is a graph for showing the result of simulation in the case of adding CH$_2$Cl$_2$ as an additive gas. FIG. 42C is a graph for showing the result of simulation in the case of adding CH$_3$Cl as an additive gas. FIG. 42D is a graph for showing the result of simulation in the case of adding C$_2$HCl$_3$ as an additive gas. FIG. 42E is a graph for showing the result of simulation in the case of adding C$_2$H$_3$Cl$_3$ as an additive gas. FIG. 42F is a graph for showing the result of simulation in the case of adding CCl$_4$ as an additive gas. In each of FIG. 42A to FIG. 42F, the broken line represents the partial pressure of MTS, the long dashed double-dotted line represents the partial pressure of H$_2$, the long dashed dotted line represents the partial pressure of the additive gas, and the solid line represents the partial pressure of SiCl$_2$.

Simulation of the by-product (SiCl$_2$) was performed, and the result thereof was that the generation of SiCl$_2$ was suppressed by adding the additive gas in each of the cases of HCl, CH$_3$Cl, CH$_2$Cl$_2$, CCl$_4$, C$_2$H$_3$Cl$_3$, and C$_2$HCl$_3$. In addition, the result was that, of those six substances, C$_2$HCl$_3$ shown in FIG. 42D had the largest decreasing effect on SiCl$_2$. In addition, the result was that CH$_2$Cl$_2$ shown in FIG. 42B, CH$_3$Cl shown in FIG. 42C, and C$_2$H$_3$Cl$_3$ shown in FIG. 42E each had a large decreasing effect on SiCl$_2$.

From the above-mentioned results, it is presumed that SiCl$_2$ can be decreased efficiently by adopting a C$_x$H$_y$Cl$_z$-based (0≤x+y+z≤1, 0≤x, y≤1, 0<z) compound as the additive gas.

(Consideration of Temperature of Reforming Furnace in the Case of Adding Additive Gas)

In the same manner as in the "Simulation of By-product in the Case of Adding Additive Gas" section, reaction calculation was performed through use of a MTS/H$_2$ reaction mechanism and CHEMKIN (see Non Patent Literature 6). Simulation conditions are the same as in the "Simulation of By-product in the Case of Adding Additive Gas" section except for the temperature of a reforming furnace and the total length of the reforming furnace. The partial pressure of SiCl$_2$ in the cases in which the temperature of the reforming furnace was 200° C., 400° C., 600° C., 800° C., and 1,000° C. was calculated. In addition, the reaction calculation was performed given that each of CH$_2$Cl$_2$ and CH$_3$Cl was added as an additive gas at a position having a residence time t of 1.37 seconds.

Figure 43A:
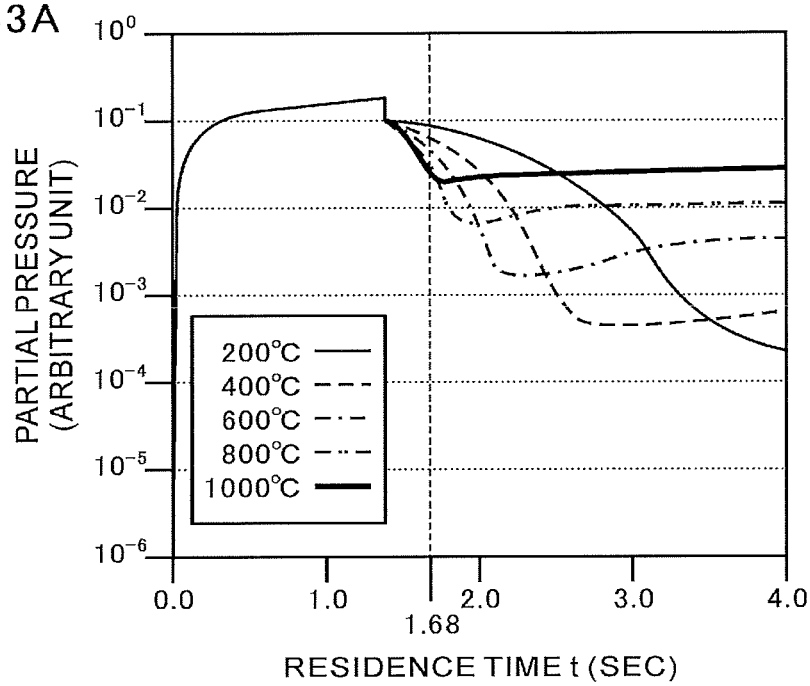
FIG. 43A is a graph for showing a change in partial pressure of $SiCl_2$ depending on a residence time at various temperatures in the case of using $CH_2Cl_2$ as an additive gas.
Figure 43B:
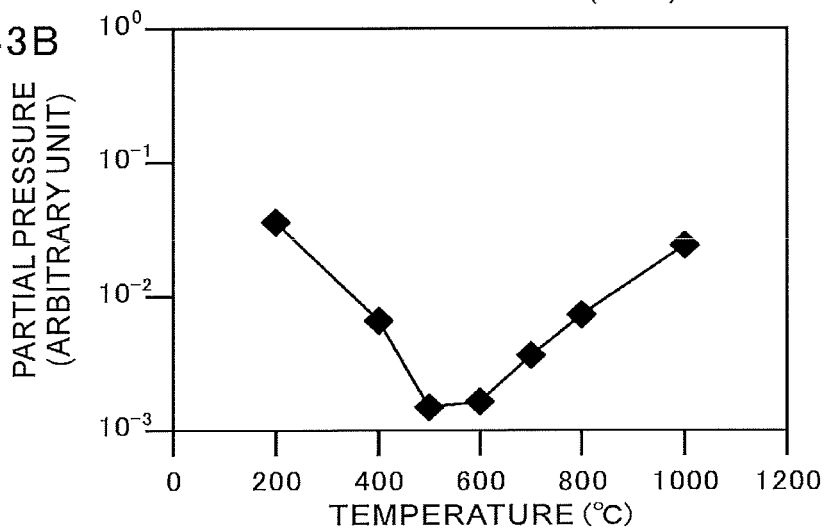
FIG. 43B is a graph for showing the partial pressure of $SiCl_2$ at an outlet of a reforming furnace.
Figure 43C:
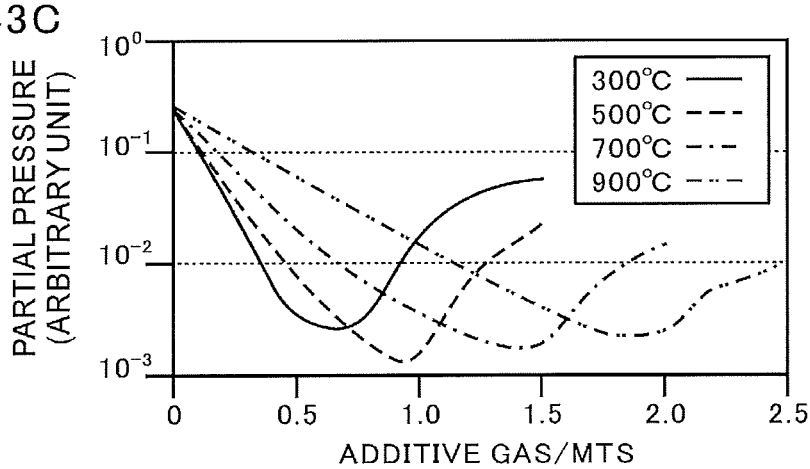
FIG. 43C is a graph for showing a change in partial pressure of $SiCl_2$ depending on a difference in flow rate ratio between the additive gas and MTS at various temperatures.

FIG. 43A, FIG. 43B, and FIG. 43C are each a graph for showing the partial pressure of SiCl$_2$ in the case of adding CH$_2$Cl$_2$ as an additive gas and changing the temperature of the reforming furnace. FIG. 43A is a graph for showing a change in partial pressure of SiCl$_2$ depending on a residence time at various temperatures. FIG. 43B is a graph for showing the partial pressure of SiCl$_2$ at an outlet of the reforming furnace. FIG. 43C is a graph for showing a change in partial pressure of SiCl$_2$ depending on a difference in flow rate ratio between the additive gas and MTS at various temperatures. In FIG. 43A, the solid line represents the case of 200° C., the broken line represents the case of 400° C., the long dashed dotted line represents the case of 600° C., the long dashed double-dotted line represents the case of 800° C., and the heavy line represents the case of 1,000° C. In addition, in FIG. 43C, the solid line represents the case of 300° C., the broken line represents the case of 500° C., the long dashed dotted line represents the case of 700° C., and the long dashed double-dotted line represents the case of 900° C.

As shown in FIG. 43A, the result obtained was that the decreasing effect on SiCl$_2$ became higher as the temperature became higher at a residence time t of 1.68 seconds. That is, the result obtained was that the decreasing effect on SiCl$_2$ became higher as the temperature became higher 0.31 second after the addition of CH$_2$Cl$_2$ serving as an additive gas. Meanwhile, when the residence time t exceeded 1.68 seconds, the following different result was obtained: a temperature at which a higher decreasing effect on SiCl$_2$ was obtained varied depending on the residence time.

In addition, as shown in FIG. 43B, the result obtained was that the partial pressure of SiCl$_2$ at the outlet of the reforming furnace was lowest when the temperature of the reforming furnace was 500° C. In addition, the result obtained was that the partial pressure of SiCl$_2$ at the outlet of the reforming furnace was increased in an ascending order of 500° C., 600° C., 700° C., 400° C., 800° C., 1,000° C., and 200° C. The presence of an optimal temperature range in the case of adding CH$_2$Cl$_2$ as an additive gas was theoretically revealed.

In addition, as shown in FIG. 43C, when the flow rate ratio between CH$_2$Cl$_2$ and MTS (CH$_2$Cl$_2$/MTS) was less than 0.7, the result obtained was that the decreasing effect on SiCl$_2$ became higher as the temperature of the reforming furnace became lower. In addition, when the flow rate ratio was 1.6 or more, the result obtained was that the decreasing effect on SiCl$_2$ became higher as the temperature of the reforming furnace became higher. Further, when the flow rate ratio was 0.7 or more and less than 1.6, the result was that a temperature of the reforming furnace at which a higher decreasing effect on SiCl$_2$ was obtained varied depending on the flow rate ratio.

Figure 44A:
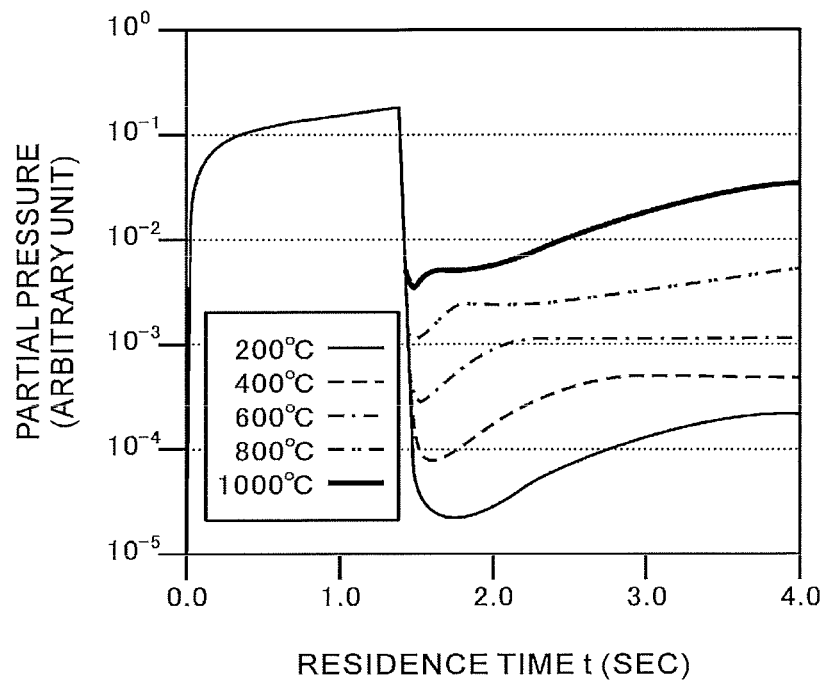
FIG. 44A is a graph for showing a change in partial pressure of $SiCl_2$ depending on a residence time at various temperatures in the case of using $CH_3Cl$ as an additive gas.
Figure 44B:
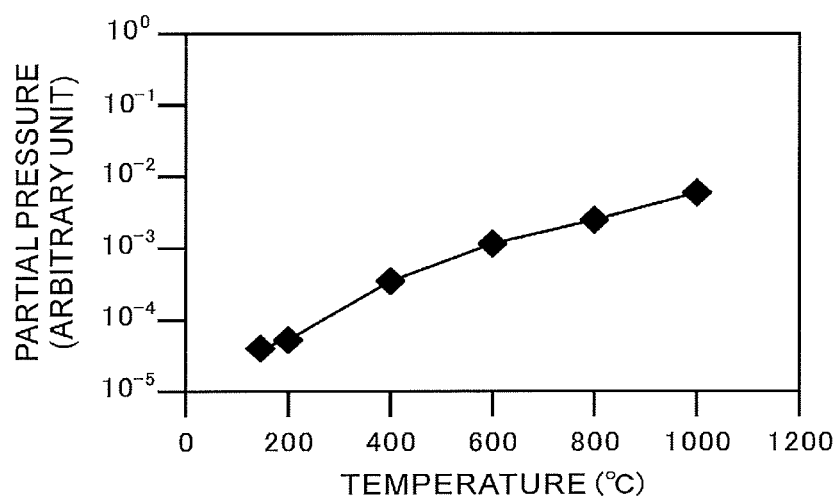
FIG. 44B is a graph for showing the partial pressure of $SiCl_2$ at an outlet of a reforming furnace.

FIG. 44A and FIG. 44B are each a graph for showing the partial pressure of SiCl$_2$ in the case of adding CH$_3$Cl as an additive gas and changing the temperature of the reforming furnace. FIG. 44A is a graph for showing a change in partial pressure of SiCl$_2$ depending on a residence time at various temperatures. FIG. 44B is a graph for showing the partial pressure of SiCl$_2$ at an outlet of the reforming furnace. In FIG. 44A, the solid line represents the case of 200° C., the broken line represents the case of 400° C., the long dashed dotted line represents the case of 600° C., the long dashed double-dotted line represents the case of 800° C., and the heavy line represents the case of 1,000° C.

As shown in FIG. 44A and FIG. 44B, the result was that the partial pressure of SiCl$_2$ was lowest at a time point of a residence time t of 1.5 seconds irrespective of the temperature of the reforming furnace. That is, the result obtained was that the partial pressure of SiCl$_2$ was lowest 0.1 second after the addition of CH$_3$Cl as an additive gas.

In addition, as shown in FIG. 44B, the result obtained was that the partial pressure of SiCl$_2$ at the outlet of the reforming furnace became lower as the temperature of the reforming furnace became lower. Specifically, the result was that the partial pressure of SiCl$_2$ at the outlet of the reforming furnace was increased in an ascending order of 150° C., 200° C., 400° C., 600° C., 800° C., and 1,000° C.

(Consideration of Addition Amount of Additive Gas)

In the same manner as in the "Consideration of Temperature of Reforming Furnace in the Case of Adding Additive Gas" section, reaction calculation was performed through use of a MTS/H$_2$ reaction mechanism and CHEMKIN (see Non Patent Literature 6). Simulation conditions are the same as in the "Consideration of Temperature of Reforming Furnace in the Case of Adding Additive Gas" section except for the addition amount of an additive gas.

Figure 45:
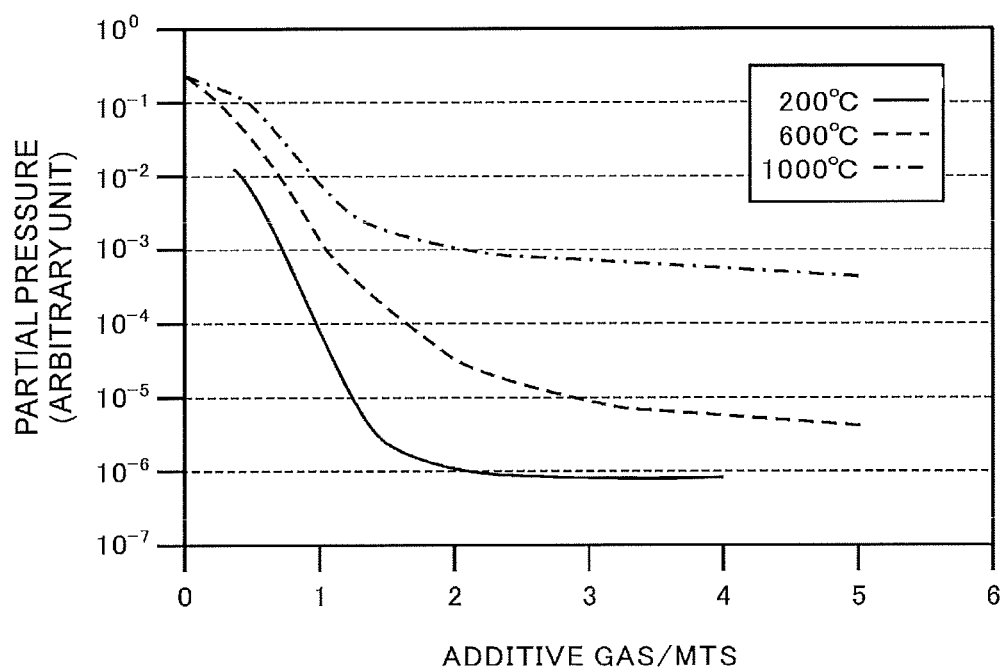
FIG. 45 is a graph for showing the partial pressure of $SiCl_2$ in the case of changing the addition amount of $CH_3Cl$ serving as an additive gas.

FIG. 45 is a graph for showing the partial pressure of SiCl$_2$ in the case of changing the addition amount of CH$_3$Cl serving as an additive gas. In FIG. 45, the solid line represents the case in which the temperature of the reforming furnace was set to 200° C., the broken line represents the case in which the temperature of the reforming furnace was set to 600° C., and the long dashed dotted line represents the case in which the temperature of the reforming furnace was set to 1,000° C.

As shown in FIG. 45, the result was that the partial pressure of $SiCl_2$ became lower as the amount of the additive gas became larger irrespective of the temperature of the reforming furnace. In addition, the result obtained was that the partial pressure of $SiCl_2$ was remarkably decreased when a ratio in amount of substance between the additive gas and MTS (additive gas/MTS) was 1 or more.

Example 4

An experiment in which $N_2$, $C_2H_4$, HCl, $CH_3Cl$, $CH_2Cl_2$, $CCl_4$, $C_2H_3Cl_3$, or $C_2HCl_3$ was added as an additive gas and treatment was performed in a reforming furnace was performed through use of an apparatus similar to the apparatus of Example 3 illustrated in FIG. 37. In Example 4, zones Nos. 1 to 3 served as a reaction region corresponding to a reaction furnace, and zones Nos. 4 to 6 served as a reforming region corresponding to the reforming furnace. That is, the reaction furnace had a length of 1.05 m (350 mm×3), and the reforming furnace had a length of 1.05 m (350 mm×3). The temperature of the reforming furnace was set to 975° C. In addition, the reaction furnace and the reforming furnace were under reduced pressure.

In addition, a $MTS/H_2/He$ mixed gas was supplied to the reaction furnace as a raw material gas. The raw material gas had a flow rate ratio of $MTS:H_2:He=1.0:1.0:0.05$. In addition, HCl, $CH_3Cl$, $CH_2Cl_2$, $CCl_4$, $C_2H_3Cl_3$, or $C_2HCl_3$ was supplied to the reforming furnace as an additive gas. The flow rate ratio between MTS and the additive gas was as follows: MTS:additive gas=1.0:1.0.

In order to evaluate a decreasing effect on the by-product exhibited by the additive gas, a mass balance was calculated for a SiC film and gases to be generated from MTS contained in the raw material gas through a reaction according to the kind of the additive gas. The mass balance was calculated on the following assumption when the amount of substance (mole number) of MTS ($CH_3SiCl_3$) to be supplied was defined as 100%.
1) Amount of SiC Film (%)
The amount of a SiC film was calculated based on a total amount of SiC films formed on a base material arranged in the reaction furnace or the reforming furnace and on a wall surface of a quartz tube.
2) Amount of By-Product (%)
The amount of the by-product was calculated based on the weight of collected matter collected in a by-product collecting tube mounted to an exhaust pipe. The amount of the by-product was calculated on the assumption that the by-product was $SiCl_2$ (molecular weight: 98.5 g/mol).
3) Amount of Unconsumed MTS (%)
In QMS gas analysis, a QMS signal intensity at room temperature was assumed to be 100%, and the amount of unconsumed MTS was calculated based on a ratio between the QMS signal intensity at room temperature and a signal intensity at the time of thermal decomposition at high temperature.
4) Amount of Other Gases (%)
The amounts of other gasses were obtained by subtracting the above-mentioned items 1), 2), and 3) from 100%.

Figure 46:
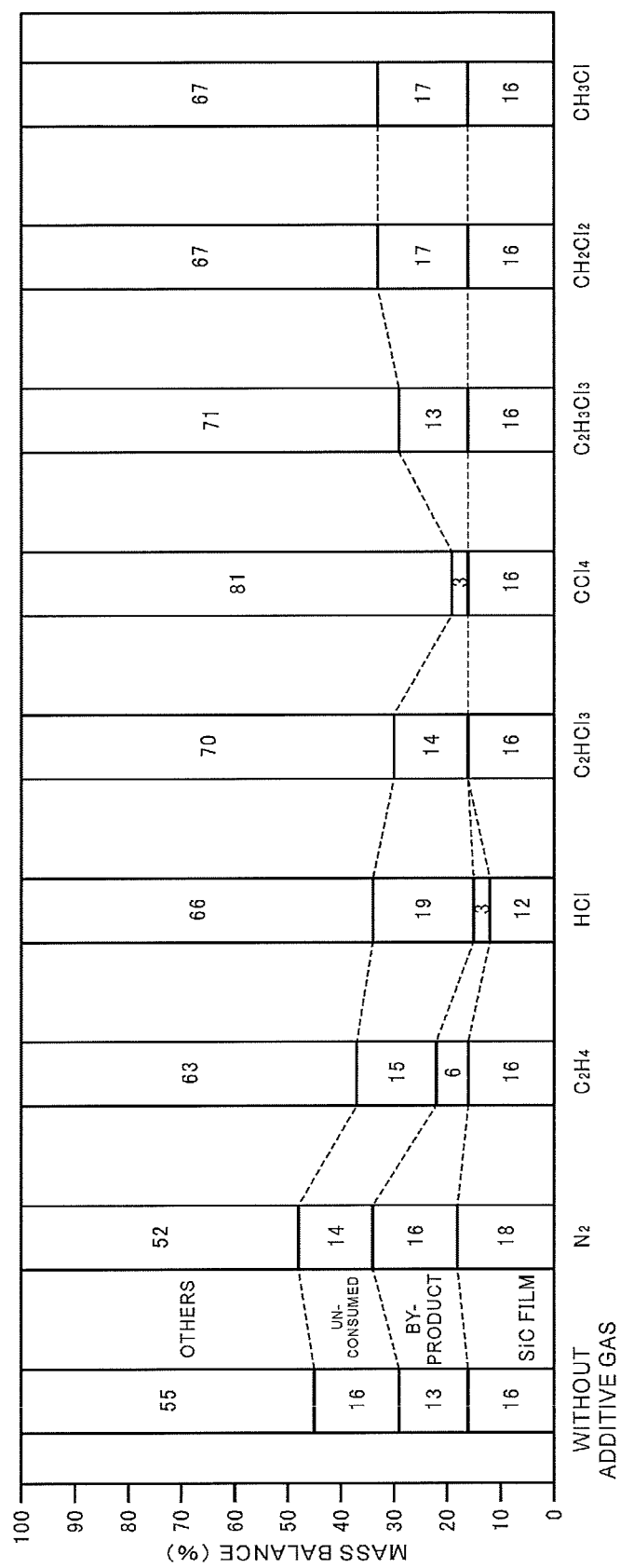
FIG. 46 is a graph for showing a mass balance calculated in Example 4.

FIG. 46 is a graph for showing a mass balance calculated in Example 4. As shown in FIG. 46, in the case of "without an additive gas", the by-product ($SiCl_2$) was generated at 13%. In addition, in the case of adding a "nitrogen gas ($N_2$)" as an additive gas, the by-product was generated at 16%. In the case of adding "$C_2H_4$ (ethylene)" as an additive gas, the by-product was generated at 6%. In addition, in the case of adding "HCl" as an additive gas, the by-product was generated at 3%. Further, in each of the cases of adding "$C_2HCl_3$", "$CCl_4$", "$C_2H_3Cl_3$", "$CH_2Cl_2$", and "$CH_3Cl$" as an additive gas, no by-product was generated (0%).

From the above-mentioned results, it was confirmed that, when at least any one substance selected from the selected six substances and $C_2H_4$ was added, the generation of $SiCl_2$ was able to be decreased as compared to the case of adding a nitrogen gas at an equal gas flow rate. In addition, it was confirmed that the generation of $SiCl_2$ was able to be avoided when at least any one substance selected from "$C_2HCl_3$", "$CCl_4$", "$C_2H_3Cl_3$", "$CH_2Cl_2$", and "$CH_3Cl$" was added as an additive gas.

Figure 47A:
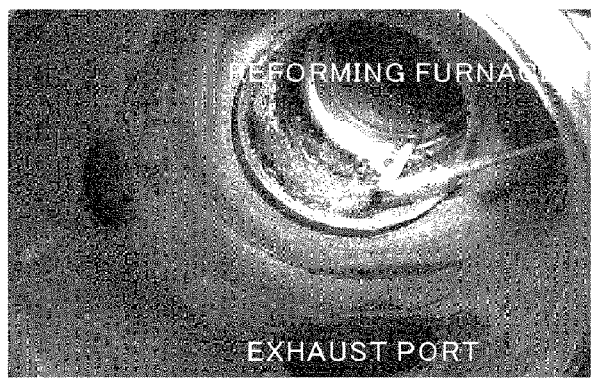
FIG. 47A is a photograph in the case of not adding an additive gas.
Figure 47B:
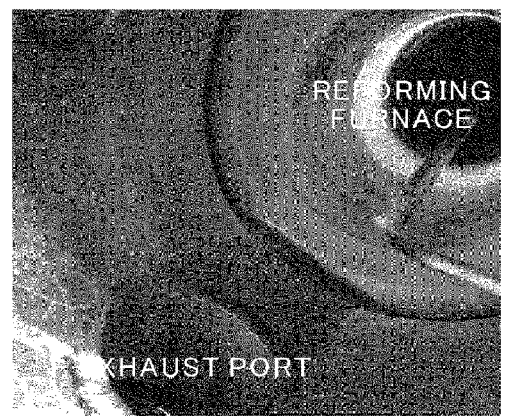
FIG. 47B is a photograph in the case of adding HCl as an additive gas.
Figure 47C:
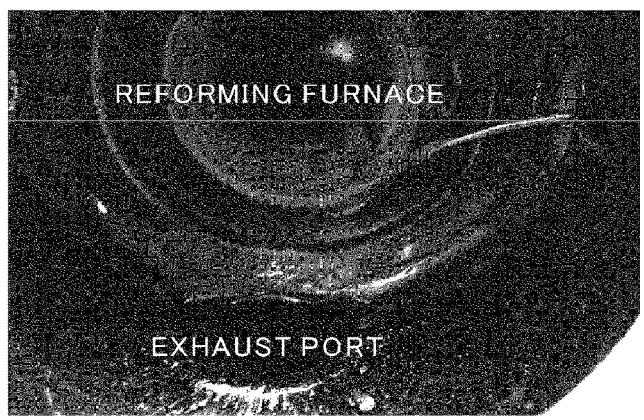
FIG. 47C is a photograph in the case of adding $C_2HCl_3$ as an additive gas.
Figure 47D:
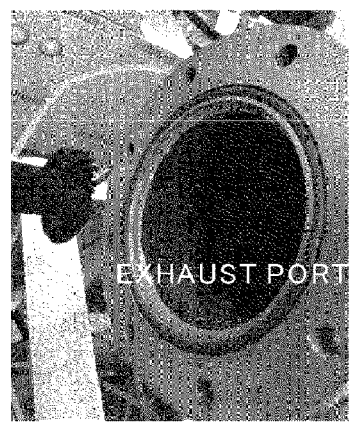
FIG. 47D is a photograph in the case of adding $CCl_4$ as an additive gas.
Figure 47E:
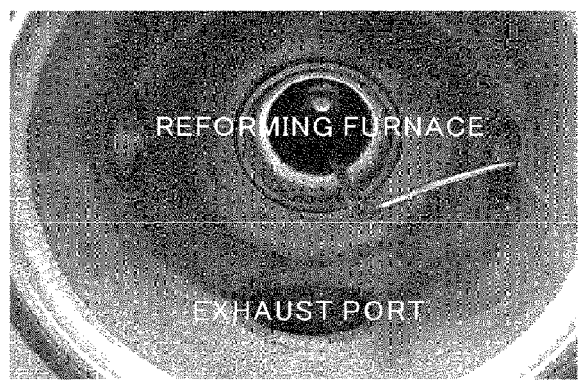
FIG. 47E is a photograph in the case of adding $CH_3Cl$ as an additive gas.
Figure 47F:
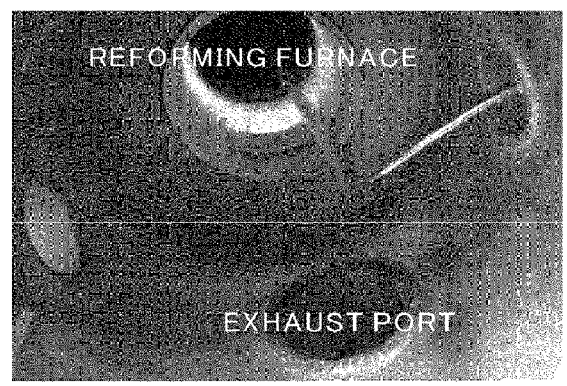
FIG. 47F is a photograph in the case of adding $CH_2Cl_2$ as an additive gas.

FIG. 47A to FIG. 47F are each a photograph of an exhaust pipe (a pipe connected to the outlet of the reforming furnace) in Example 4. FIG. 47A is a photograph in the case of not adding an additive gas. FIG. 47B is a photograph in the case of adding HCl as an additive gas. FIG. 47C is a photograph in the case of adding $C_2HCl_3$ as an additive gas. FIG. 47D is a photograph in the case of adding $CCl_4$ as an additive gas. FIG. 47E is a photograph in the case of adding $CH_3Cl$ as an additive gas. FIG. 47F is a photograph in the case of adding $CH_2Cl_2$ as an additive gas.

As shown in FIG. 47A and FIG. 47B, it was confirmed that the by-product ($SiCl_2$) adhered to the exhaust pipe in the case of not adding an additive gas and in the case of adding HCl as an additive gas. In addition, as shown in FIG. 47C and FIG. 47D, the adhesion of the by-product ($SiCl_2$) was not observed, but the adhesion of carbon was observed in the cases of adding $C_2HCl_3$ and $CCl_4$ as an additive gas. Meanwhile, as shown in FIG. 47E and FIG. 47F, neither the adhesion of the by-product ($SiCl_2$) nor the adhesion of carbon was observed in the cases of adding $CH_3Cl$ and $CH_2Cl_2$ as an additive gas.

From the above-mentioned results, it was confirmed that, when at least one of $CH_3Cl$ or $CH_2Cl_2$ was added as an additive gas, the generation of $SiCl_2$ was able to be avoided, and in addition, a situation in which carbon was precipitated in the exhaust pipe was able to be avoided.

Example 5

A flow rate ratio given that the flow rate of MTS is defined as 1.0 is considered below. An experiment in which $CH_3Cl$ was added as an additive gas and treatment was performed in a reforming furnace was performed through use of an apparatus similar to the apparatus of Example 4. A reaction furnace and the reforming furnace were under reduced pressure. In addition, a $MTS/H_2/He$ mixed gas was supplied to the reaction furnace as a raw material gas. The raw material gas had a flow rate ratio of $MTS:H_2:He=1:1:0.05$. In addition, $CH_3Cl$ was supplied to the reforming furnace as an additive gas. Further, in order to consider a residence time, the experiment was performed in the cases of inserting a tube formed of carbon (hereinafter referred to as "carbon tube") into the reforming furnace and not inserting the carbon tube into the reforming furnace. The carbon tube has dimensions measuring 1.05 m in length, 60 mm in outer diameter, and 20 mm in inner diameter. That is, when the reforming furnace is formed of a circular tube, the experiment was performed in the cases in which a specific surface area obtained by dividing the volume of the circular tube by the surface area of the circular tube was 5 mm and 15 mm.

Figure 48A:
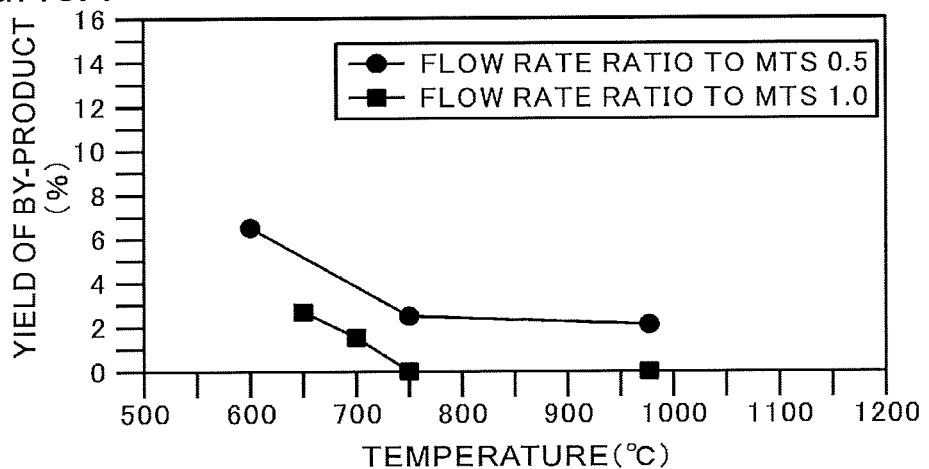
FIG. 48A is a graph for showing a relationship among the addition amount of $CH_3Cl$, the temperature of a reforming furnace, and the yield of a by-product.
Figure 48B:
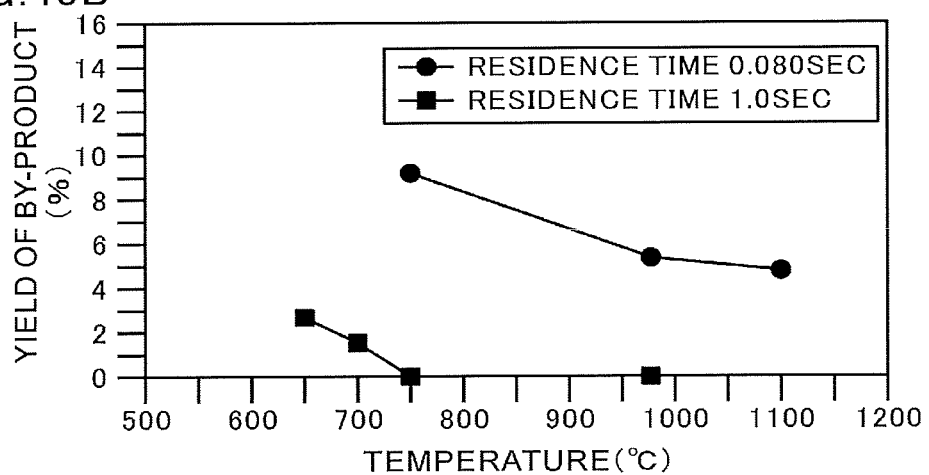
FIG. 48B is a graph for showing a relationship among the residence time of $CH_3Cl$, the temperature of the reforming furnace, and the yield of the by-product.
Figure 48C:
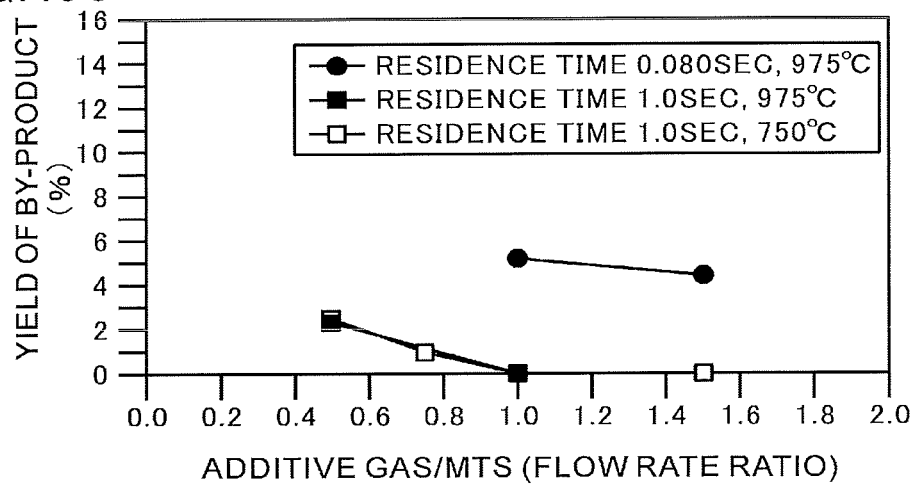
FIG. 48C is a graph for showing a relationship among the residence time of $CH_3Cl$, the temperature of the reforming furnace, a flow rate ratio, and the yield of the by-product.

FIG. 48A, FIG. 48B, and FIG. 48C are each a graph for showing results of Example 5. FIG. 48A is a graph for showing a relationship among the addition amount of $CH_3Cl$, the temperature of the reforming furnace, and the yield of a by-product. FIG. 48B is a graph for showing a relationship among the residence time of $CH_3Cl$, the temperature of the reforming furnace, and the yield of the by-product. FIG. 48C is a graph for showing a relationship among the residence time of $CH_3Cl$, the temperature of the reforming furnace, a flow rate ratio, and the yield of the by-product.

In the case in which $CH_3Cl$ was added at a flow rate ratio of 0.5 (in an amount of 50% of MTS) and the case in which $CH_3Cl$ was added at a flow rate ratio of 1.0 (in the same amount as MTS), the yield (%) of the by-product ($SiCl_2$) at the time of changing the temperature of the reforming furnace was measured. As a result, in the case in which $CH_3Cl$ was added to the reforming furnace at a flow rate ratio of 0.5 (represented by black circles in FIG. 48A), it was confirmed that the yield of the by-product was decreased with an increase in temperature of the reforming furnace until the temperature of the reforming furnace reached 750° C. In addition, it was confirmed that a decrease rate of the yield of the by-product was decreased when the temperature of the reforming furnace exceeded 750° C.

In the case in which $CH_3Cl$ was added to the reforming furnace at a flow rate ratio of 1.0 (in the same amount as MTS) (represented by black squares in FIG. 48A), it was confirmed that the yield of the by-product was decreased with an increase in temperature of the reforming furnace. In addition, it was confirmed that no by-product was generated (the yield became 0%) when the temperature of the reforming furnace was 750° C. or more.

From the above-mentioned results, in the case of adopting $CH_3Cl$ as an additive gas, it was confirmed that the generation of the by-product ($SiCl_2$) was able to be prevented when the temperature of the reforming furnace was set to 750° C. or more. In addition, when the temperature of the reforming furnace is 850° C. or more, a SiC film is formed. Accordingly, in the case of adopting $CH_3Cl$ as an additive gas, it was confirmed that the temperature of the reforming furnace was preferably set to 750° C. or more and less than 850° C.

In addition, in the cases in which the residence time of $CH_3Cl$ in the reforming furnace was set to 0.080 second (the carbon tube was inserted) and 1.0 second (the carbon tube was not inserted), the yield (%) of the by-product ($SiCl_2$) at the time of changing the temperature of the reforming furnace was measured. As a result, in the case in which the residence time in the reforming furnace was set to 0.080 second (represented by black circles in FIG. 48B), it was confirmed that the yield of the by-product was decreased with an increase in temperature of the reforming furnace.

Meanwhile, in the case in which the residence time in the reforming furnace was set to 1.0 second (represented by black squares in FIG. 48B), it was confirmed that the yield of the by-product was decreased with an increase in temperature of the reforming furnace. In addition, it was confirmed that no by-product was generated (the yield became 0%) when the temperature of the reforming furnace was 750° C. or more.

From the above-mentioned results, in the case of adopting $CH_3Cl$ as an additive gas, it was confirmed that the generation of the by-product was able to be prevented when the residence time of the additive gas in the reforming furnace was set to 1.0 second or more. From the fact that a decreasing effect on the by-product was observed also when the residence time was set to 0.080 second, it is presumed that, in the case of adopting $CH_3Cl$ as an additive gas, the generation of the by-product can be prevented when the residence time of the additive gas in the reforming furnace is set to 0.2 second or more.

In addition, when the residence time of the additive gas in the reforming furnace is set to 10 seconds or more, the reforming furnace itself is increased in size. Accordingly, in the case of adopting $CH_3Cl$ as an additive gas, it was confirmed that the residence time of the additive gas in the reforming furnace was preferably set to 0.2 second or more and less than 10 seconds. That is, when the residence time of the additive gas in the reforming furnace is set to 0.2 second or more and less than 10 seconds, the generation of the by-product can be prevented while the reforming furnace can be reduced in size.

In addition, the yield (%) of the by-product ($SiCl_2$) at the time of changing a flow rate ratio between the additive gas ($CH_3Cl$) and MTS (additive gas/MTS) was measured. In the case in which the residence time of $CH_3Cl$ in the reforming furnace was set to 0.080 second and the temperature of the reforming furnace was set to 975° C. (represented by black circles in FIG. 48C), it was revealed that the yield of the by-product was decreased with an increase in flow rate ratio (ratio in amount of substance).

In the case in which the residence time of $CH_3Cl$ in the reforming furnace was set to 1.0 second and the temperature of the reforming furnace was set to 975° C. (represented by black squares in FIG. 48C), it was revealed that the yield of the by-product was decreased with an increase in flow rate ratio. In addition, it was confirmed that no by-product was generated (the yield became 0%) when the flow rate ratio was 1.0 or more.

In the case in which the residence time of $CH_3Cl$ in the reforming furnace was set to 1.0 second and the temperature of the reforming furnace was set to 750° C. (represented by white squares in FIG. 48C), it was revealed that the yield of the by-product was decreased with an increase in flow rate ratio. In addition, it was confirmed that no by-product was generated (the yield became 0%) when the flow rate ratio was 1.0 or more.

From the above-mentioned results, it was confirmed that the generation of the by-product ($SiCl_2$) was able to be prevented when the flow rate ratio between $CH_3Cl$ and MTS ($CH_3Cl$/MTS) was set to 1.0 or more.

Example 6

A flow rate ratio given that the flow rate of MTS is defined as 1.0 is considered below. An experiment in which $CH_2Cl_2$ was added as an additive gas and treatment was performed in a reforming furnace was performed through use of an apparatus similar to the apparatus of Example 4. A reaction furnace and the reforming furnace were under reduced pressure.

In addition, a MTS/$H_2$/He mixed gas was supplied to the reaction furnace as a raw material gas. The raw material gas had a flow rate ratio of MTS:$H_2$:He=1:1:0.05. In addition, $CH_2Cl_2$ was supplied to the reforming furnace as an additive gas. Further, in order to consider a residence time, the experiment was performed in the cases of inserting a carbon tube into the reforming furnace and not inserting the carbon tube into the reforming furnace. The dimensions of the carbon tube are the same as in Example 5, i.e., 1.05 m in length, 60 mm in outer diameter, and 20 mm in inner diameter. That is, when the reforming furnace is formed of a circular tube, the experiment was performed in the cases in which a specific surface area obtained by dividing the volume of the circular tube by the surface area of the circular tube was 5 mm and 15 mm.

Figure 49A:
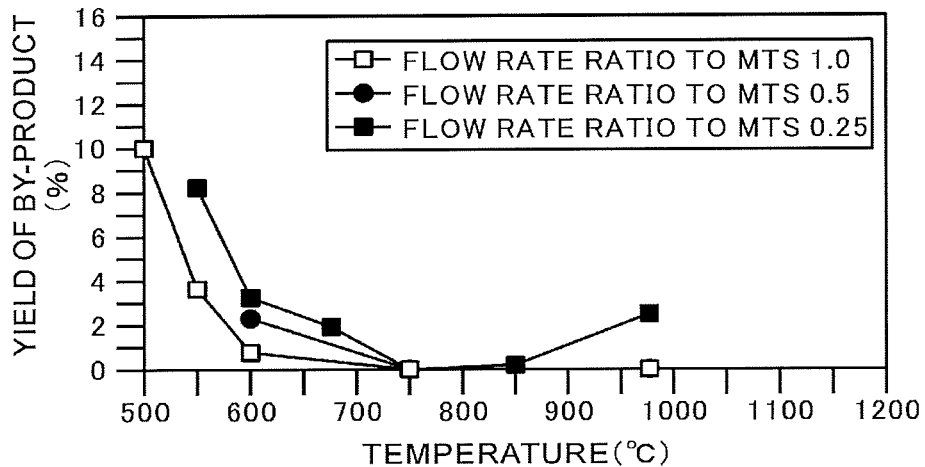
FIG. 49A is a graph for showing a relationship among the addition amount of $CH_2Cl_2$, the temperature of a reforming furnace, and the yield of a by-product.
Figure 49B:
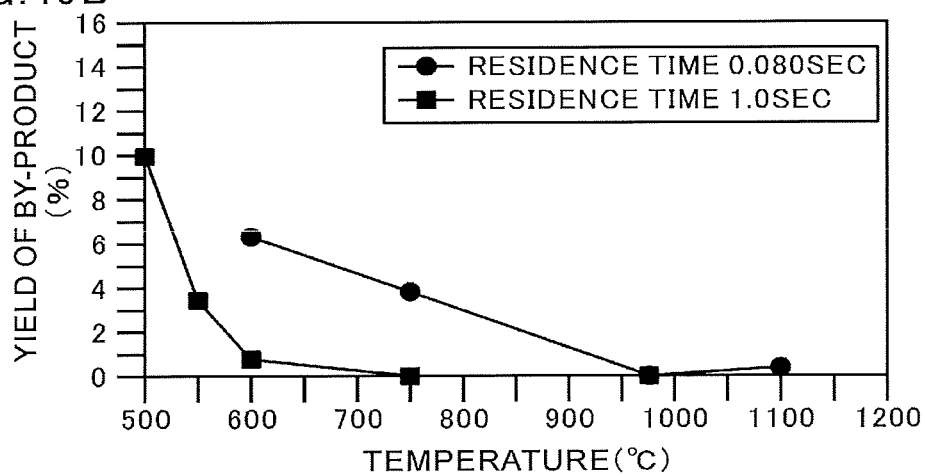
FIG. 49B is a graph for showing a relationship among the residence time of $CH_2Cl_2$, the temperature of the reforming furnace, and the yield of the by-product.
Figure 49C:
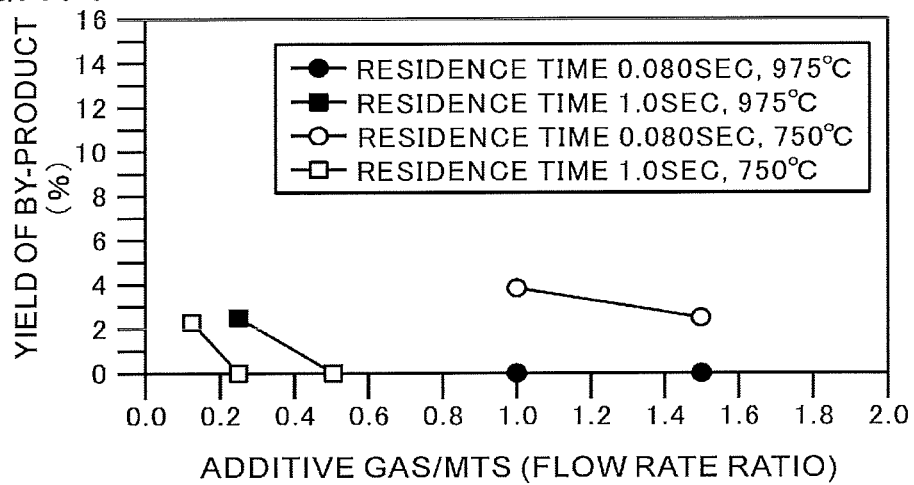
FIG. 49C is a graph for showing a relationship among the residence time of $CH_2Cl_2$, the temperature of the reforming furnace, a flow rate ratio, and the yield of the by-product.

FIG. 49A, FIG. 49B, and FIG. 49C are each a graph for showing results of Example 6. FIG. 49A is a graph for showing a relationship among the addition amount of $CH_2Cl_2$, the temperature of the reforming furnace, and the yield of a by-product. FIG. 49B is a graph for showing a relationship among the residence time of $CH_2Cl_2$, the temperature of the reforming furnace, and the yield of the by-product. FIG. 49C is a graph for showing a relationship among the residence time of $CH_2Cl_2$, the temperature of the reforming furnace, a flow rate ratio, and the yield of the by-product.

In the case in which $CH_2Cl_2$ was added at a flow rate ratio of 0.25 (in an amount of 25% of MTS), the case in which $CH_2Cl_2$ was added at a flow rate ratio of 0.5 (in an amount of 50% of MTS), and the case in which $CH_2Cl_2$ was added at a flow rate ratio of 1.0 (in the same amount as MTS), the yield (%) of the by-product ($SiCl_2$) at the time of changing the temperature of the reforming furnace was measured. As a result, in the case in which $CH_2Cl_2$ was added to the reforming furnace at a flow rate ratio of 0.25 (represented by black squares in FIG. 49A), it was confirmed that the yield of the by-product was decreased with an increase in temperature of the reforming furnace until the temperature of the reforming furnace reached 750° C. In addition, it was confirmed that no by-product was generated (the yield became 0%) when the temperature of the reforming furnace was 750° C. or more and less than 850° C. Meanwhile, it was confirmed that the yield of the by-product was increased when the temperature of the reforming furnace was 850° C. or more.

In the case in which $CH_2Cl_2$ was added at a flow rate ratio of 0.5 (represented by black circles in FIG. 49A), it was confirmed that the yield of the by-product was decreased with an increase in temperature of the reforming furnace until the temperature of the reforming furnace reached 750° C. In addition, it was confirmed that no by-product was generated (the yield became 0%) when the temperature of the reforming furnace was 750° C. or more.

In the case in which $CH_2Cl_2$ was added to the reforming furnace at a flow rate ratio of 1.0 (represented by white squares in FIG. 49A), it was confirmed that the yield of the by-product was decreased with an increase in temperature of the reforming furnace. In addition, it was confirmed that no by-product was generated (the yield became 0%) when the temperature of the reforming furnace was 750° C. or more.

From the above-mentioned results, in the case of adopting $CH_2Cl_2$ as an additive gas, it was confirmed that the generation of the by-product ($SiCl_2$) was able to be prevented when the temperature of the reforming furnace was set to 750° C. or more and less than 850° C.

In addition, in the cases in which the residence time of $CH_2Cl_2$ in the reforming furnace was set to 0.080 second (the carbon tube was inserted) and 1.0 second (the carbon tube was not inserted), the yield (%) of the by-product ($SiCl_2$) at the time of changing the temperature of the reforming furnace was measured. As a result, in the case in which the residence time in the reforming furnace was set to 0.080 second (represented by black circles in FIG. 49B), it was confirmed that the yield of the by-product was decreased with an increase in temperature of the reforming furnace until the temperature of the reforming furnace reached 975° C. In addition, it was confirmed that no by-product was generated (the yield became 0%) when the temperature of the reforming furnace was 975° C. Meanwhile, it was confirmed that the yield of the by-product was slightly increased (about 0.1%) when the temperature of the reforming furnace exceeded 975° C.

In the case in which the residence time in the reforming furnace was set to 1.0 second (represented by black squares in FIG. 49B), it was confirmed that the yield of the by-product was decreased with an increase in temperature of the reforming furnace. In addition, it was confirmed that no by-product was generated (the yield became 0%) when the temperature of the reforming furnace was 750° C. or more.

From the above-mentioned results, in the case of adopting $CH_2Cl_2$ as an additive gas, it was confirmed that the generation of the by-product ($SiCl_2$) was able to be prevented when the residence time of the additive gas in the reforming furnace was set to 0.080 second or more and less than 1.0 second and the temperature of the reforming furnace was set to 975° C. or more and less than 1,100° C.

In addition, it was confirmed that the generation of the by-product ($SiCl_2$) was able to be prevented when the residence time of the additive gas in the reforming furnace was set to 1.0 second or more and the temperature of the reforming furnace was set to 750° C. or more and less than 850° C. Further, as described above, when the residence time of the additive gas in the reforming furnace is set to 10 seconds or more, the reforming furnace itself is increased in size. Accordingly, in the case of adopting $CH_2Cl_2$ as an additive gas, when the residence time of the additive gas in the reforming furnace is set to 1.0 second or more and less than 10 seconds and the temperature of the reforming furnace is set to 750° C. or more and less than 850° C., the generation of the by-product can be prevented while the reforming furnace can be reduced in size.

In addition, the yield (%) of the by-product ($SiCl_2$) at the time of changing a flow rate ratio between the additive gas ($CH_2Cl_2$) and MTS (additive gas/MTS) was measured. In the case in which the residence time of $CH_2Cl_2$ in the reforming furnace was set to 0.080 second and the temperature of the reforming furnace was set to 975° C. (represented by black circles in FIG. 49C), it was confirmed that no by-product was generated when the flow rate ratio (ratio in amount of substance) was 1 or more.

In the case in which the residence time of $CH_2Cl_2$ in the reforming furnace was set to 1.0 second and the temperature of the reforming furnace was set to 975° C. (represented by black squares in FIG. 49C), it was revealed that the yield of the by-product was decreased with an increase in flow rate ratio. In addition, it was confirmed that no by-product was generated when the flow rate ratio was 0.5 or more.

In the case in which the residence time of $CH_2Cl_2$ in the reforming furnace was set to 0.080 seconds and the temperature of the reforming furnace was set to 750° C. (represented by white circles in FIG. 49C), it was revealed that the yield of the by-product was decreased with an increase in flow rate ratio.

In the case in which the residence time of $CH_2Cl_2$ in the reforming furnace was set to 1.0 second and the temperature of the reforming furnace was set to 750° C. (represented by white squares in FIG. 49C), it was revealed that the yield of the by-product was decreased with an increase in flow rate ratio. In addition, it was confirmed that no by-product was generated when the flow rate ratio was 0.25 or more.

From the above-mentioned results, it was confirmed that the generation of the by-product ($SiCl_2$) was able to be prevented when the flow rate ratio between $CH_2Cl_2$ and MTS ($CH_2Cl_2$/MTS) was set to 0.5 or more.

Figure 50A:
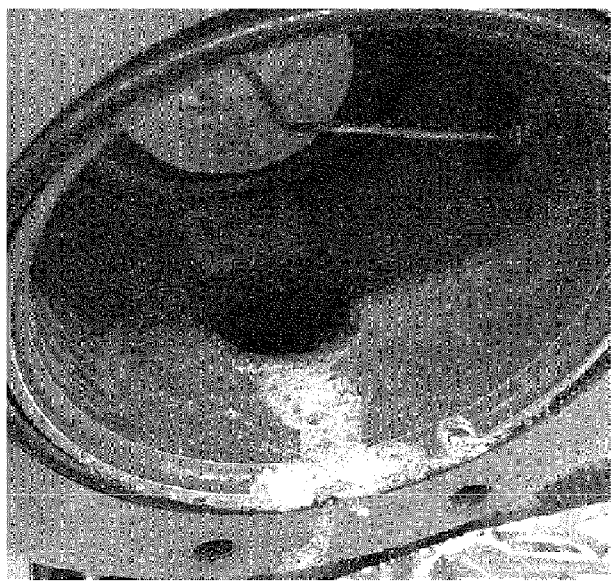
FIG. 50A is a photograph in the case of not adding an additive gas.
Figure 50B:
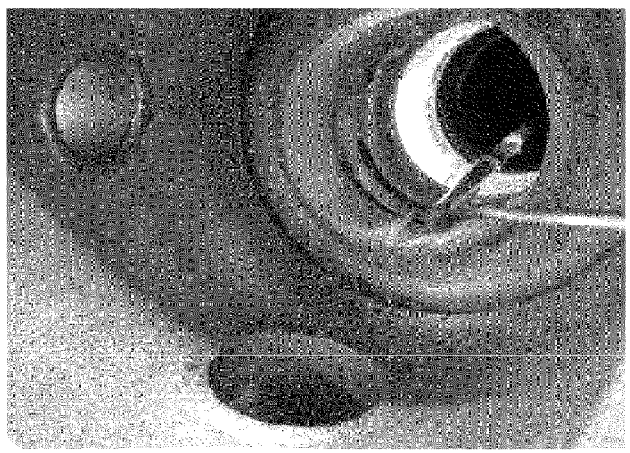
FIG. 50B is a photograph in the case of adding $CH_3Cl$ as an additive gas.
Figure 50C:
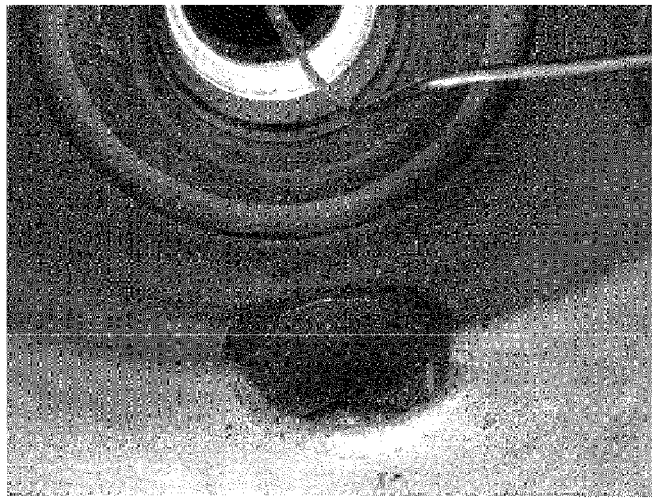
FIG. 50C is a photograph in the case of adding $CH_2Cl_2$ as an additive gas.

FIG. 50A, FIG. 50B, and FIG. 50C are each a photograph of an exhaust pipe (a pipe connected to the outlet of the reforming furnace) in Examples 5 and 6. FIG. 50A is a photograph in the case of not adding an additive gas. FIG. 50B is a photograph in the case of adding $CH_3Cl$ as an additive gas. FIG. 50C is a photograph in the case of adding $CH_2Cl_2$ as an additive gas. FIG. 50A, FIG. 50B, and FIG. 50C are each the photograph of the exhaust pipe in the case in which the temperature of the reforming furnace is set to 750° C.

As shown in FIG. 50A, in the case of not adding an additive gas, it was confirmed that the by-product ($SiCl_2$) was accumulated in the exhaust pipe. In addition, as shown in FIG. 50B, in the case of adding $CH_3Cl$ as an additive gas, it was confirmed that a highly acidic (non-ignitible) substance different from $SiCl_2$ was precipitated. Meanwhile, as shown in FIG. 50C, in the case of adding $CH_2Cl_2$ as an additive gas, neither the adhesion of the by-product ($SiCl_2$) nor the adhesion of other substances was observed.

(Apparatus 100 for Producing Silicon Compound Material)

Figure 51:
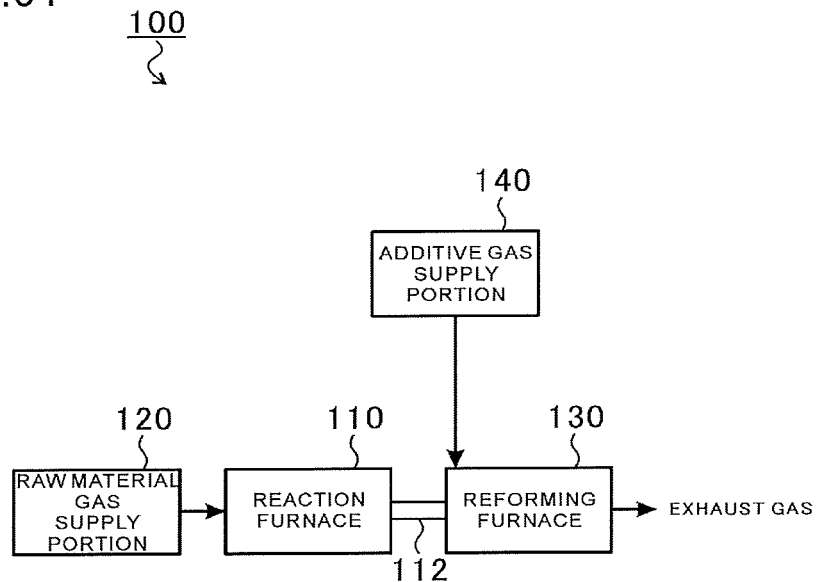
FIG. 51 is a view for illustrating an apparatus for producing a silicon compound material according to an embodiment of the present disclosure.

FIG. 51 is a view for illustrating an apparatus 100 for producing a silicon compound material according to this embodiment. As illustrated in FIG. 51, the apparatus 100 for producing a silicon compound material includes a reaction furnace 110, a raw material gas supply portion 120, a reforming furnace 130, and an additive gas supply portion 140. In FIG. 51, a flow of a gas is represented by the arrow of a solid line.

The reaction furnace 110 was retained at a predetermined temperature and a predetermined pressure (reduced pressure). A preform is housed in the reaction furnace 110. A raw material gas is supplied to the reaction furnace 110 from the raw material gas supply portion 120. The raw material gas contains methyltrichlorosilane (MTS). In the reaction furnace 110, the preform is infiltrated with silicon carbide.

A gas discharged from the reaction furnace 110 is supplied to the reforming furnace 130 through a pipe 112. The reforming furnace 30 is configured to retain the gas discharged from the reaction furnace 110 at 200° C. or more and less than 1,100° C. The additive gas supply portion 140 is configured to supply an additive gas to the reforming furnace 130. The additive gas is one or more selected from the group consisting of $CH_3Cl$ (chloromethane), $CH_2Cl_2$ (dichloromethane), $CCl_4$ (carbon tetrachloride), $C_2H_3Cl_3$ (trichloroethane), and $C_2HCl_3$ (trichloroethylene).

When the additive gas is added to the gas discharged from the reaction furnace 110 and the gas discharged from the reaction furnace 110 is retained at 200° C. or more and less than 1,100° C. in the reforming furnace 130, the generation of $SiCl_2$ can be prevented. With this, a situation in which $SiCl_2$ adheres to an exhaust pipe to be connected to a subsequent stage of the reforming furnace 130 can be avoided. Accordingly, the reforming furnace 130 and the exhaust pipe can be washed easily. As a result, a burden and cost for maintenance of an exhaust passage from the reaction furnace 110 can be reduced, and by extension, a safe operation can be performed.

The additive gas is preferably any one or both of $CH_3Cl$ and $CH_2Cl_2$. When the additive gas is any one or both of $CH_3Cl$ and $CH_2Cl_2$, a situation in which carbon is precipitated in the exhaust pipe can be avoided.

In addition, when the additive gas supply portion 140 is configured to add $CH_3Cl$, the reforming furnace 130 is configured to retain the gas discharged from the reaction furnace 110 and the additive gas at 750° C. or more and less than 850° C. In the case of adding $CH_3Cl$, when the temperature of the reforming furnace 130 is set to 750° C. or more, the generation of $SiCl_2$ can be prevented. In addition, when the temperature of the reforming furnace 130 is 850° C. or more, a SiC film is formed. Accordingly, in the case of adding $CH_3Cl$, when the temperature of the reforming furnace 130 is set to 750° C. or more and less than 850° C., the generation of $SiCl_2$ can be prevented while the maintenance properties of the reforming furnace 130 are improved.

Further, when the additive gas supply portion 140 is configured to add $CH_3Cl$, the residence time of $CH_3Cl$ in the reforming furnace 130 is set to 0.2 second or more and less than 10 seconds. When the residence time is set to 0.2 second or more, the generation of $SiCl_2$ can be prevented. In addition, when the residence time is set to less than 10 seconds, the reforming furnace 130 can be reduced in size.

In addition, when the additive gas supply portion 140 is configured to add $CH_3Cl$, $CH_3Cl$ is added so that a flow rate ratio between $CH_3Cl$ and MTS to be supplied from the raw material gas supply portion 120 ($CH_3Cl$/MTS) is 1.0 or more. With this, the generation of $SiCl_2$ can be prevented.

Meanwhile, when the additive gas supply portion 140 is configured to add $CH_2Cl_2$, the reforming furnace 130 is configured to retain the gas discharged from the reaction furnace 110 and the additive gas at 750° C. or more and less than 850° C. In the case of adding $CH_2Cl_2$, when the temperature of the reforming furnace 130 is set to 750° C. or more, the generation of $SiCl_2$ can be prevented. In addition, when the temperature of the reforming furnace 130 is 850° C. or more, a SiC film is formed. Accordingly, in the case of adding $CH_2Cl_2$, when the temperature of the reforming furnace 130 is set to 750° C. or more and less than 850° C., the generation of $SiCl_2$ can be prevented while the maintenance properties of the reforming furnace 130 are improved.

In this case, the residence time of $CH_2Cl_2$ in the reforming furnace 130 is set to 0.2 second or more and less than 10 seconds. When the residence time is set to 0.2 second or more, the generation of $SiCl_2$ can be prevented. In addition, when the residence time is set to less than 10 seconds, the reforming furnace 130 can be reduced in size.

In addition, when the additive gas supply portion 140 is configured to add $CH_2Cl_2$, $CH_2Cl_2$ is added so that a flow rate ratio between $CH_2Cl_2$ and MTS to be supplied from the raw material gas supply portion 120 ($CH_2Cl_2$/MTS) is 0.25 or more, preferably 0.5 or more. With this, the generation of $SiCl_2$ can be prevented.

Figure 52:
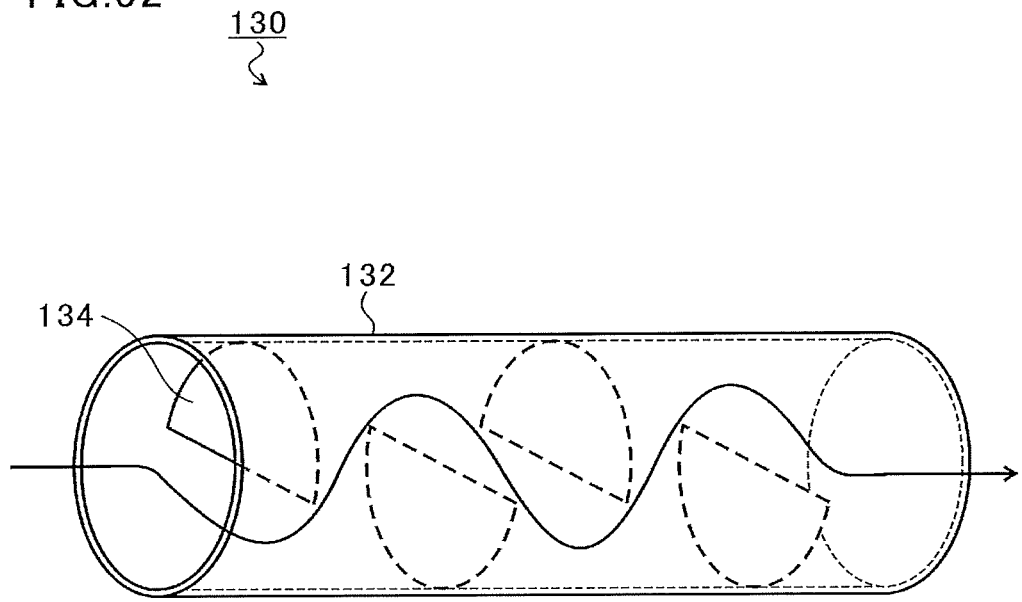
FIG. 52 is a view for illustrating a modified example of a reforming furnace.

In addition, a baffle plate may be arranged in the reforming furnace 130. FIG. 52 is a view for illustrating a modified example of the reforming furnace 130. As illustrated in FIG. 52, a main body 132 of the reforming furnace 130 has a tubular shape (e.g., a circular tube shape). The main body 132 is a furnace of a hot wall type heated from an outside with a heating device (not shown). A plurality of baffle plates 134 are arranged in the main body 132. The baffle plates 134 are each a semicircular plate member extending from an inner peripheral surface of the main body 132 to a center thereof. The baffle plates 134 are arranged in the main body 132 at different positions in a gas flow direction (an extending direction of the main body 132). In addition, the baffle plates 134 adjacent to each other are arranged in the main body 132 so that their connecting positions to the main body 132 are different from each other.

Through arrangement of the baffle plates 134, the gas discharged from the reaction furnace 110 and the additive gas can be mixed with each other efficiently. Accordingly, the generation of $SiCl_2$ can be prevented.

As described above, the apparatus 100 for producing a silicon compound material according to this embodiment enables prevention of the generation of $SiCl_2$ with a simple configuration of adding the additive gas.

The embodiment has been described above with reference to the attached drawings, but, needless to say, the present disclosure is not limited to the embodiment. It is apparent that those skilled in the art may arrive at various alternations and modifications within the scope of claims, and those examples are construed as naturally falling within the technical scope of the present disclosure.

For example, in the above-mentioned embodiment, when the additive gas supply portion 140 of the apparatus 100 for producing a silicon compound material is configured to add $CH_2Cl_2$, the reforming furnace 130 is configured to retain the gas discharged from the reaction furnace 110 and the additive gas at 750° C. or more and less than 850° C. However, when the additive gas supply portion 140 is configured to add $CH_2Cl_2$, the reforming furnace 130 may retain the gas discharged from the reaction furnace 110 and the additive gas at 975° C. or more and less than 1,000° C. In this case, the residence time of $CH_2Cl_2$ in the reforming furnace 130 is desirably set to 0.080 second or more and less than 0.2 second. With this, the generation of $SiCl_2$ can be prevented.

In addition, in the above-mentioned embodiment, the description has been made taking as an example a configuration in which the apparatus 100 for producing a silicon compound material includes the additive gas supply portion 140. However, the additive gas supply portion 140 is not an essential constituent component. When the apparatus for producing a silicon compound material does not include the additive gas supply portion 140, the reforming furnace 130 is desirably configured to retain the gas discharged from the reaction furnace 110 at a predetermined temperature of 500° C. or more and less than 950° C. With this, the generation of $SiCl_2$ can be prevented.

INDUSTRIAL APPLICABILITY

The present disclosure is applicable to a method of producing a silicon compound material and to an apparatus for producing a silicon compound material.

REFERENCE SIGNS LIST 100 apparatus for producing silicon compound material
110 reaction furnace
120 raw material gas supply portion
130 reforming furnace
134 baffle plate
140 additive gas supply portion

What is claimed is:

1. A method of producing a silicon compound material, comprising:
   storing a silicon carbide preform in a reaction furnace;
   supplying a raw material gas containing methyltrichlorosilane to the reaction furnace to infiltrate the preform with silicon carbide; and
   reducing a temperature of a gas discharged from the reaction furnace to a predetermined temperature within a range of 500° C. or more and less than 950° C. at a predetermined rate, and subsequently retaining the temperature of the gas at the predetermined temperature, thereby decreasing generation of a liquid or solid by-product derived from the gas.

2. A method of producing a silicon compound material according to claim 1, wherein the predetermined temperature is within a range of 600° C. or more and less than 800° C.

3. A method of producing a silicon compound material according to claim 2, wherein the gas discharged from the reaction furnace is retained at the predetermined temperature for a predetermined time period within a range of from 0 seconds to 8 seconds.

4. A method of producing a silicon compound material according to claim 2, wherein the temperature of the gas discharged from the reaction furnace is reduced to the predetermined temperature such that the temperature of the gas is changed to a plurality of temperatures in a stepwise manner.

5. A method of producing a silicon compound material according to claim 2, wherein the liquid or solid by-product comprises a higher-chlorosilane.

6. A method of producing a silicon compound material according to claim 2, wherein the reducing of the temperature of the gas discharged from the reaction furnace and the retaining of the temperature of the gas are performed such that $SiCl_2$ serving as a precursor of the liquid or solid by-product is converted into a stable substance.

7. A method of producing a silicon compound material according to claim 1, wherein the gas discharged from the reaction furnace is retained at the predetermined temperature for a predetermined time period within a range of from 0 seconds to 8 seconds.

8. A method of producing a silicon compound material according to claim 1, wherein the temperature of the gas discharged from the reaction furnace is reduced to the predetermined temperature such that the temperature of the gas is changed to a plurality of temperatures in a stepwise manner.

9. A method of producing a silicon compound material according to claim 1, wherein the liquid or solid by-product comprises a higher-chlorosilane.

10. A method of producing a silicon compound material according to claim 1, wherein the reducing of the temperature of the gas discharged from the reaction furnace and the retaining of the temperature of the gas are performed such that $SiCl_2$ serving as a precursor of the liquid or solid by-product is converted into a stable substance.

11. A method of producing a silicon compound material according to claim 10, wherein the stable substance comprises at least one selected from the group consisting of methyltrichlorosilane, dimethyldichlorosilane, disilane, dichlorosilane, trichlorosilane, and tetrachlorosilane.

12. A method of producing a silicon compound material according to claim 1, wherein the gas discharged from the reaction furnace contains hydrogen.

13. A method of producing a silicon compound material according to claim 1,
   wherein the temperature of the gas discharged from the reaction furnace is retained at the predetermined temperature immediately after the temperature is reduced to the predetermined temperature,
   wherein the predetermined temperature is within a range of 600° C. or more and less than 800° C., and
   wherein the gas discharged from the reaction furnace is retained at the predetermined temperature for a predetermined time period which is greater than 0 second and 8 seconds or less.

14. A method of producing a silicon compound material, comprising:
  storing a silicon carbide preform in a reaction furnace;
  supplying a raw material gas containing methyltrichlorosilane to the reaction furnace to infiltrate the preform with silicon carbide; and
  reducing a temperature of a gas discharged from the reaction furnace to a predetermined temperature at a predetermined rate while adding an additive gas to the gas discharged from the reaction furnace, and subsequently retaining the temperature of the gas to which the additive gas has been added at the predetermined temperature, thereby decreasing generation of a liquid or solid by-product derived from the gas discharged from the reaction furnace.

15. A method of producing a silicon compound material according to claim 14, wherein the additive gas is added such that an amount of substance of the additive gas is larger than an amount of substance of the liquid or solid by-product.

16. A method of producing a silicon compound material according to claim 14, wherein the additive gas is added such that an amount of substance of chlorine is larger than an amount of substance of silicon contained in the liquid or solid by-product.

17. A method of producing a silicon compound material according to claim 14, wherein the temperature of the gas discharged from the reaction furnace is retained at the predetermined temperature using a reforming furnace, such that a time period for which the gas discharged from the reaction furnace is retained at the predetermined temperature is a residence time of the gas in the reforming furnace.

18. A method of producing a silicon compound material according to claim 14, wherein the predetermined temperature is within a range of 200° C. or more and less than 1,100° C.

19. A method of producing a silicon compound material according to claim 14, wherein the predetermined temperature is within a range of 750° C. or more and less than 850° C.

20. A method of producing a silicon compound material according to claim 14, wherein the additive gas comprises a molecule containing chlorine.

21. A method of producing a silicon compound material according to claim 14, wherein the additive gas comprises at least one selected from the group consisting of a nitrogen gas, a hydrogen gas, hydrogen chloride, chloromethane, tetrachloromethane, trichloroethylene, trichloroethane, ethylene, ethanol, acetone, methanol, water vapor, dichloromethane, and chloroform.

22. A method of producing a silicon compound material according to claim 14,
  wherein the additive gas comprises chloromethane or dichloromethane, and
  wherein the gas discharged from the reaction furnace to which the additive gas has been added is retained at the predetermined temperature for a time period of 0.08 second or more.

23. A method of producing a silicon compound material according to claim 14,
  wherein the additive gas comprises chloromethane or dichloromethane, and
  wherein the gas discharged from the reaction furnace to which the additive gas has been added is retained at the predetermined temperature for a time period of 1 second or more.

24. A method of producing a silicon compound material according to claim 14,
  wherein the additive gas comprises chloromethane, and
  wherein the additive gas is added such that an amount of substance of chloromethane to be added is 1.0 time or more as large as an amount of substance of methyltrichlorosilane in the raw material gas.

25. A method of producing a silicon compound material according to claim 14,
  wherein the additive gas comprises chloromethane,
  wherein the predetermined temperature falls within a range of 750° C. or more and less than 850° C.,
  wherein the additive gas is added such that an amount of substance of chloromethane to be added is within a range of 1.0 time or more and less than 1.5 times as large as an amount of substance of methyltrichlorosilane in the raw material gas, and
  wherein the gas discharged from the reaction furnace to which the additive gas has been added is retained at the predetermined temperature for a time period of 1 second or more and less than 10 seconds.

26. A method of producing a silicon compound material according to claim 14,
  wherein the additive gas comprises dichloromethane, and
  wherein the additive gas is added such that an amount of substance of dichloromethane to be added is 0.25 time or more as large as an amount of substance of methyltrichlorosilane in the raw material gas.

27. A method of producing a silicon compound material according to claim 14,
  wherein the additive gas comprises dichloromethane,
  wherein the predetermined temperature falls within a range of 750° C. or more and less than 850° C.,
  wherein the additive gas is added such that an amount of substance of dichloromethane to be added is within a range of 0.25 time or more and less than 1.5 times as large as an amount of substance of methyltrichlorosilane in the raw material gas, and
  wherein the gas discharged from the reaction furnace to which the additive gas has been added is retained at the predetermined temperature for a time period of 1 second or more and less than 10 seconds.

28. A method of producing a silicon compound material according to claim 14,
  wherein the additive gas comprises any one of hydrogen chloride, tetrachloromethane, trichloroethylene, trichloroethane, and ethylene,
  wherein the predetermined temperature is 975° C.,
  wherein an amount of substance of the additive gas to be added is 1.0 time as large as an amount of substance of methyltrichlorosilane in the raw material gas, and
  wherein the gas discharged from the reaction furnace to which the additive gas has been added is retained at the predetermined temperature for 1 second.

29. A method of producing a silicon compound material according to claim 14, wherein the gas discharged from the reaction furnace contains hydrogen.

* * * * *